US009220180B2

(12) United States Patent
Dunn, Jr.

(10) Patent No.: US 9,220,180 B2
(45) Date of Patent: Dec. 22, 2015

(54) SYSTEM AND METHODS FOR SCALABLE PARALLEL DATA PROCESSING AND PROCESS CONTROL

(76) Inventor: Richard Anthony Dunn, Jr., Randolph, MA (US)

(*) Notice: Subject to any disclaimer, the term of this patent is extended or adjusted under 35 U.S.C. 154(b) by 336 days.

(21) Appl. No.: 12/806,206

(22) Filed: Dec. 9, 2010

(65) Prior Publication Data

US 2012/0147558 A1    Jun. 14, 2012

(51) Int. Cl.
 *H05K 7/14* (2006.01)
 *H05K 7/20* (2006.01)
(52) U.S. Cl.
 CPC ............ *H05K 7/1497* (2013.01); *H05K 7/1442* (2013.01); *H05K 7/1498* (2013.01); *H05K 7/20745* (2013.01)
(58) Field of Classification Search
 CPC .. H05K 7/1429; H05K 7/1442; H05K 7/1444
 USPC .......................................... 361/724–727, 730
 See application file for complete search history.

(56) References Cited

U.S. PATENT DOCUMENTS

| | | | | |
|---|---|---|---|---|
| 3,495,134 | A * | 2/1970 | Collins et al. ................. | 361/735 |
| 3,964,577 | A * | 6/1976 | Bengtsson ...................... | 186/37 |
| 4,067,459 | A * | 1/1978 | Rozengauz et al. .......... | 414/269 |
| 4,423,465 | A * | 12/1983 | Teng-Ching et al. ......... | 361/730 |
| 4,499,607 | A * | 2/1985 | Higgins ......................... | 398/164 |
| 4,864,511 | A * | 9/1989 | Moy et al. ..................... | 700/218 |
| 4,932,826 | A * | 6/1990 | Moy et al. ..................... | 414/277 |
| 5,143,193 | A * | 9/1992 | Geraci ........................... | 194/212 |
| 5,150,279 | A * | 9/1992 | Collins et al. ............ | 361/679.53 |
| 5,467,609 | A * | 11/1995 | Feeney ......................... | 62/259.2 |
| 5,472,347 | A * | 12/1995 | Nordenstrom et al. ......... | 439/61 |
| 5,479,581 | A * | 12/1995 | Kleinschnitz ................. | 700/247 |
| 5,499,164 | A * | 3/1996 | Hill-Lindsay et al. ........ | 361/785 |
| 5,568,356 | A * | 10/1996 | Schwartz ........................ | 439/51 |
| 5,568,361 | A * | 10/1996 | Ward et al. .................... | 361/735 |
| 5,583,749 | A * | 12/1996 | Tredennick et al. .......... | 361/790 |
| 5,586,004 | A * | 12/1996 | Green et al. ................... | 361/699 |
| 5,602,721 | A * | 2/1997 | Slade et al. .................... | 361/727 |
| 5,676,553 | A * | 10/1997 | Leung ............................. | 439/74 |
| 5,691,885 | A * | 11/1997 | Ward et al. .................... | 361/735 |
| 5,737,189 | A * | 4/1998 | Kammersgard et al. ...... | 361/726 |
| 5,740,061 | A * | 4/1998 | Dewey et al. ................. | 700/214 |
| 5,799,312 | A * | 8/1998 | Rigoutsos ............................. | 1/1 |
| 5,870,732 | A * | 2/1999 | Fisher et al. ......................... | 1/1 |

(Continued)

*Primary Examiner* — Adrian S Wilson
(74) *Attorney, Agent, or Firm* — Posternak Blankstein & Lund LLP

(57) ABSTRACT

The present invention provides an apparatus and/or method for modular, scalable and nestable parallel data processing and process control systems from molecular to module/enclosure level, comprised of calculable inter- and intra-modular processing time standards and shorter look-a-head propagation paths; based on regular and irregular hexagonal and dodecagonal prisms, derivative dumbbells and variants as actual and/or approximated tilings/tessellations which may be arranged in columns, rows, stacks and arrays with or without rounding and/or a sliding fit. Non-sliding fit systems are fundamentally solid. Sliding fit systems modules have a central cavity with systems as follows: cage assembly, optional patch panels, anchoring, thermal management, interconnect enclosures, power, hot swap, fail over, positioning, and interconnects with optional quick disconnects and retractors. Optionally, module arrays store on dollied pallets in ramped warehouse rack shelving with optional catwalks, mezzanines, walls and roofs for build out and new construction.

17 Claims, 65 Drawing Sheets

(56) References Cited

U.S. PATENT DOCUMENTS

| | | | |
|---|---|---|---|
| 5,909,357 A * | 6/1999 | Orr | 361/679.46 |
| 5,941,714 A * | 8/1999 | Gorbet et al. | 439/38 |
| 5,966,292 A * | 10/1999 | Amberg et al. | 361/733 |
| 6,008,530 A * | 12/1999 | Kano | 257/686 |
| 6,130,800 A * | 10/2000 | Ostwald | 360/92.1 |
| 6,147,877 A * | 11/2000 | Strandberg et al. | 361/784 |
| 6,229,667 B1 * | 5/2001 | Ostwald | 360/92.1 |
| 6,286,078 B1 * | 9/2001 | Fuld | 711/111 |
| 6,469,901 B1 * | 10/2002 | Costner | 361/730 |
| 6,496,366 B1 * | 12/2002 | Coglitore et al. | 361/679.46 |
| 6,683,793 B1 * | 1/2004 | Johnson et al. | 361/796 |
| 7,117,468 B1 * | 10/2006 | Teig et al. | 716/129 |
| 7,369,406 B2 * | 5/2008 | Matsushima et al. | 361/695 |
| 7,646,590 B1 * | 1/2010 | Corhodzic et al. | 361/641 |
| 8,140,182 B2 * | 3/2012 | Noble et al. | 700/214 |
| 8,149,588 B2 * | 4/2012 | Sip | 361/792 |
| 8,214,786 B2 * | 7/2012 | Kuekes et al. | 716/119 |
| 2002/0097563 A1 * | 7/2002 | Costner | 361/735 |
| 2002/0109972 A1 * | 8/2002 | Mallette | 361/727 |
| 2004/0231875 A1 * | 11/2004 | Rasmussen et al. | 174/50 |
| 2008/0212290 A1 * | 9/2008 | Basham et al. | 361/727 |
| 2009/0086441 A1 * | 4/2009 | Randall et al. | 361/724 |
| 2009/0153992 A1 * | 6/2009 | Garcia et al. | 360/31 |
| 2009/0224639 A1 * | 9/2009 | Sosin | 312/223.1 |
| 2009/0237877 A1 * | 9/2009 | Honda et al. | 361/679.39 |
| 2009/0265043 A1 * | 10/2009 | Merrow et al. | 700/299 |
| 2010/0268370 A1 * | 10/2010 | Nishiuchi et al. | 700/112 |
| 2012/0023370 A1 * | 1/2012 | Truebenbach | 714/27 |

* cited by examiner

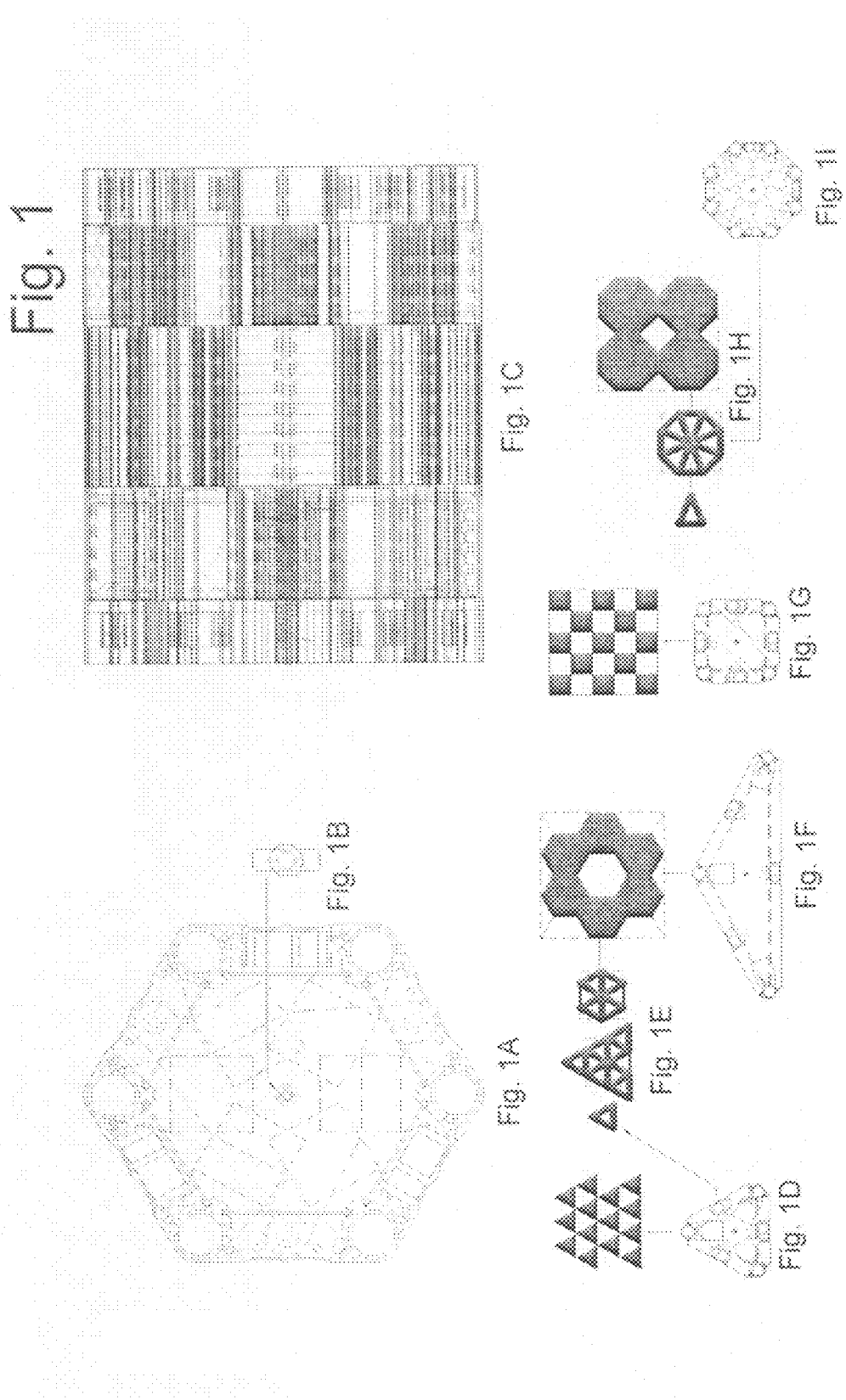

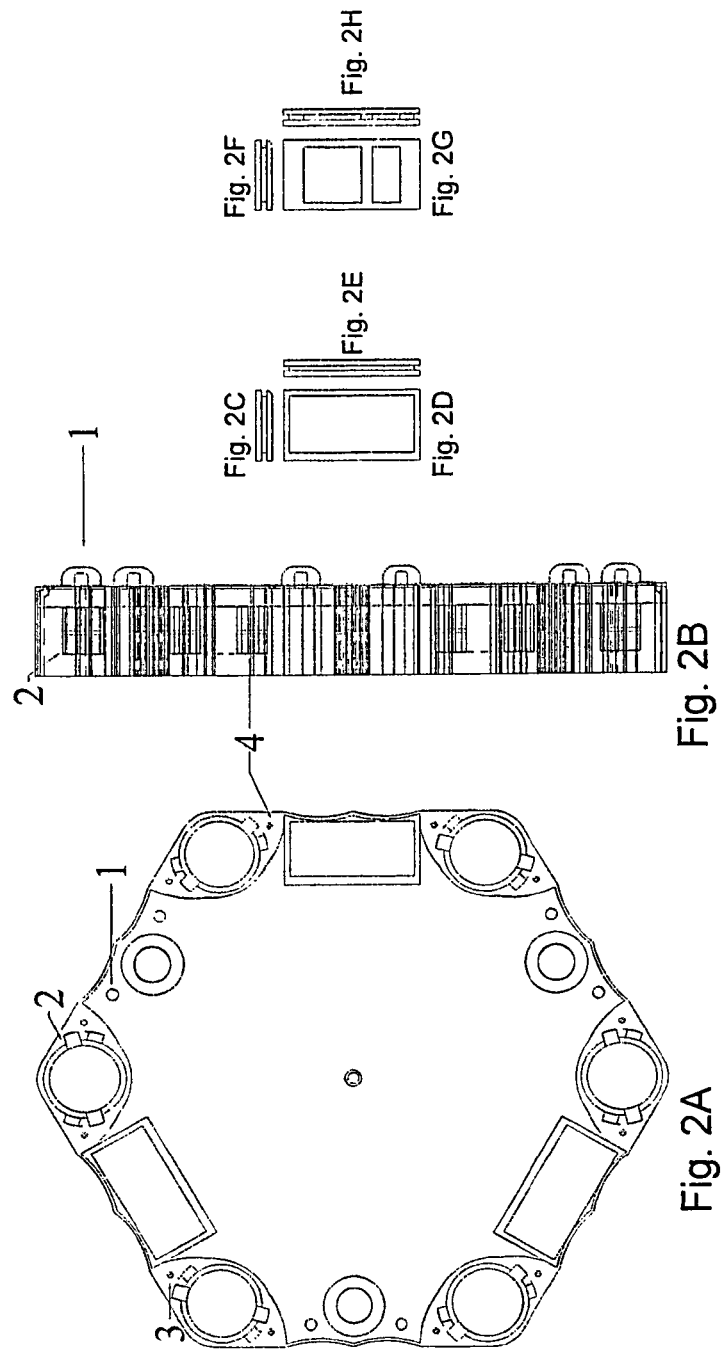

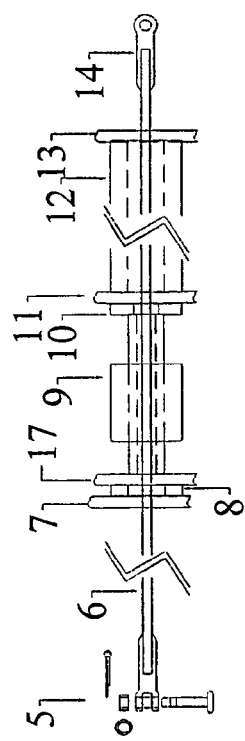

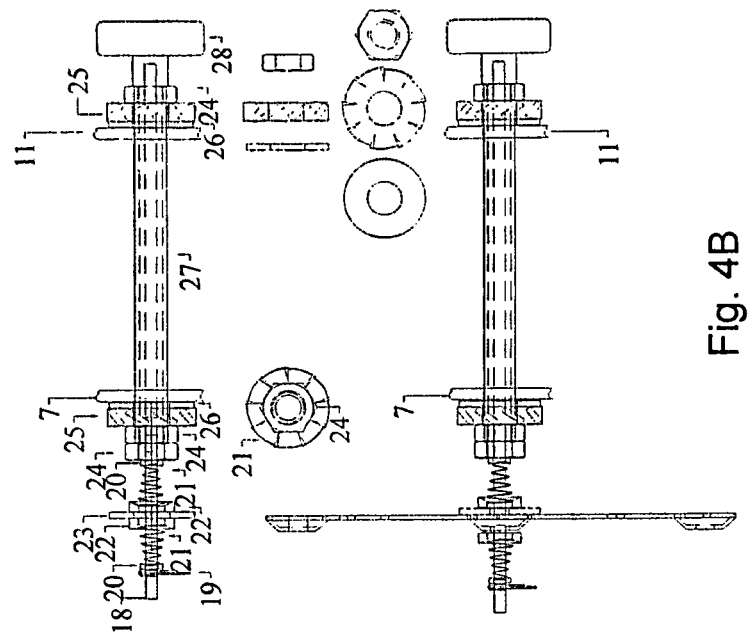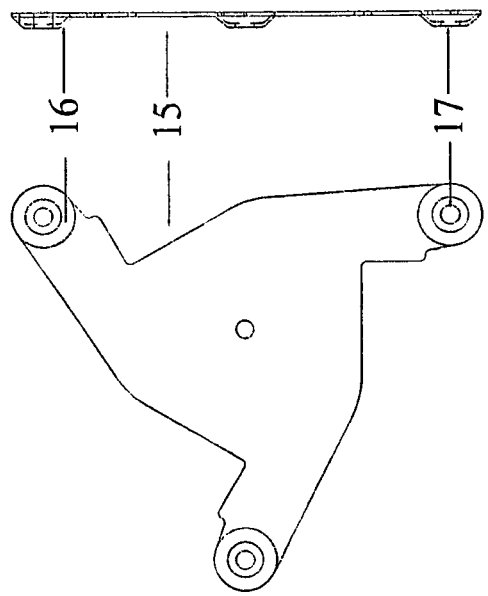

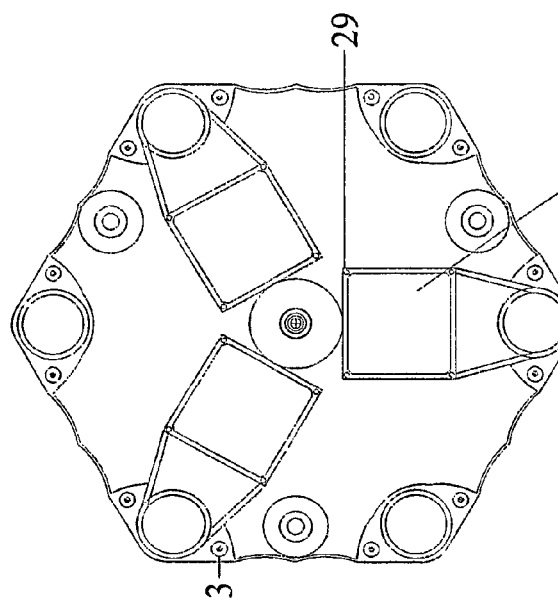

Fig. 6
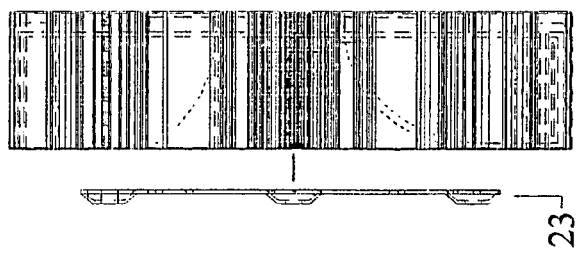
Fig. 6C
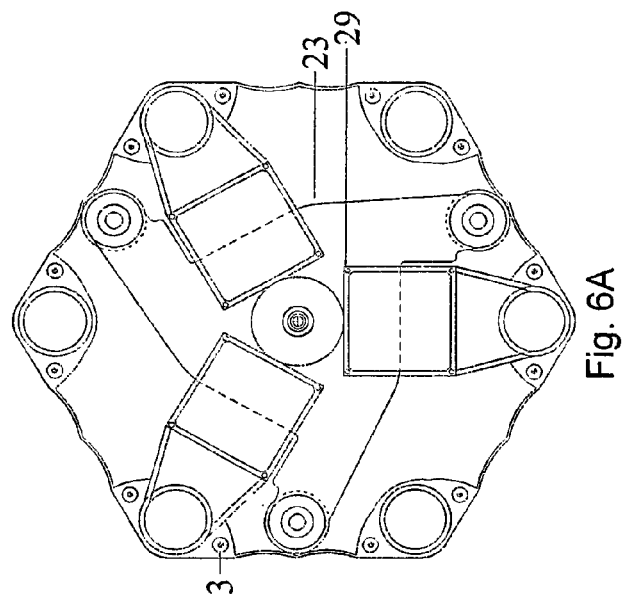
Fig. 6A
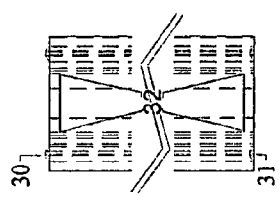
Fig. 6B

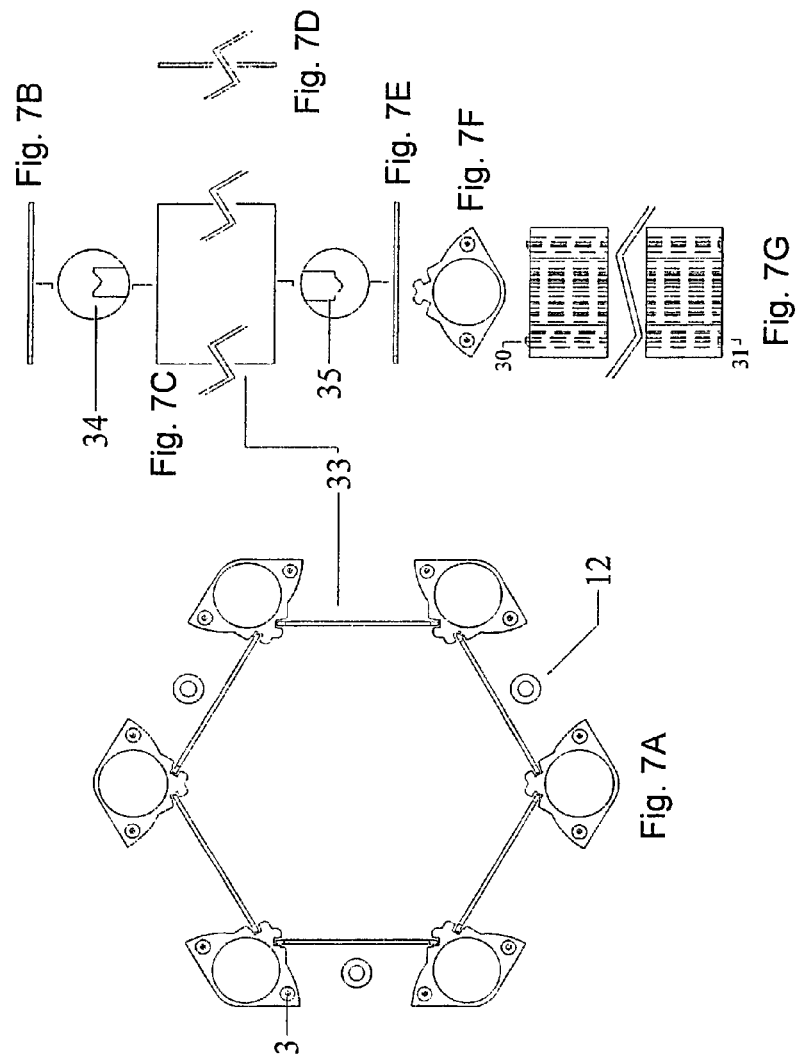

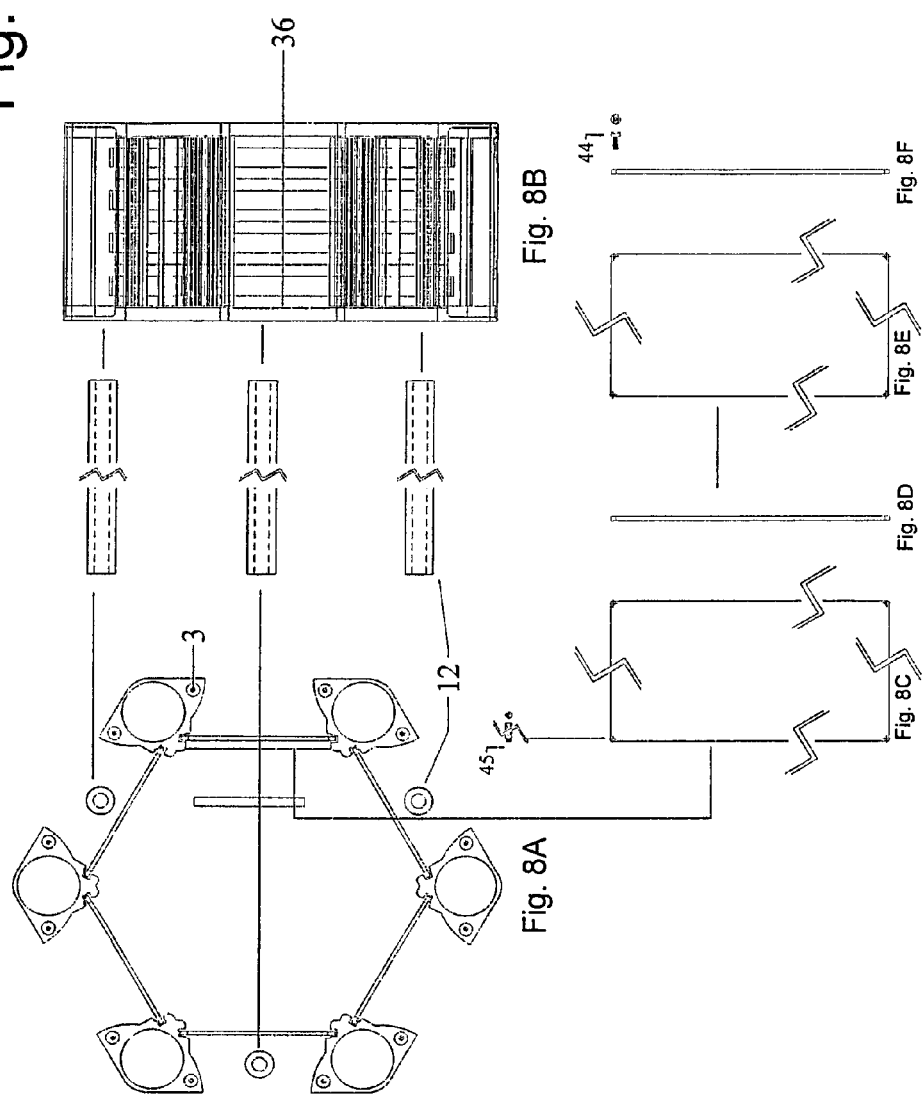

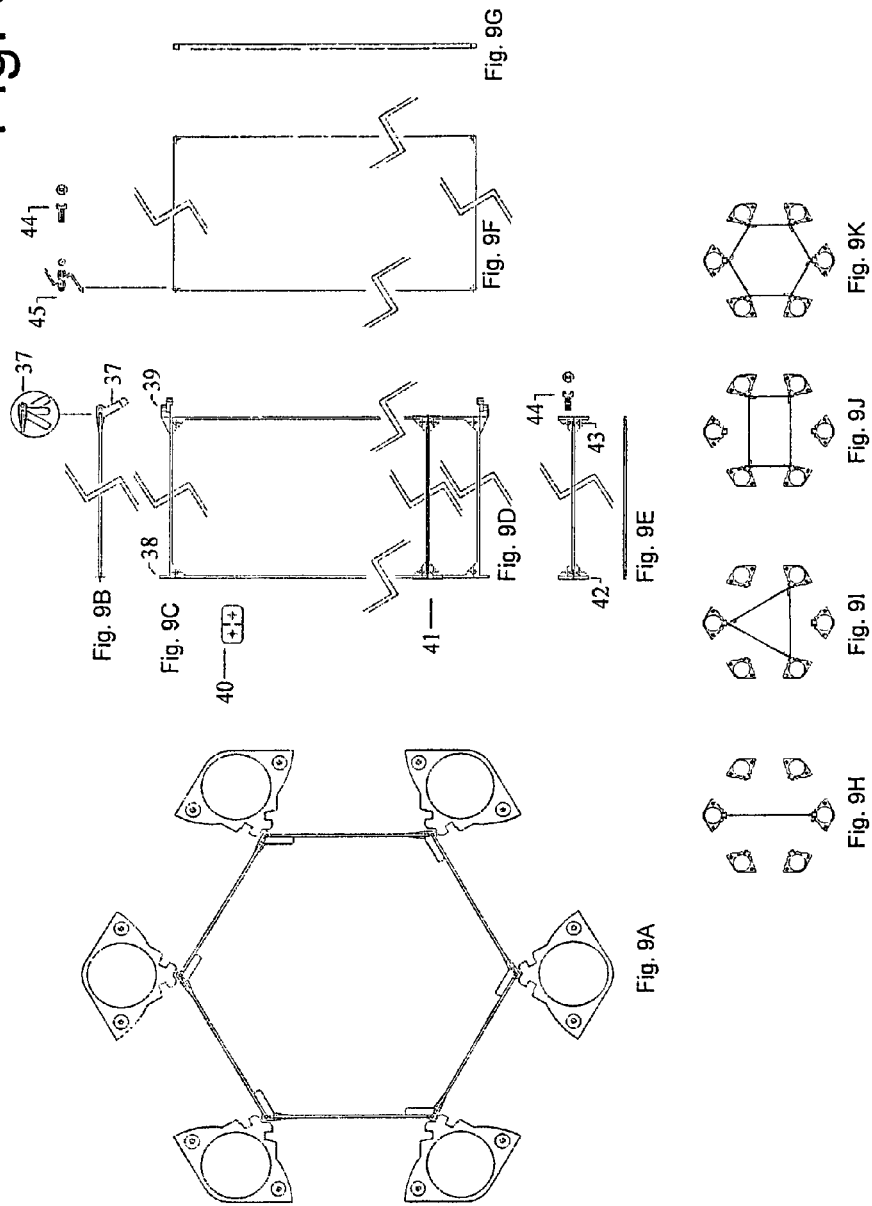

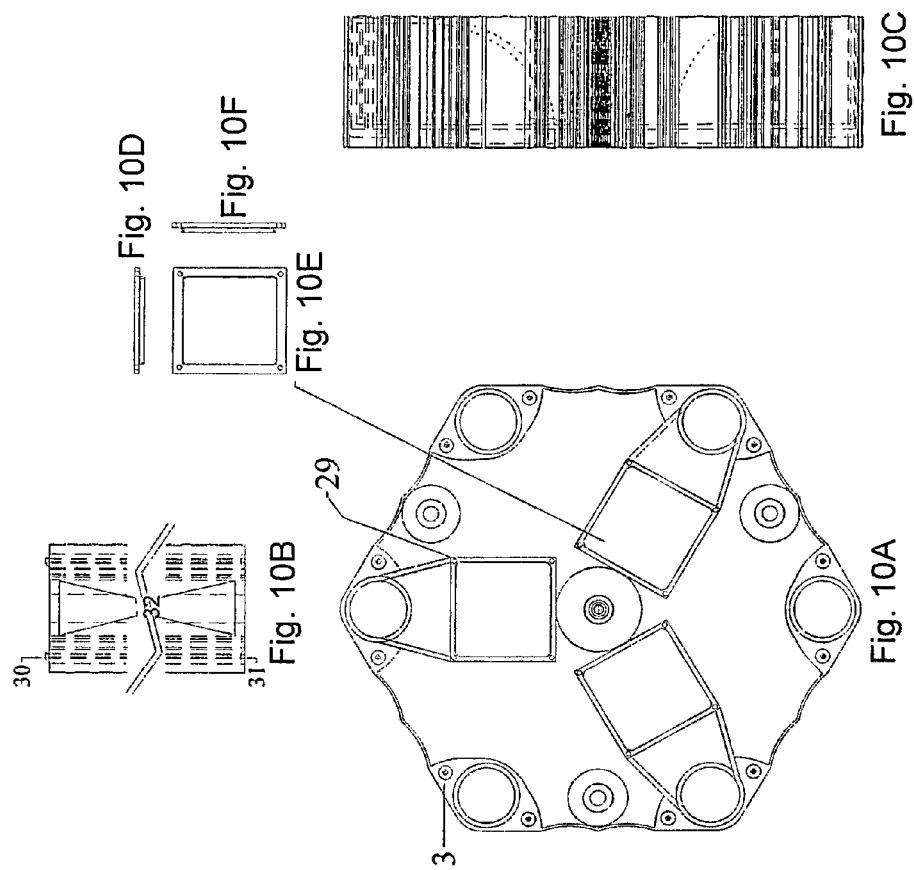

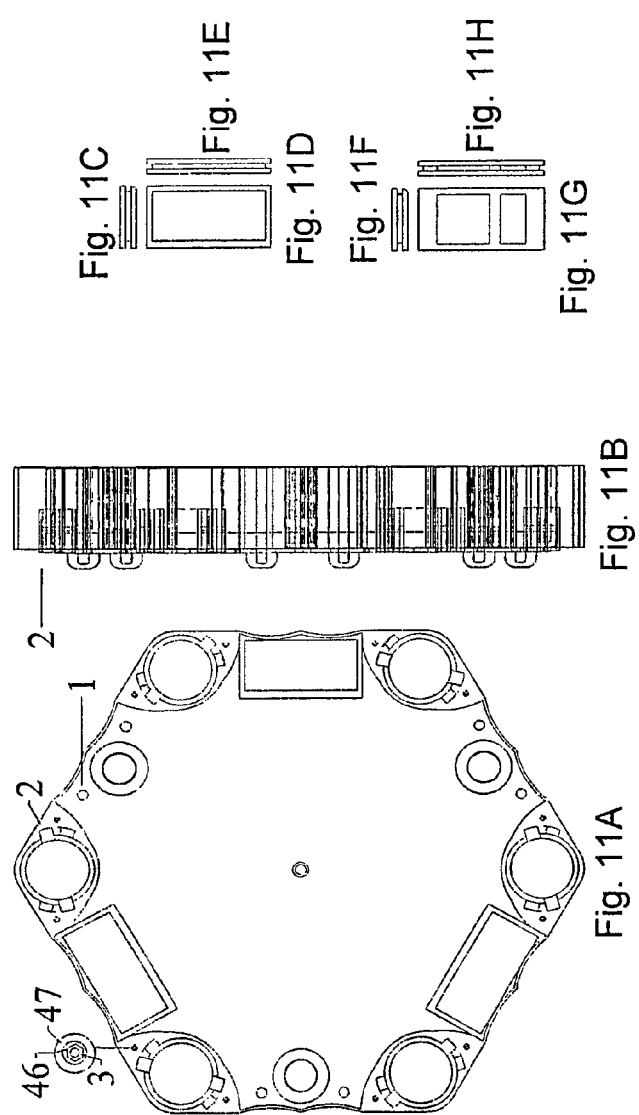

Fig. 12
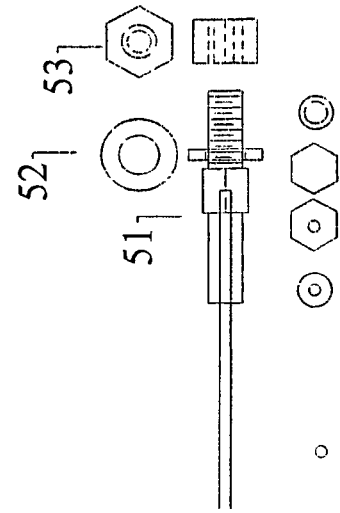
Fig. 12A
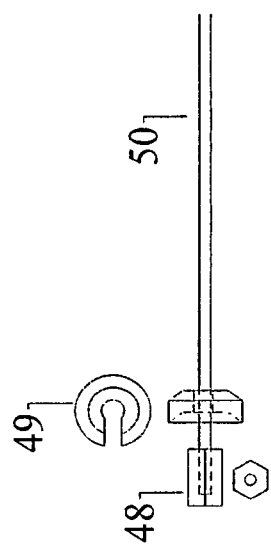

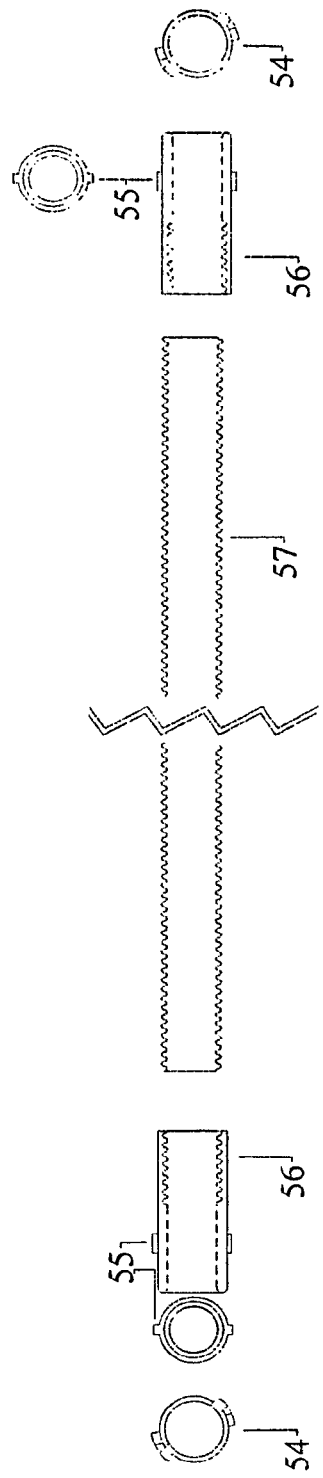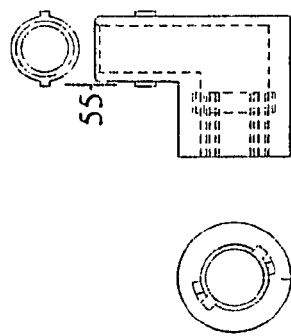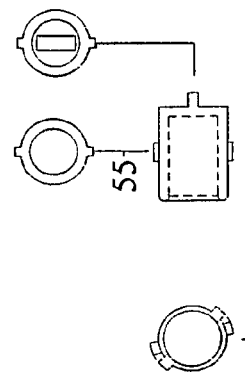

Fig. 15
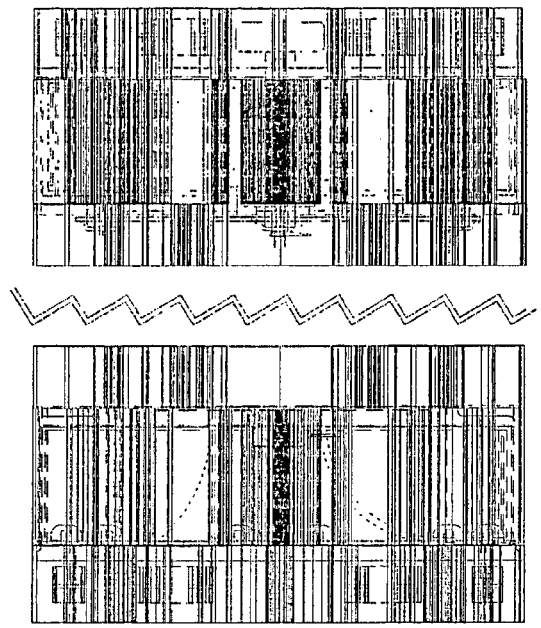
Fig. 15C
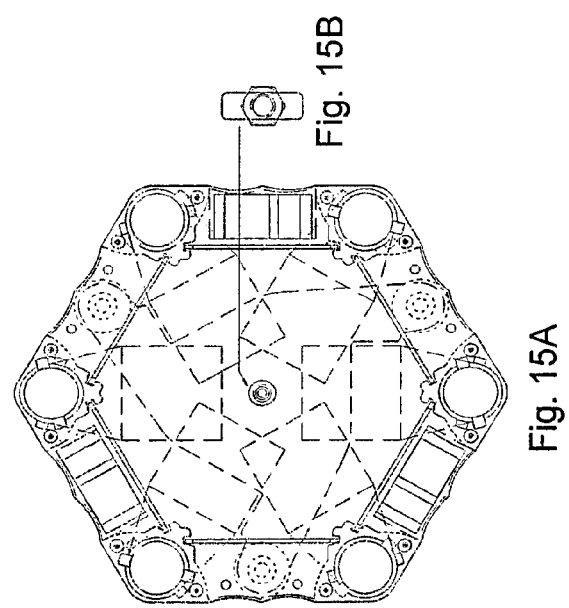
Fig. 15B
Fig. 15A

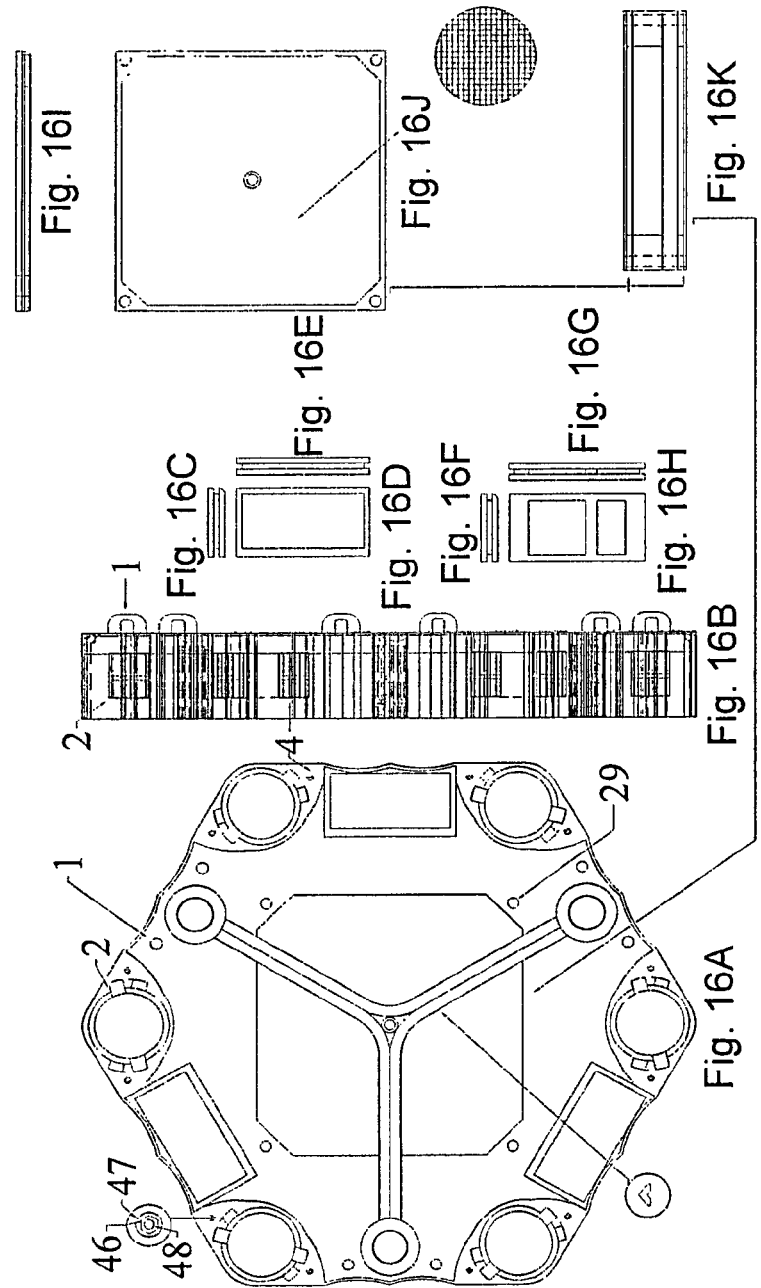

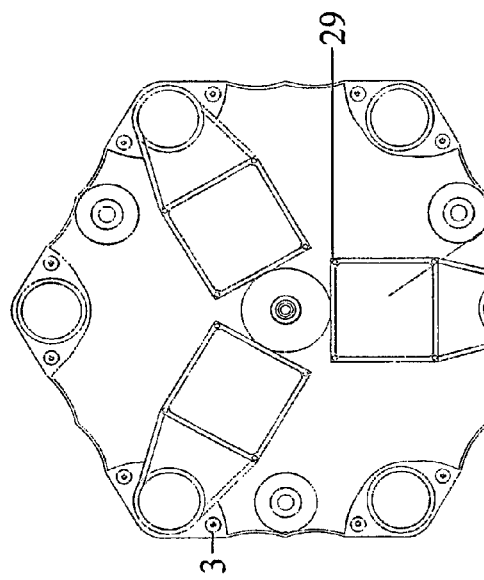
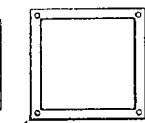
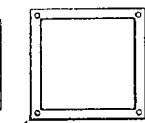
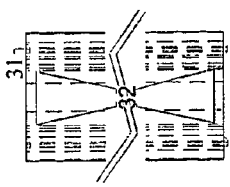
Fig. 17

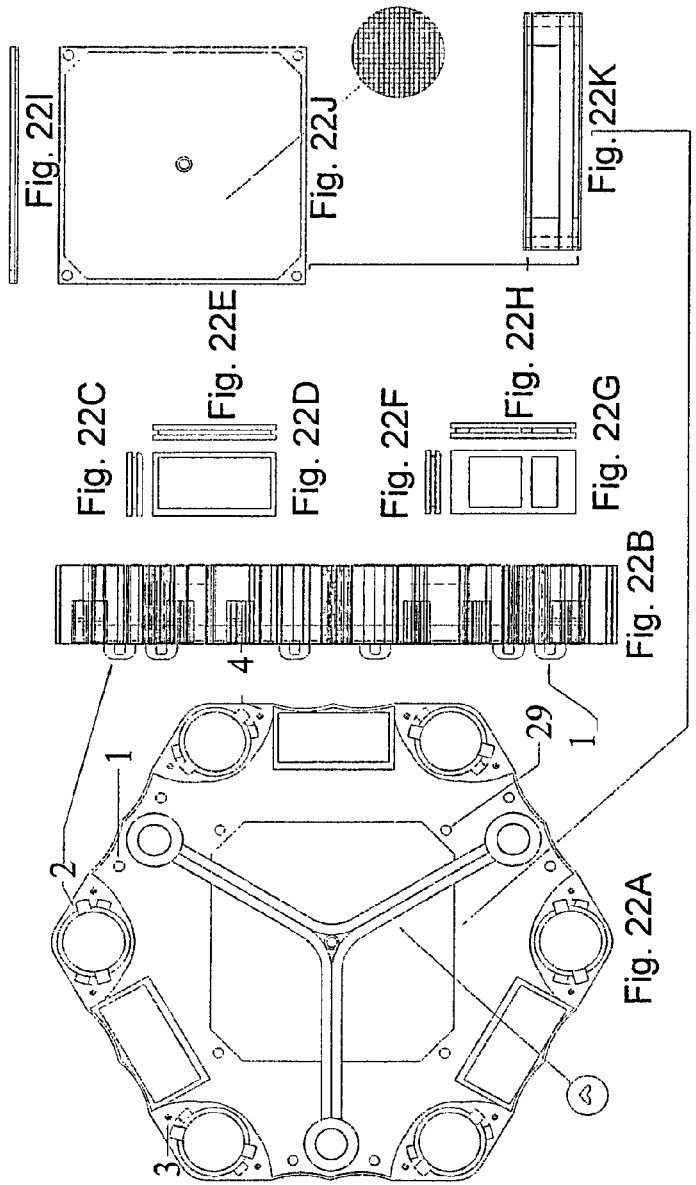

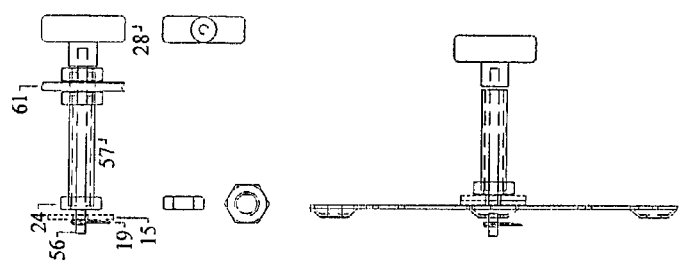
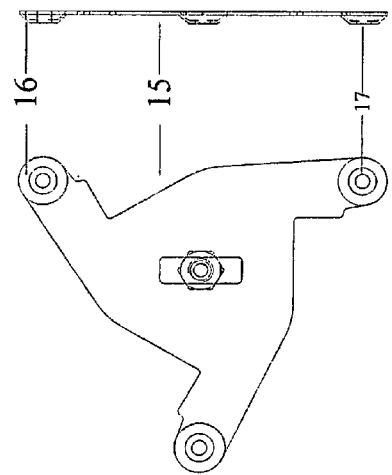
Fig. 23
Fig. 23A
Fig. 23B
Fig. 23C

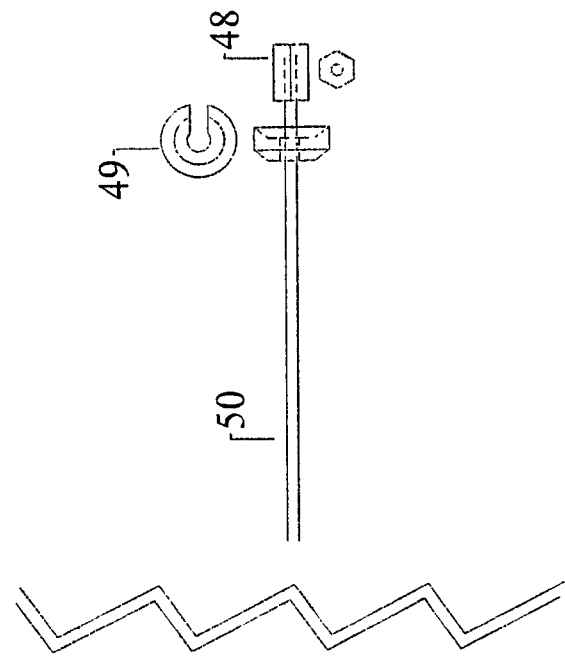
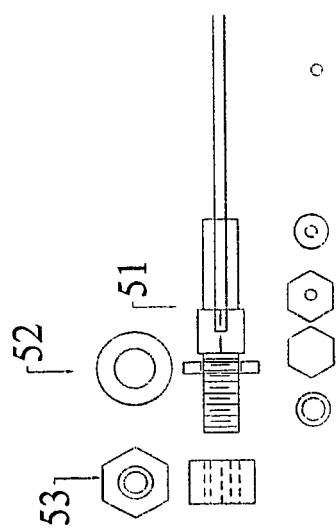
Fig. 24

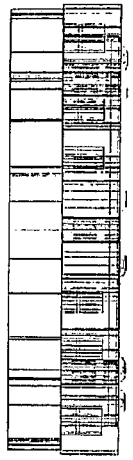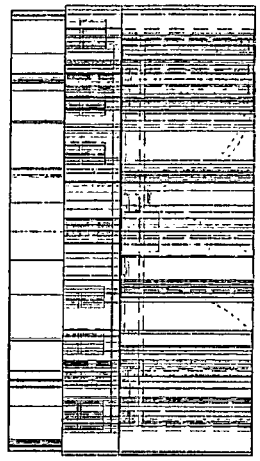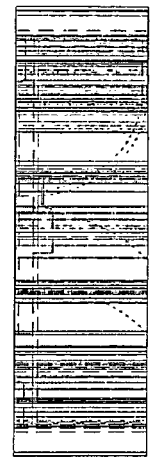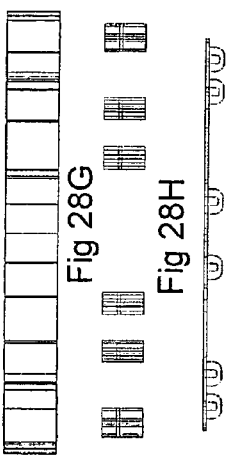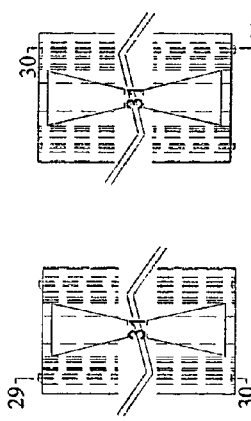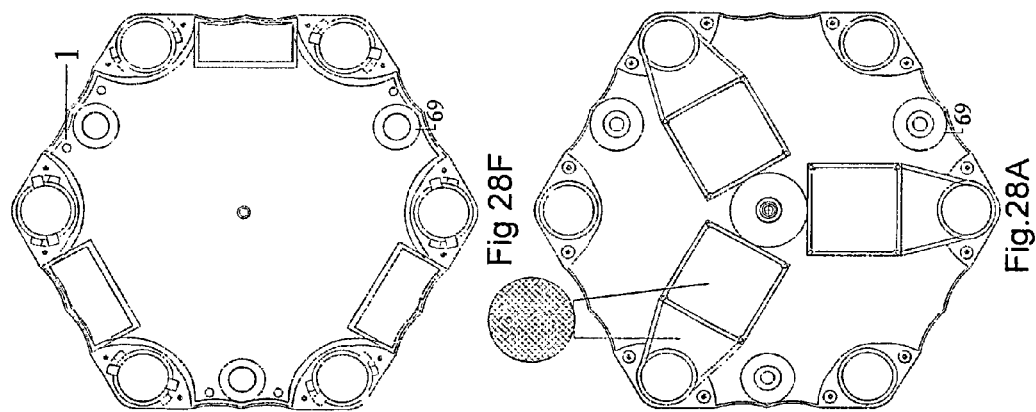
Fig. 28

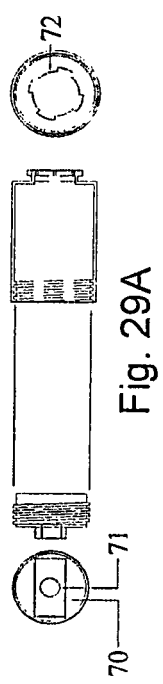
Fig. 29A
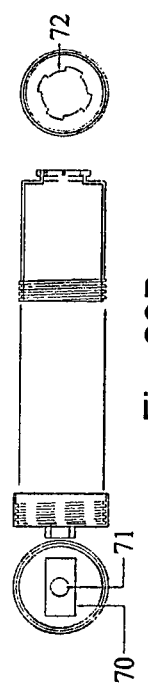
Fig. 29B
Fig. 29

Fig. 32
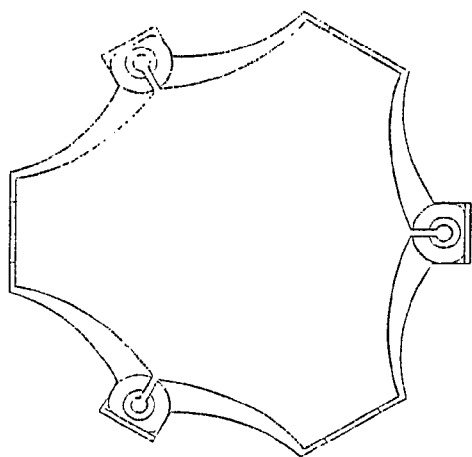
Fig. 32C
Fig. 32B
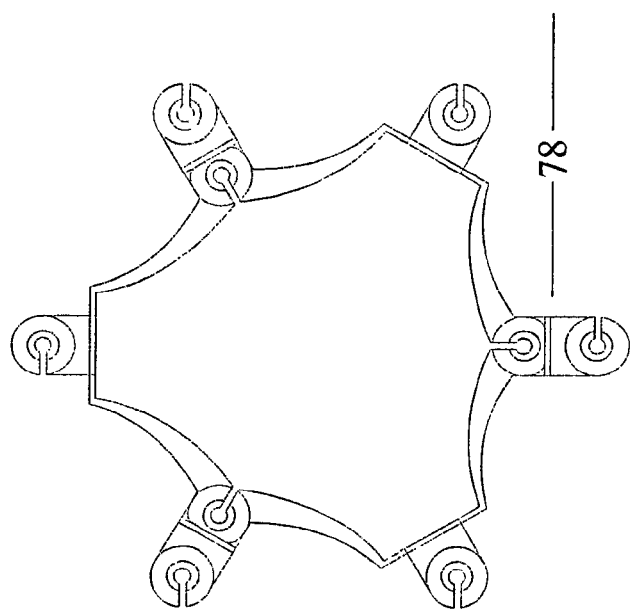
Fig. 32A

Fig. 33
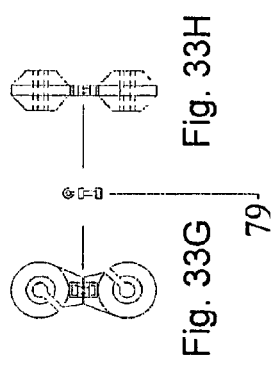
Fig. 33G  79  Fig. 33H
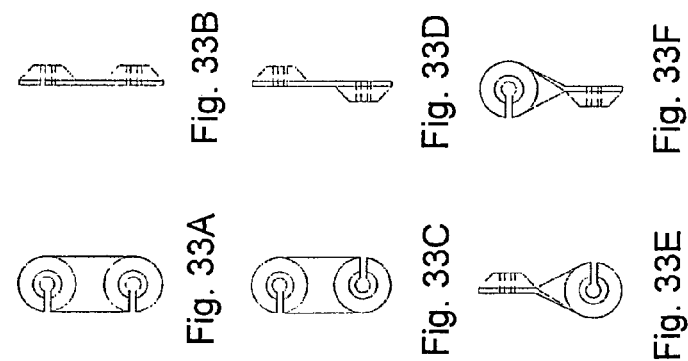
Fig. 33A  Fig. 33B
Fig. 33C  Fig. 33D
Fig. 33E  Fig. 33F

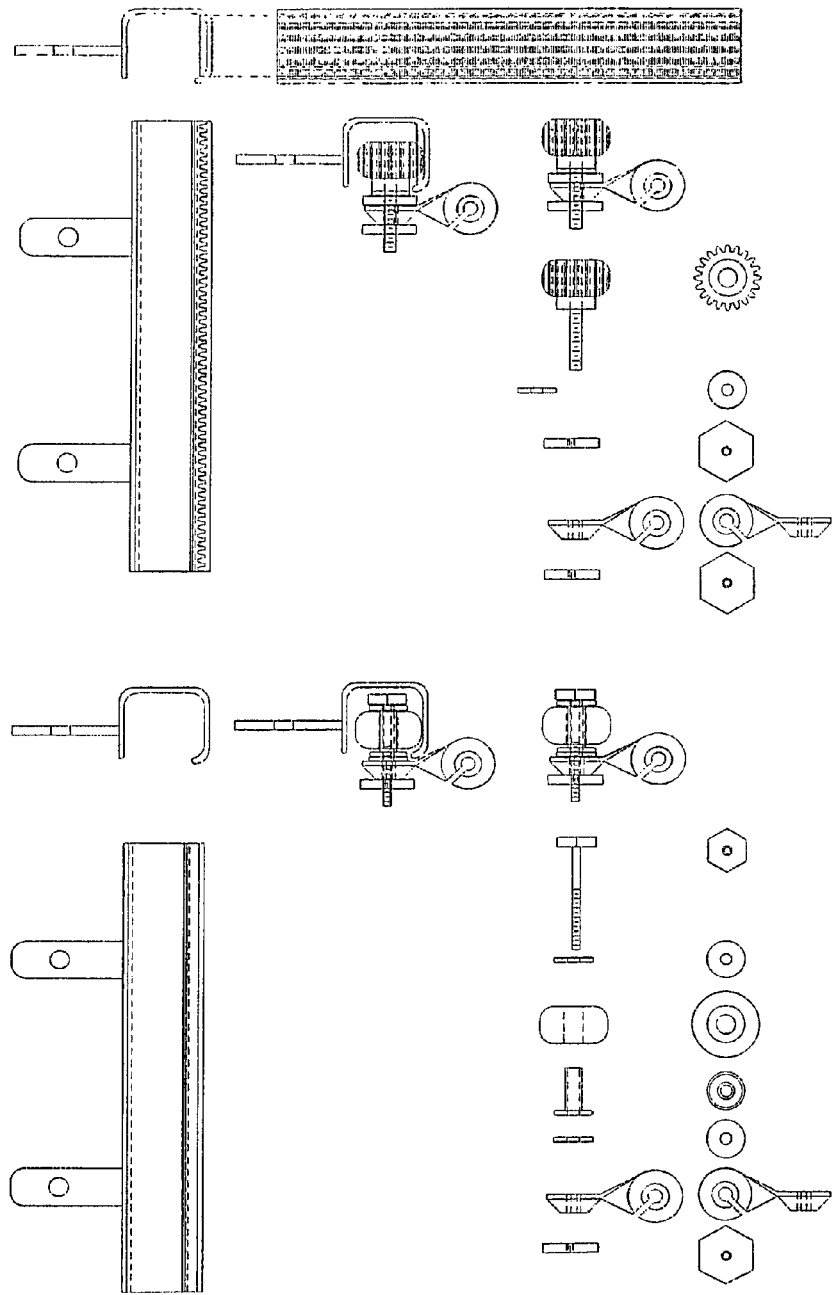

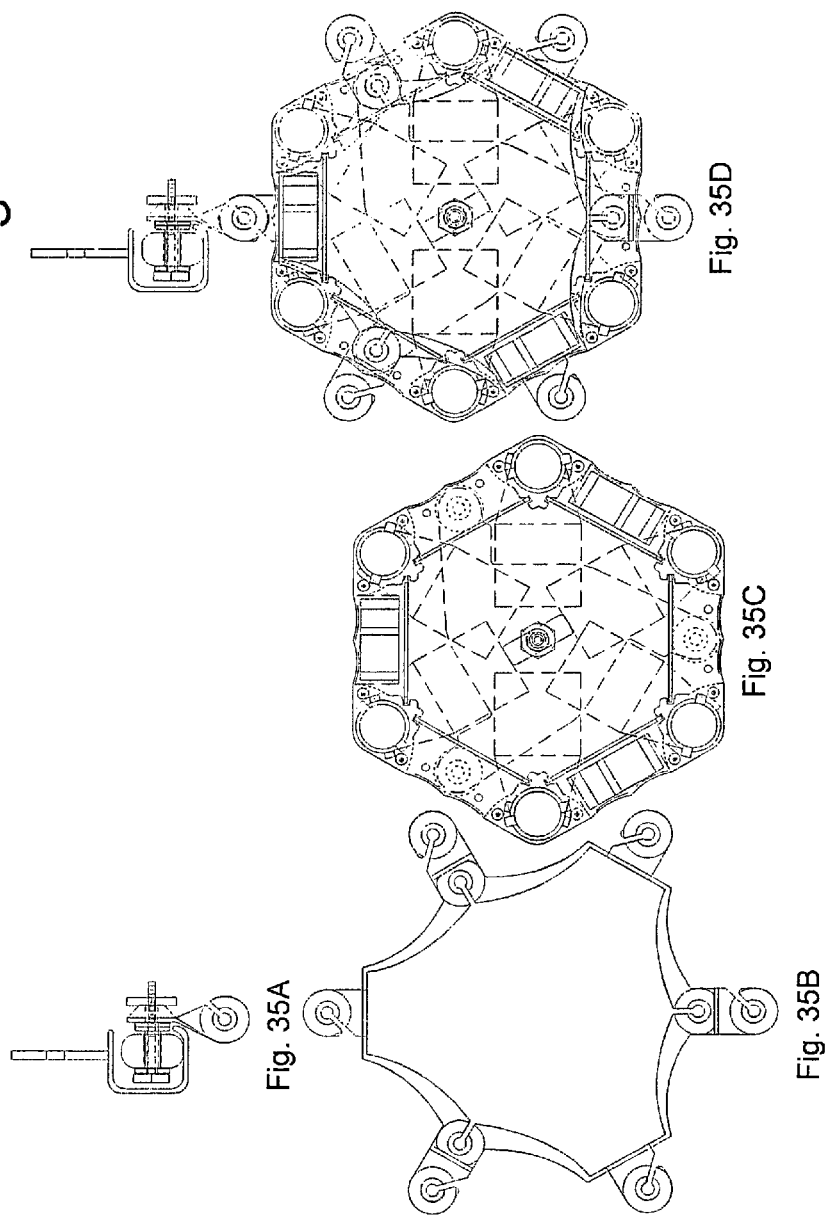

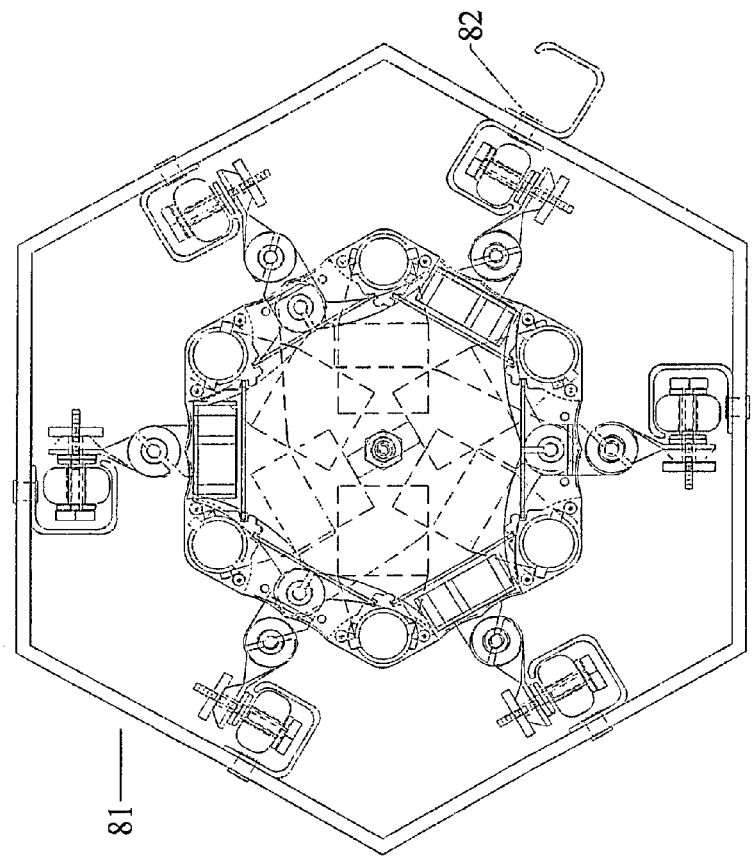
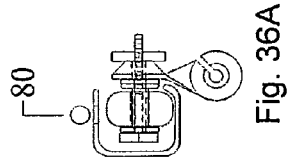
Fig. 36

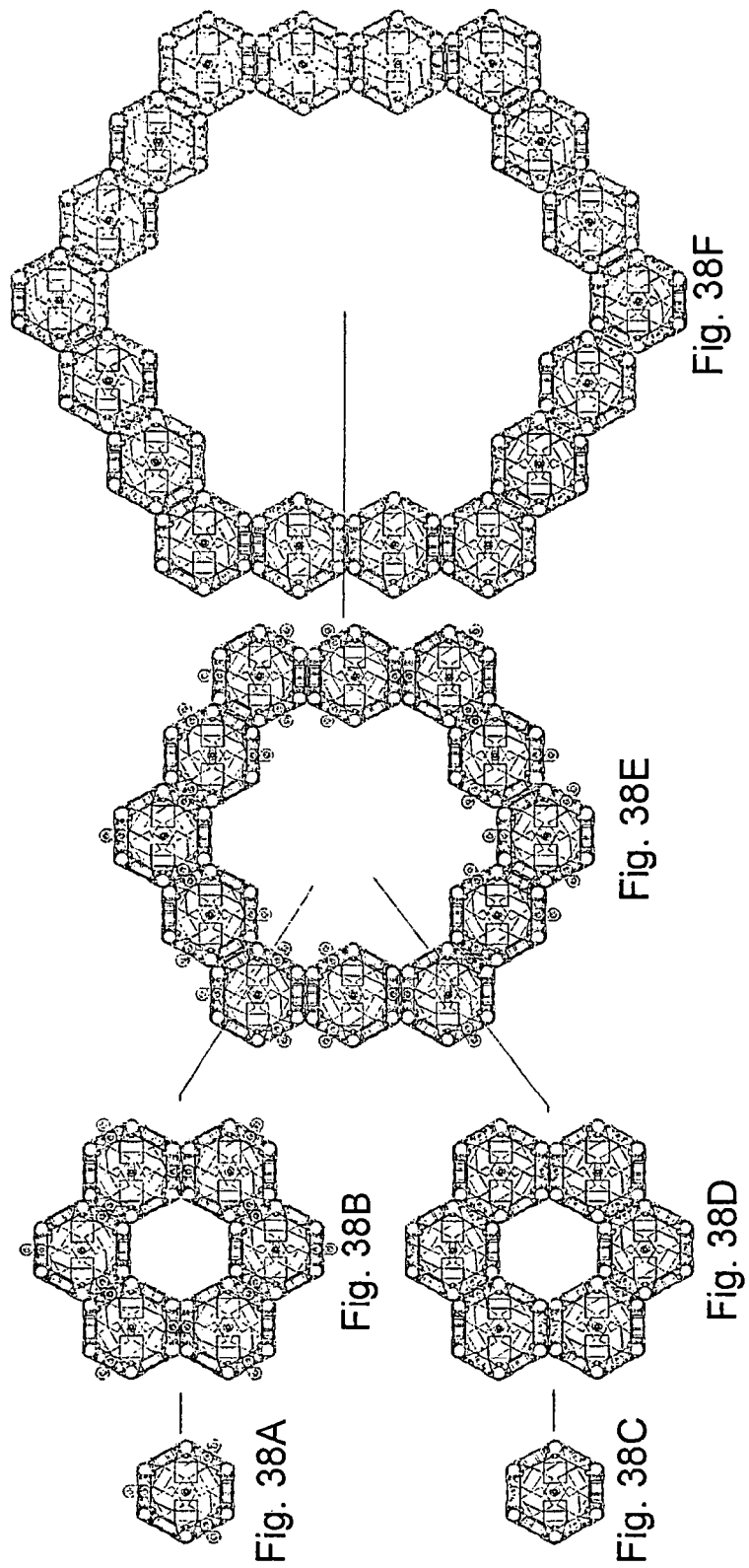

Fig. 39
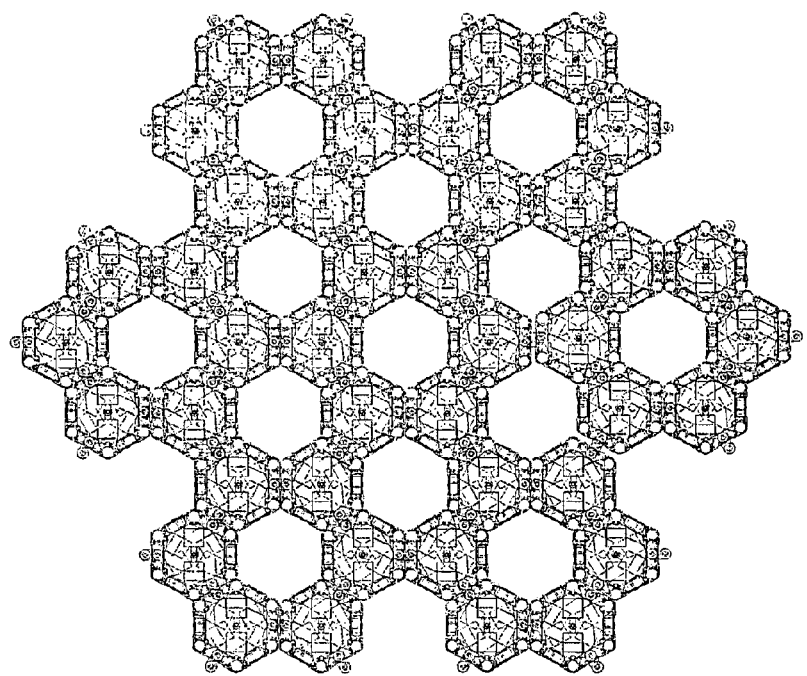
Fig. 39D
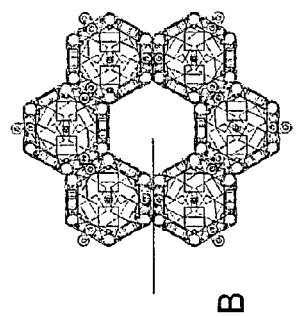
Fig. 39C
Fig. 39B  Fig. 39A

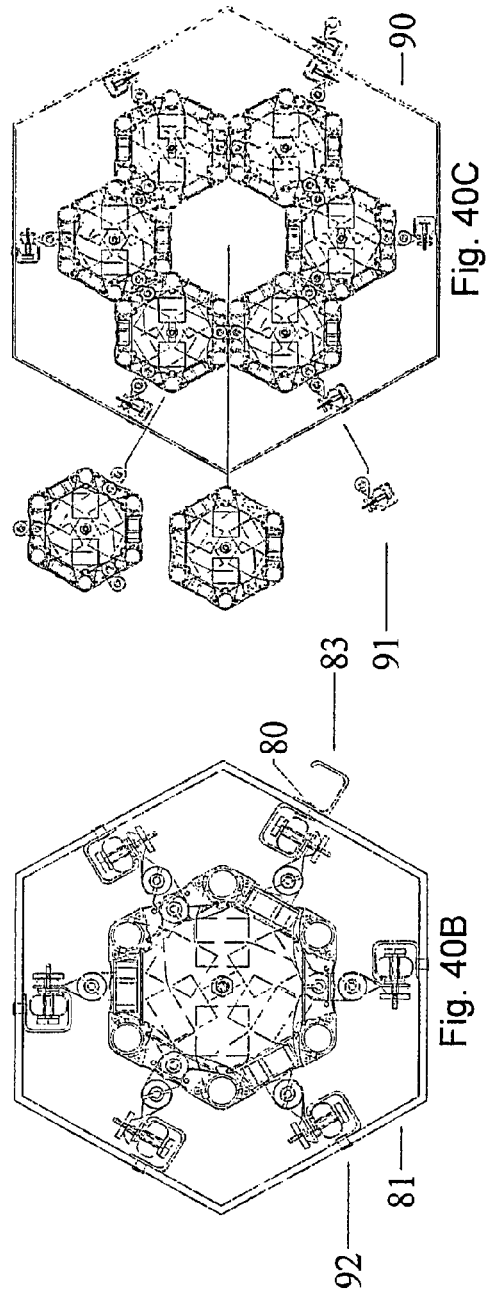
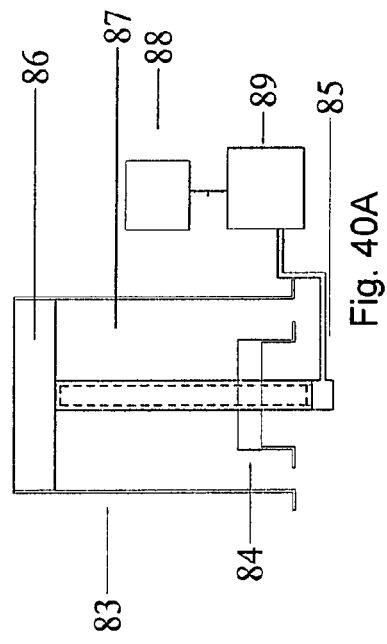
Fig. 40

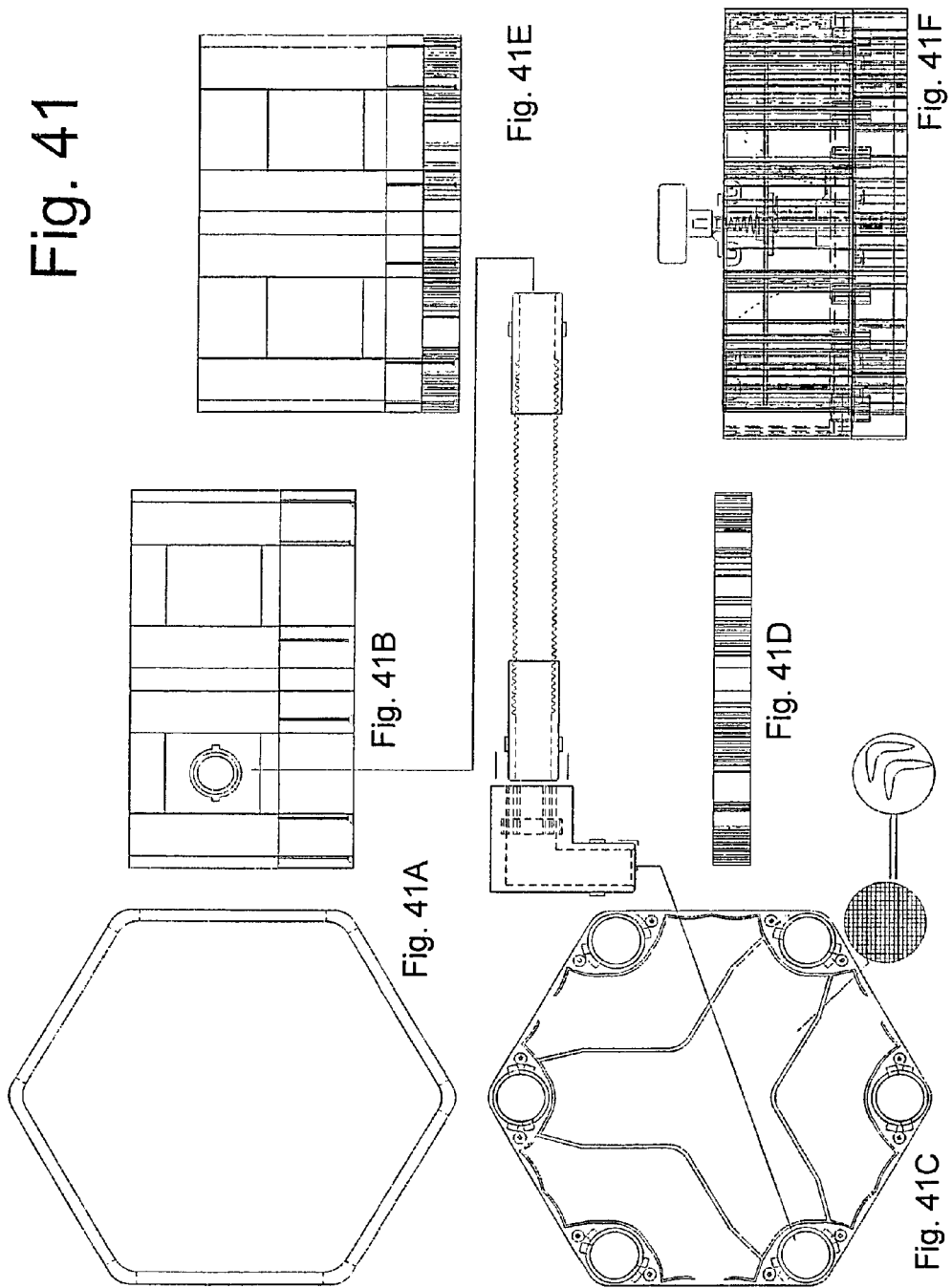

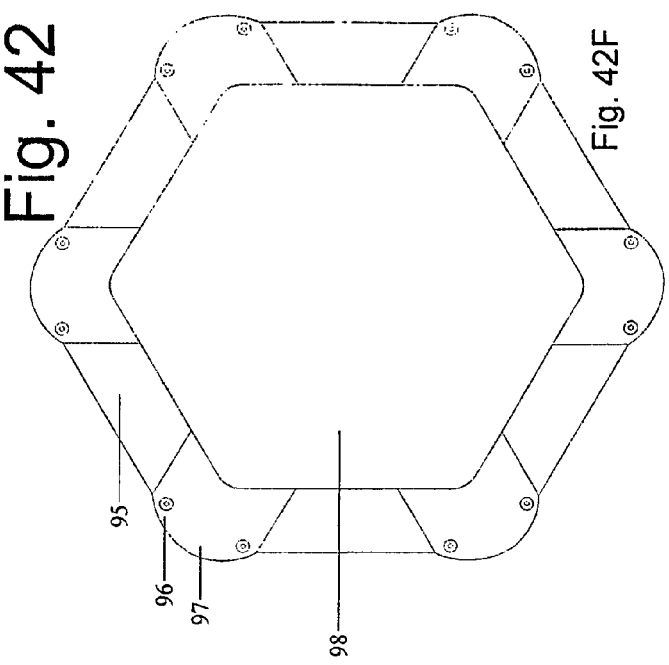
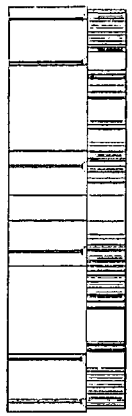
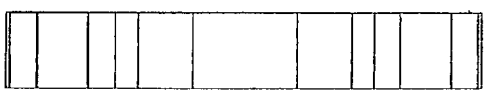
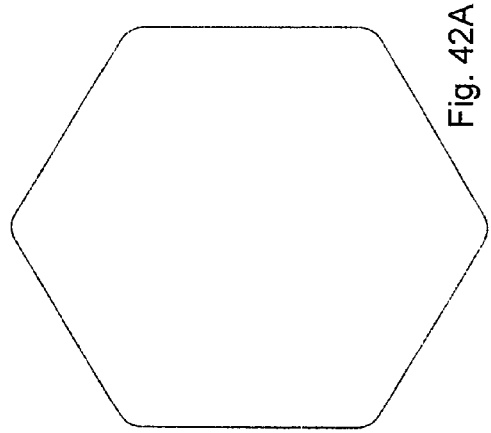
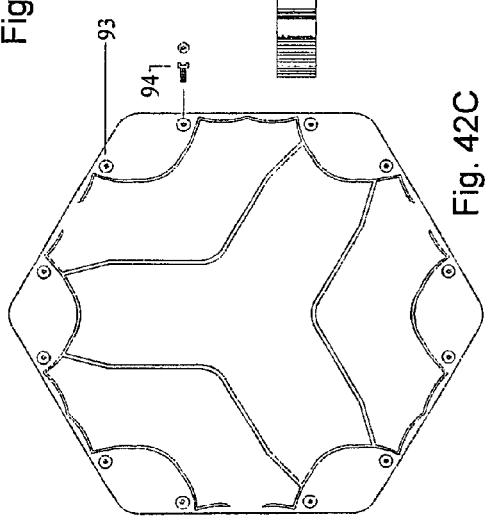

Fig. 43
Fig. 43C
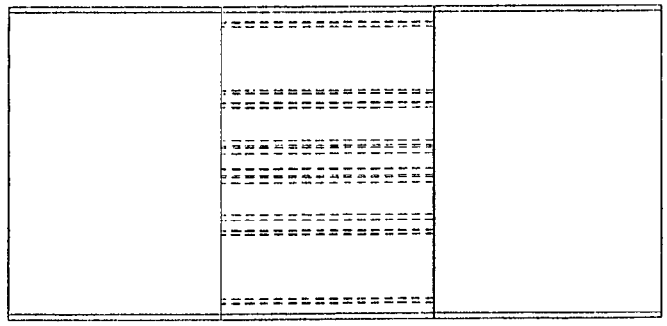
Fig. 43A
Fig. 43B

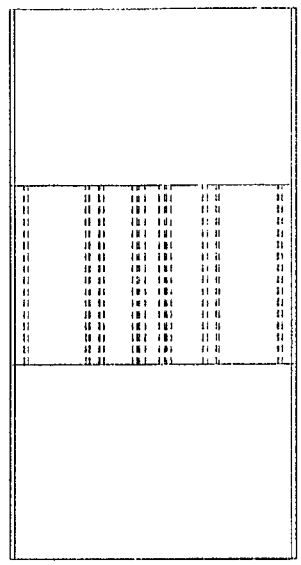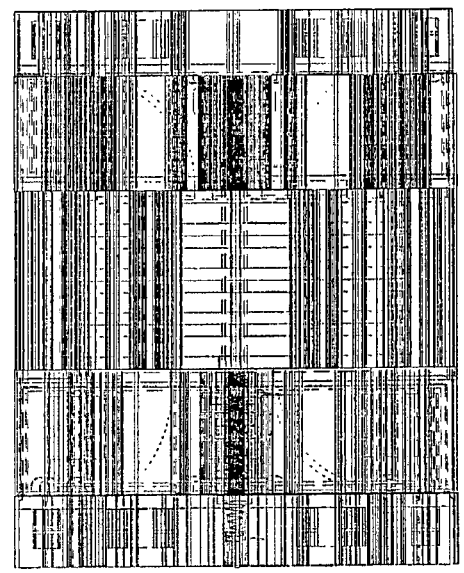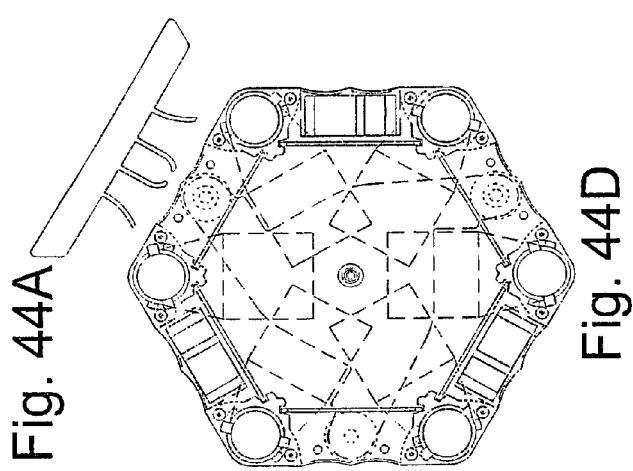
Fig. 44
Fig. 44A
Fig. 44B
Fig. 44C
Fig. 44D
Fig. 44E

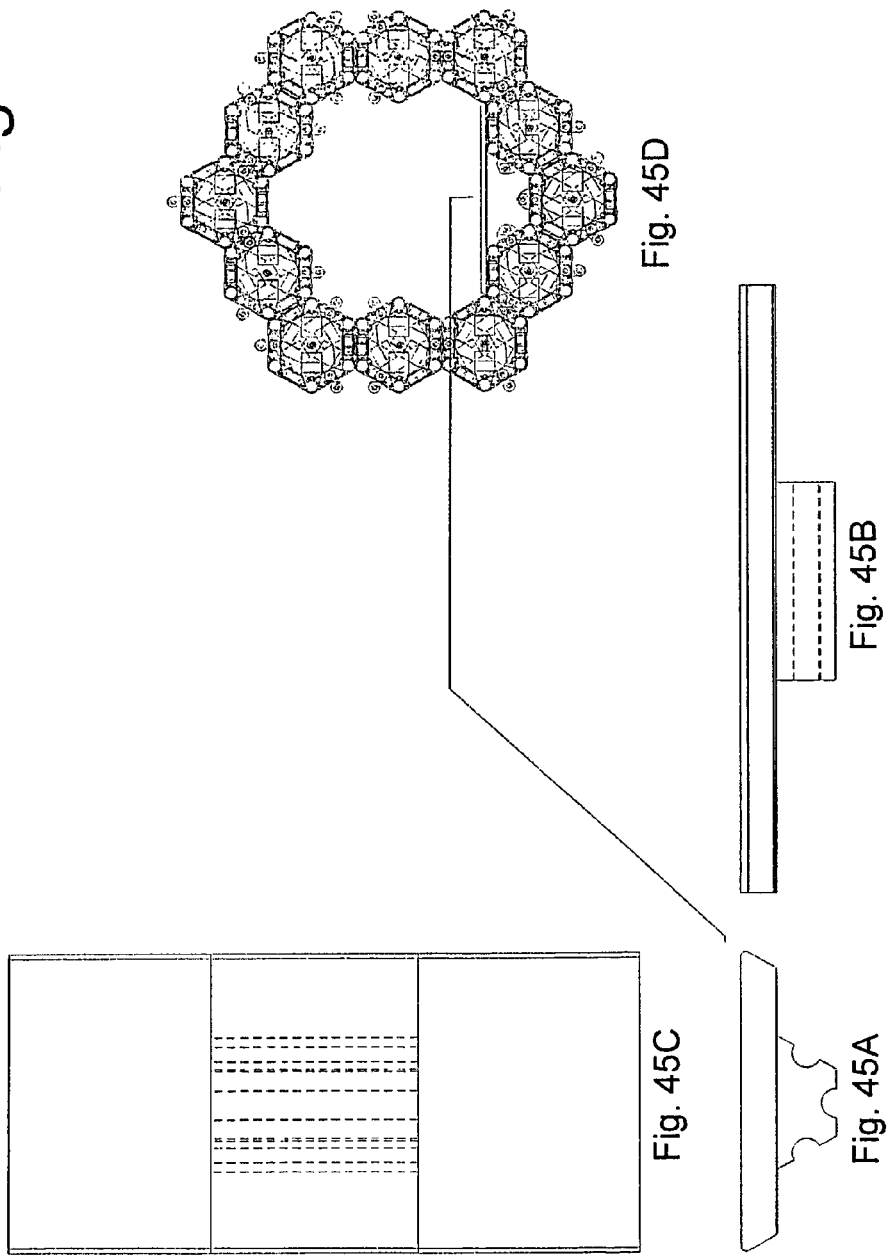

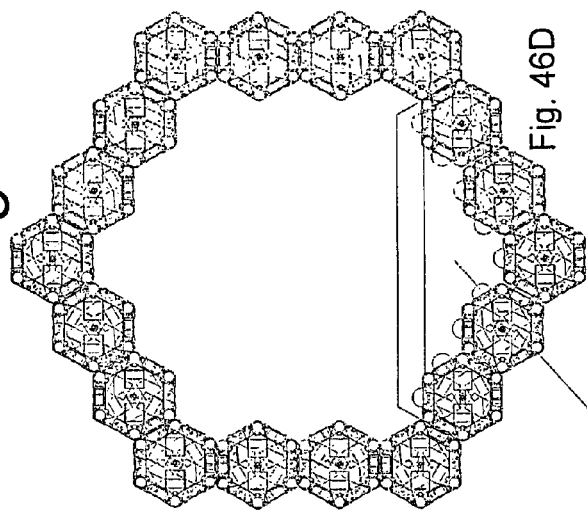
Fig. 46
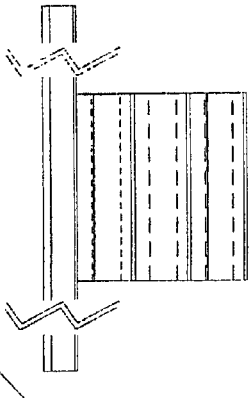
Fig. 46D
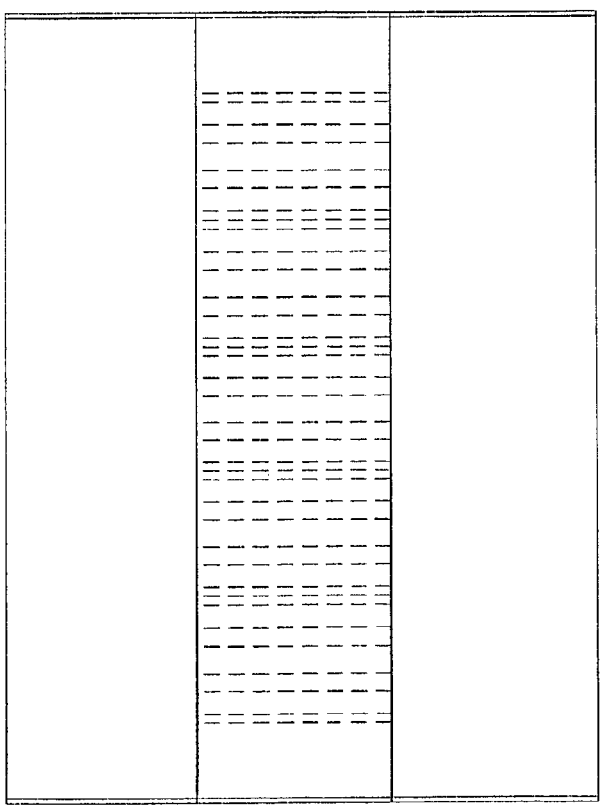
Fig. 46A
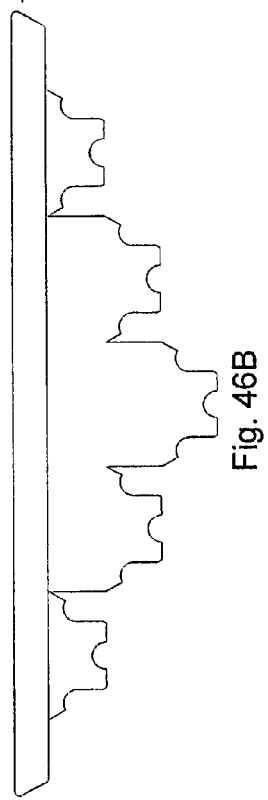
Fig. 46C
Fig. 46B

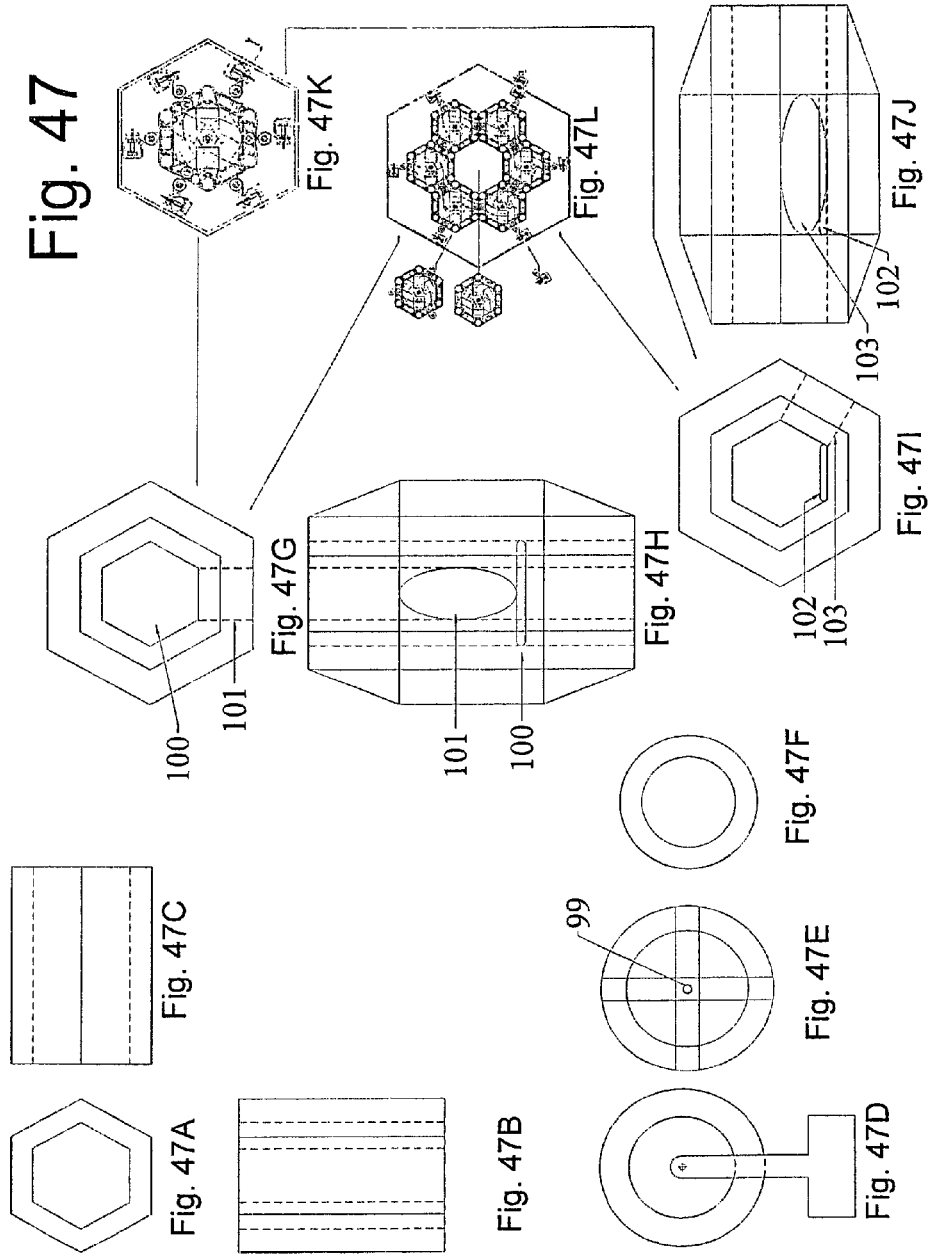

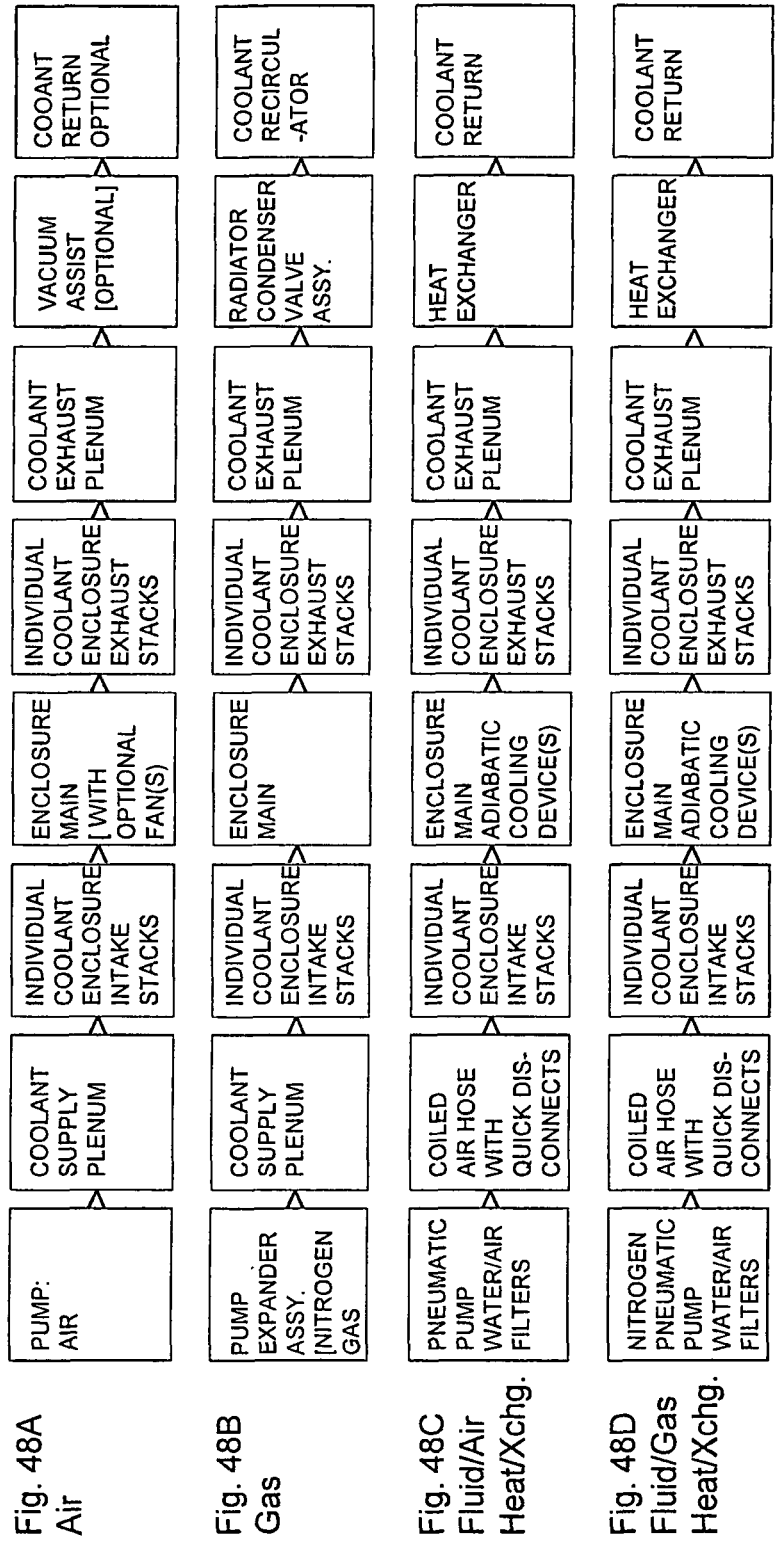

Fig. 49
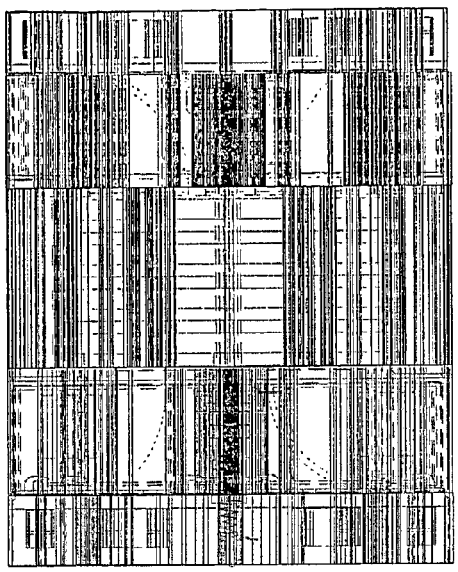
Fig. 49A
Fig. 49B
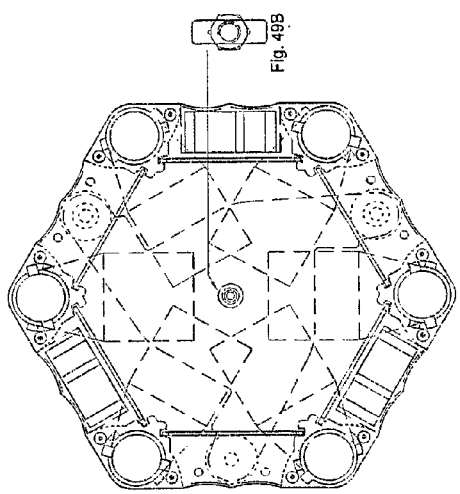
Fig. 49C
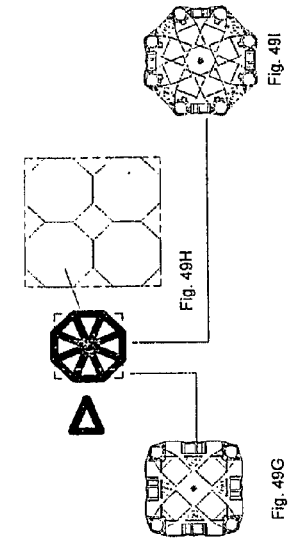
Fig. 49D
Fig. 49E
Fig. 49F
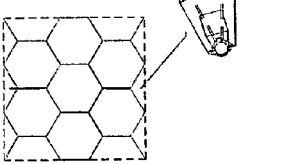
Fig. 49G
Fig. 49H
Fig. 49I Fig. 50
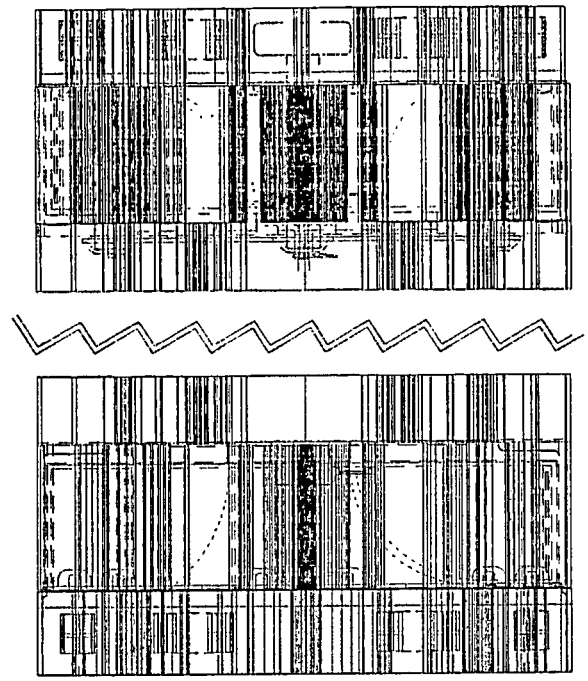
Fig. 50C
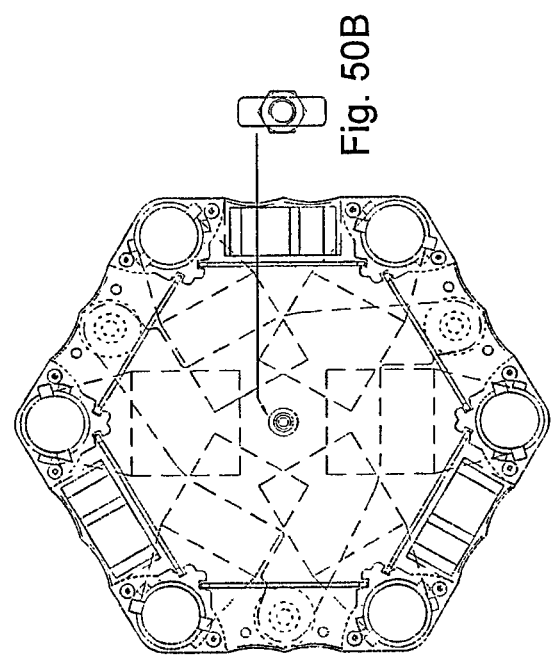
Fig. 50B
Fig. 50A

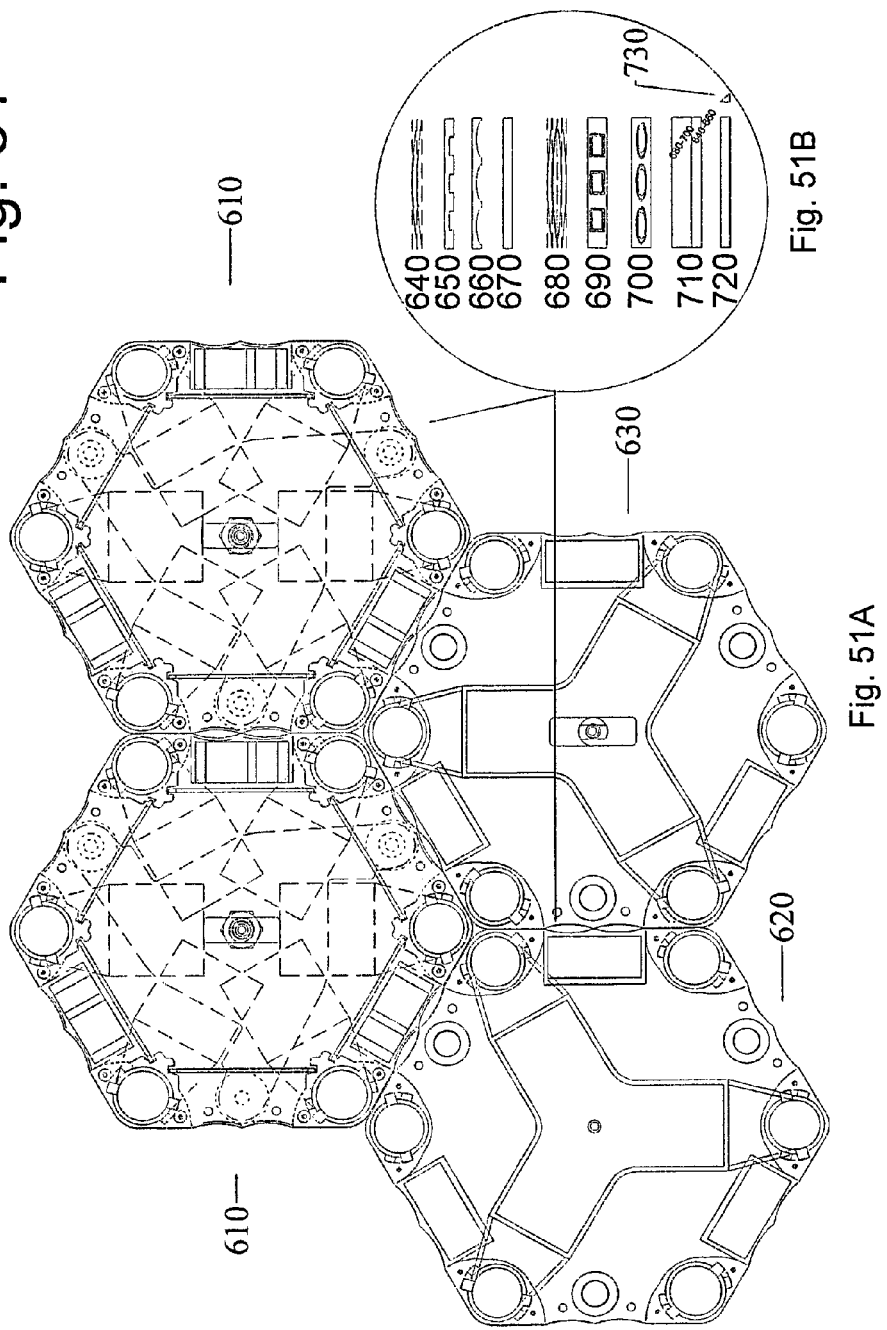

Fig. 52
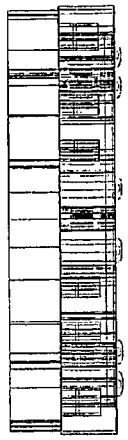
Fig 52H
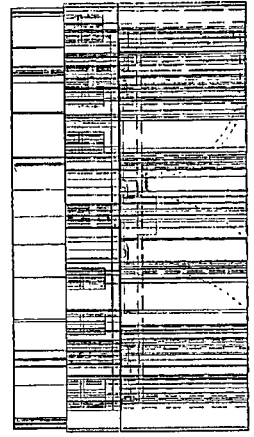
Fig 52I
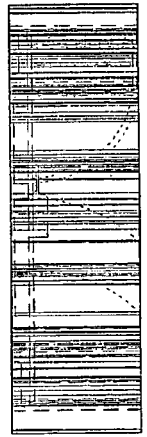
Fig 52C
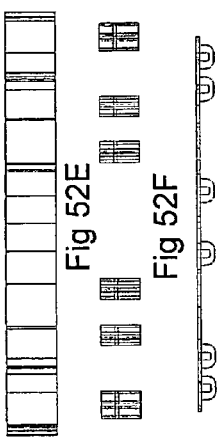
Fig 52E
Fig 52F
Fig 52G
Fig 52B
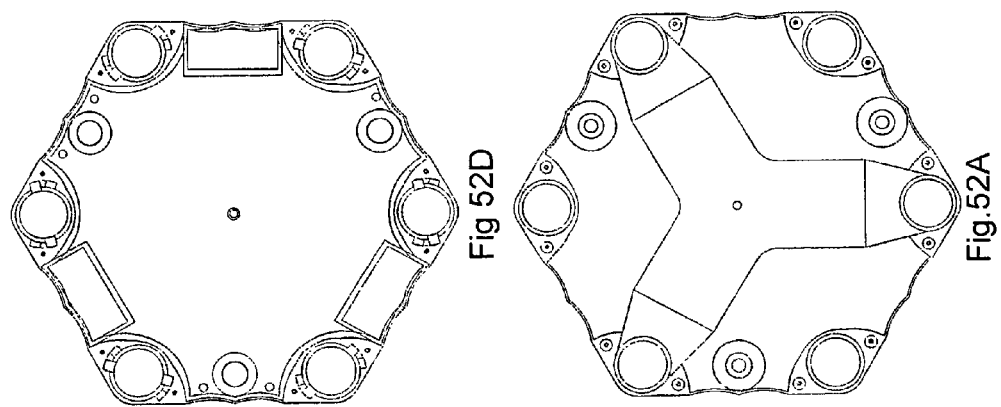
Fig 52D
Fig. 52A

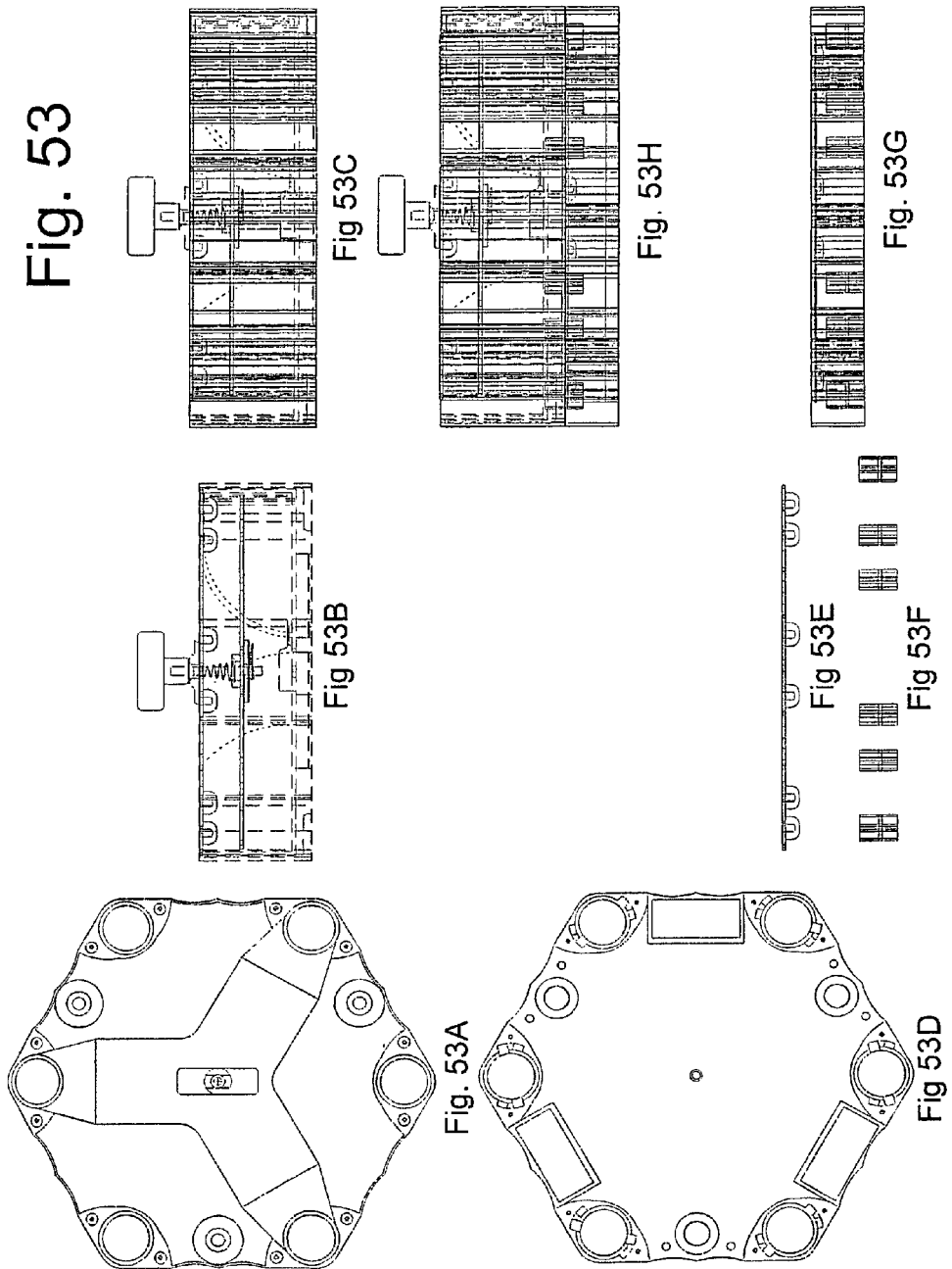

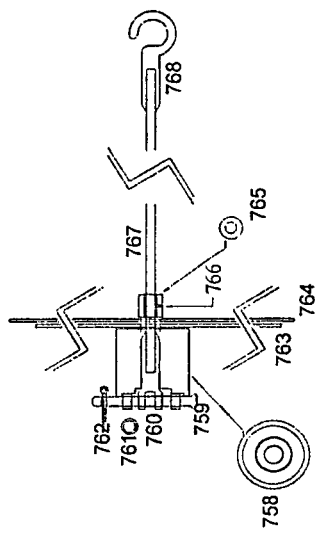

FIG. 55
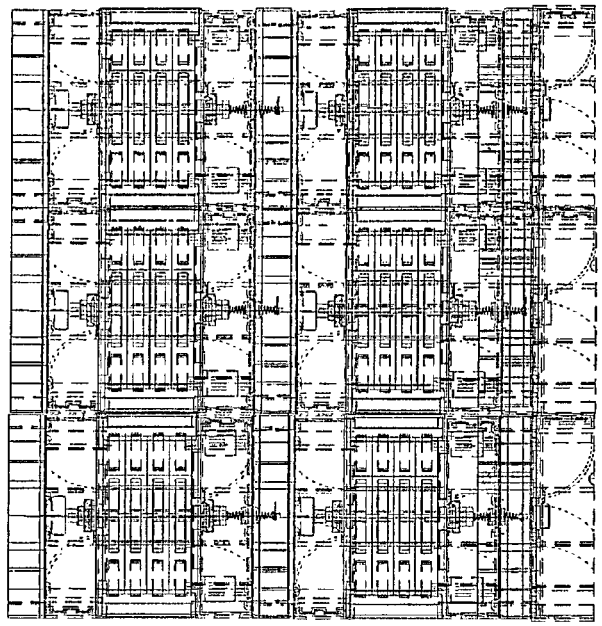
Fig. 55C
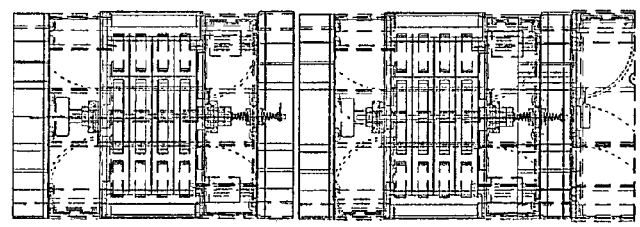
Fig. 55B
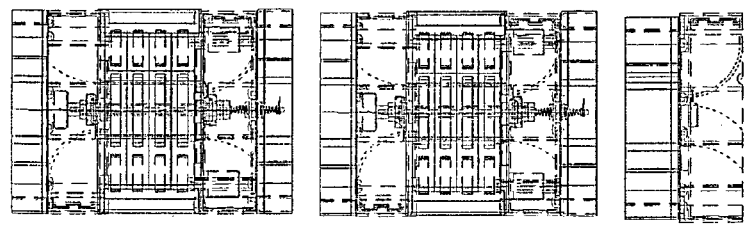
Fig. 55A

FIG. 56
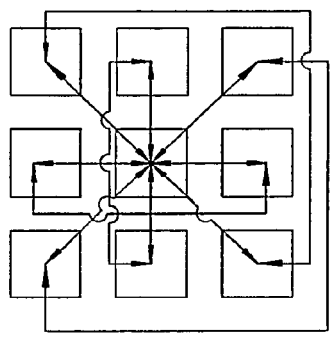
FIG. 56C
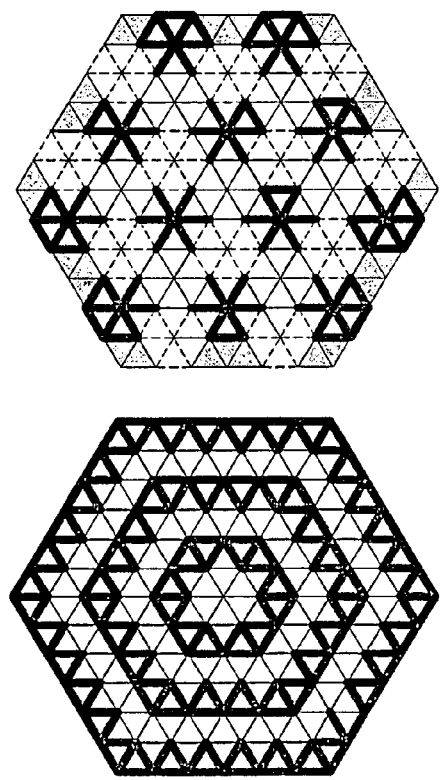
FIG. 56B
FIG. 56A
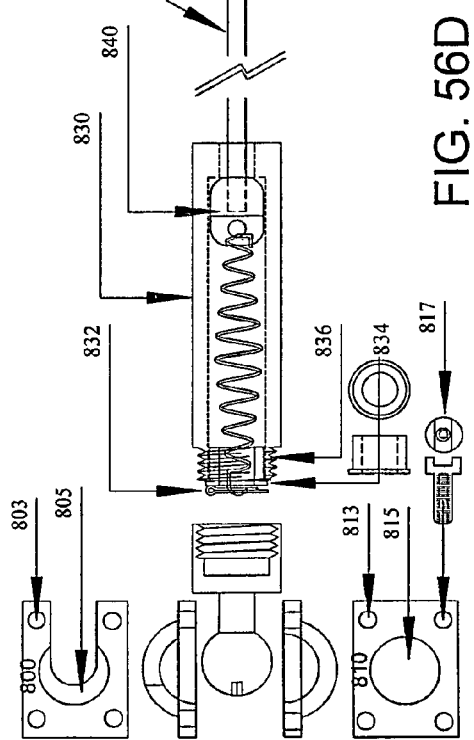
FIG. 56D

FIG. 57
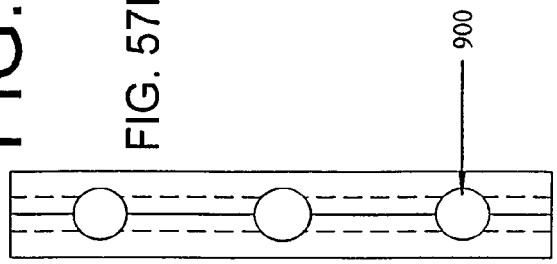
Fig. 57D
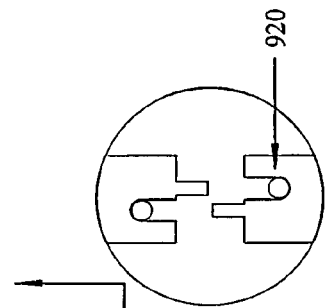
FIG. 57E
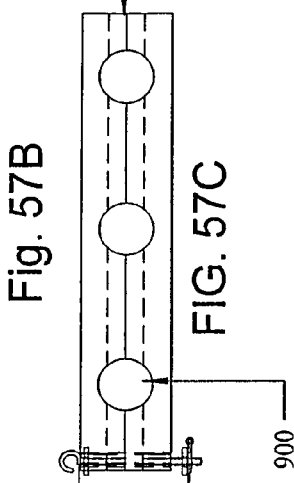
FIG. 57C
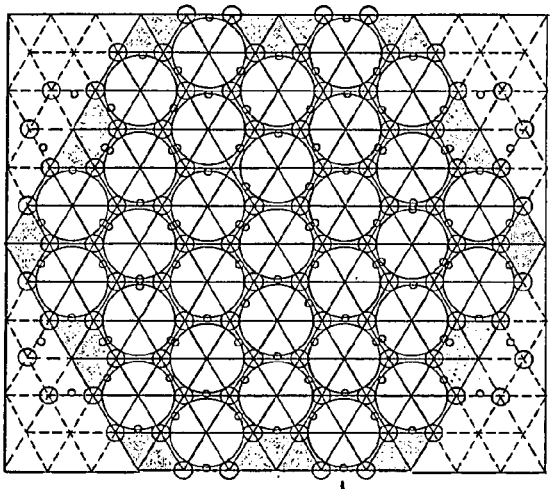
Fig. 57B
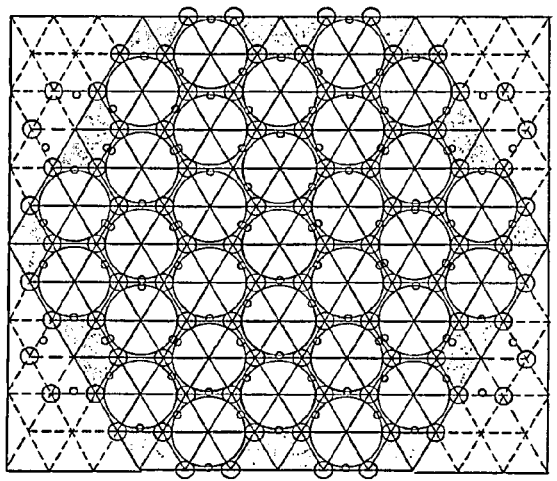
Fig. 57A FIG. 59
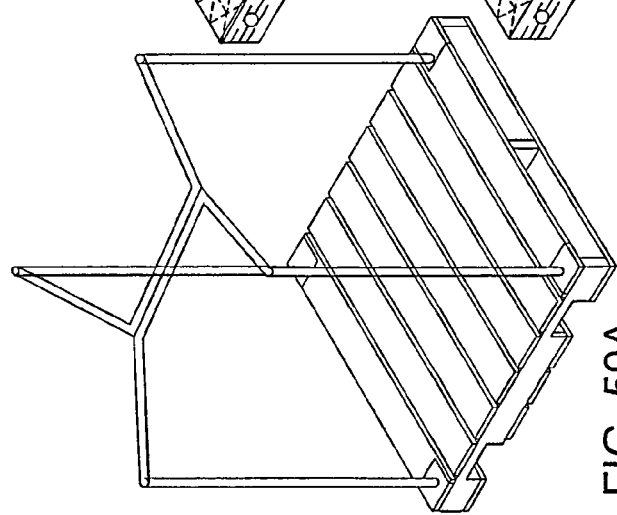
FIG. 59A
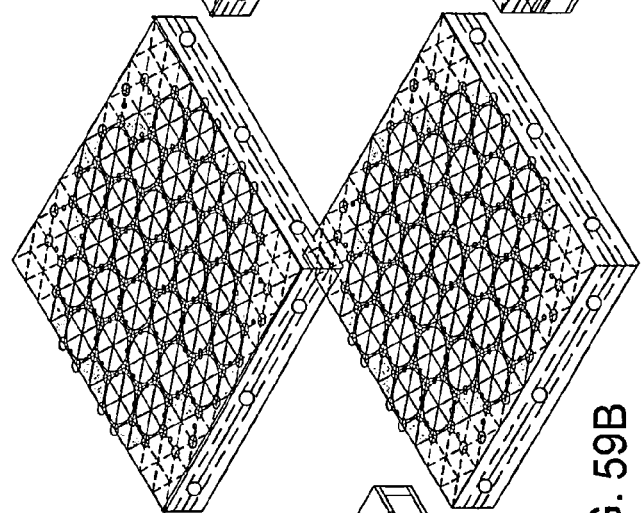
FIG. 59B
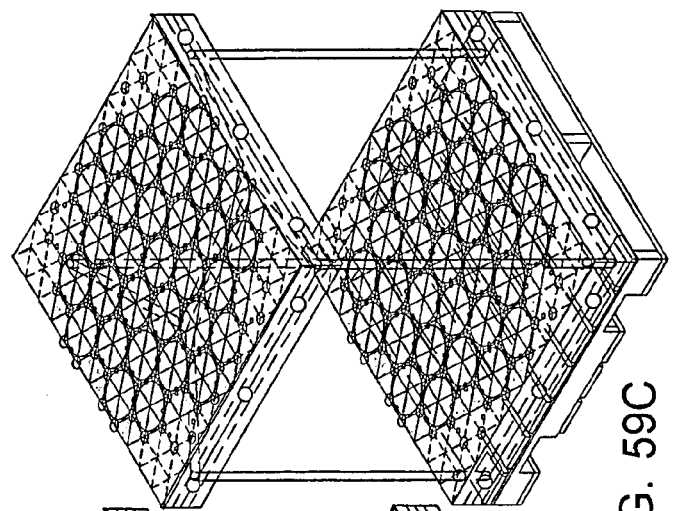
FIG. 59C

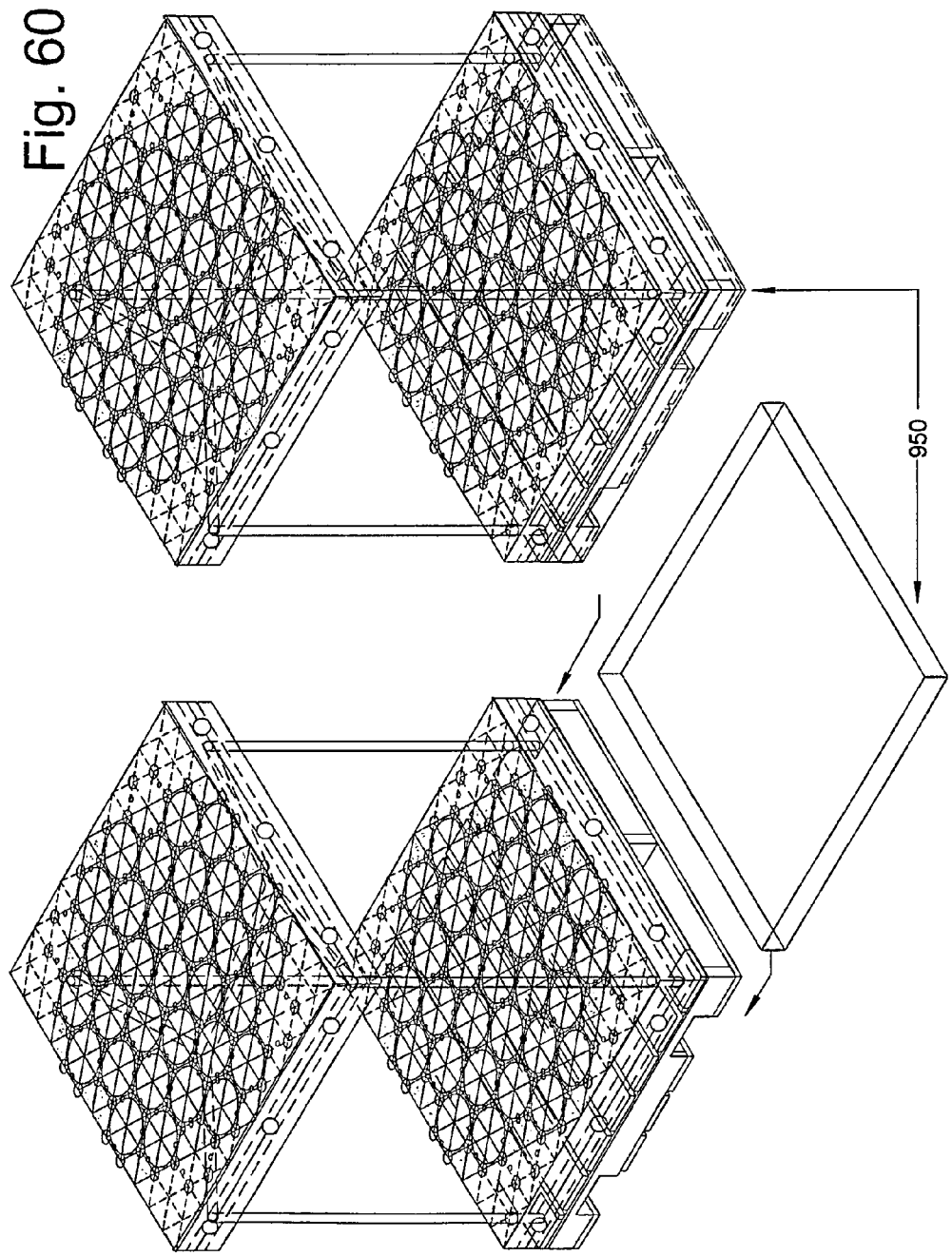

FIG. 61
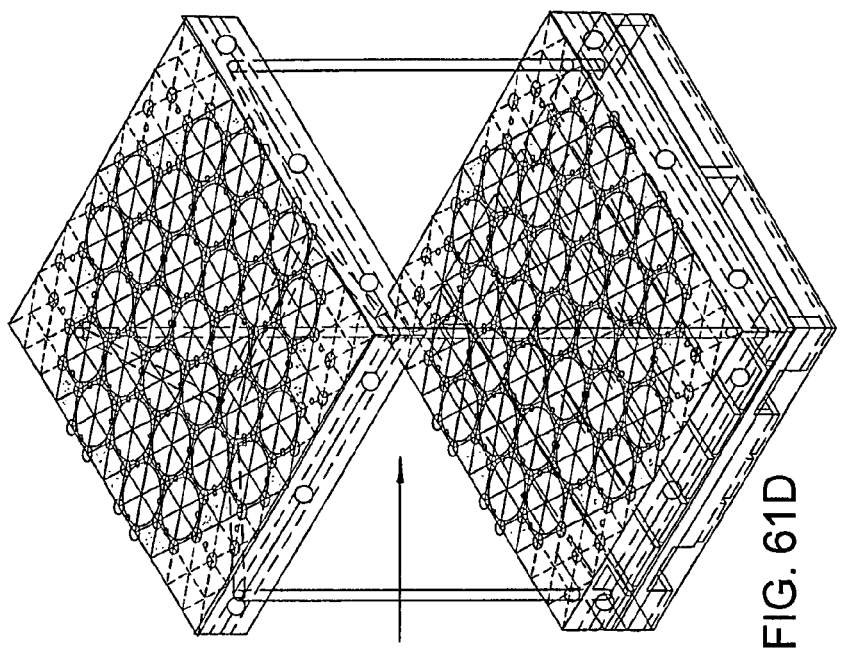
FIG. 61D
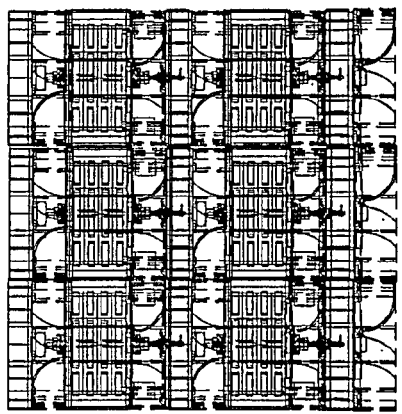
FIG. 61C
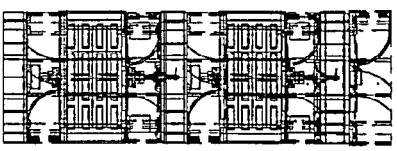
FIG. 61B
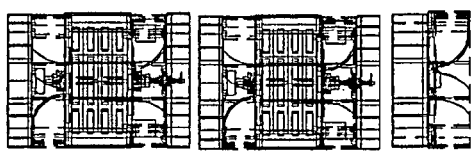
FIG. 61A

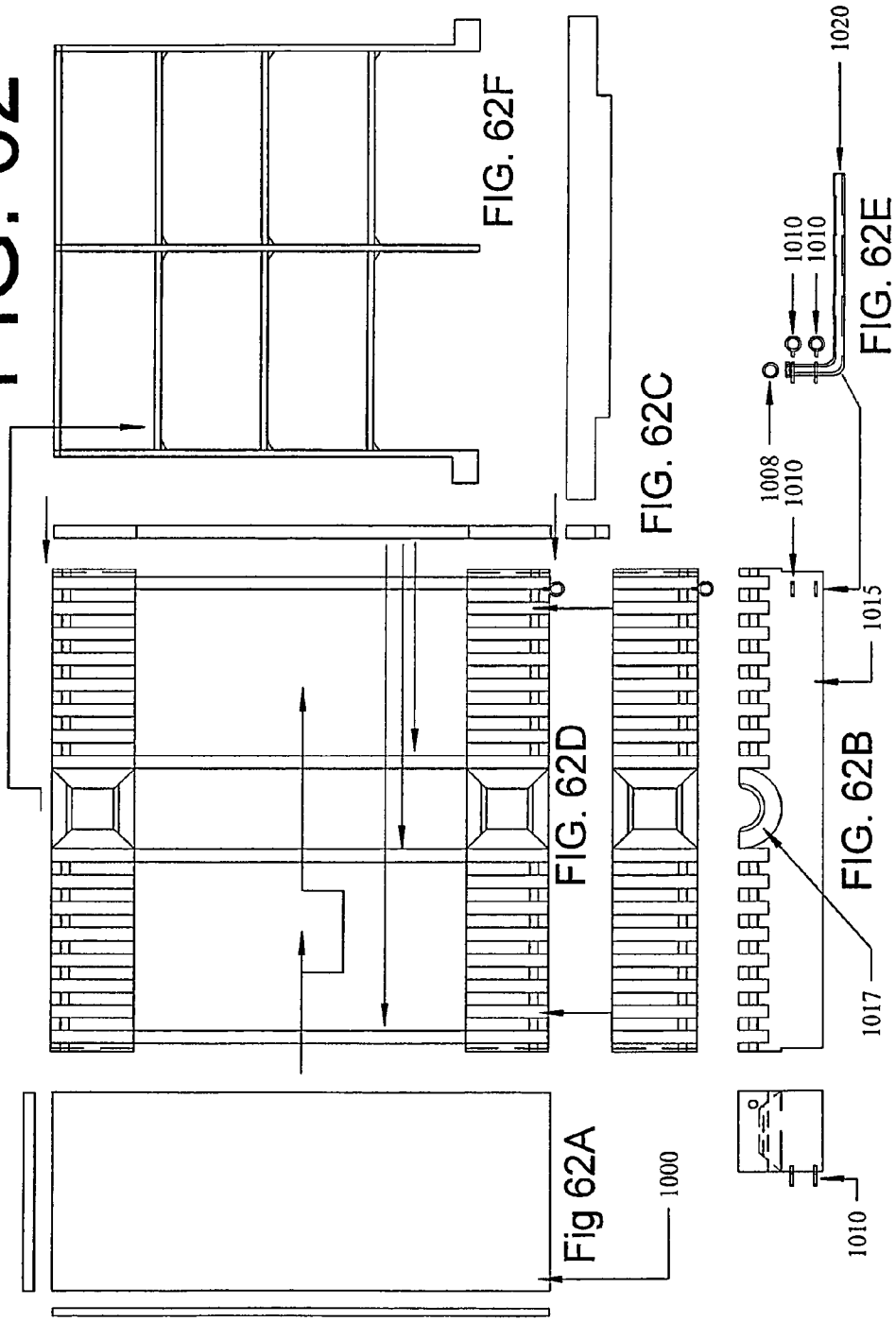

FIG. 63
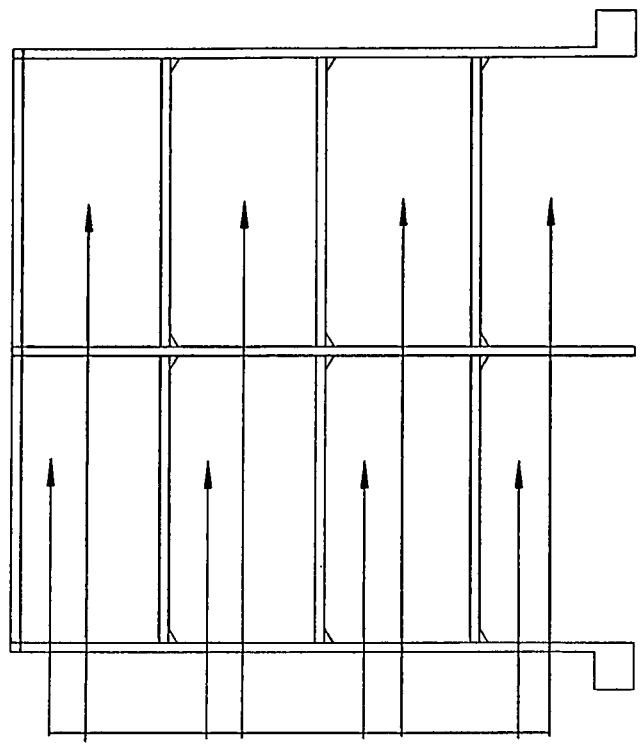
FIG. 63C
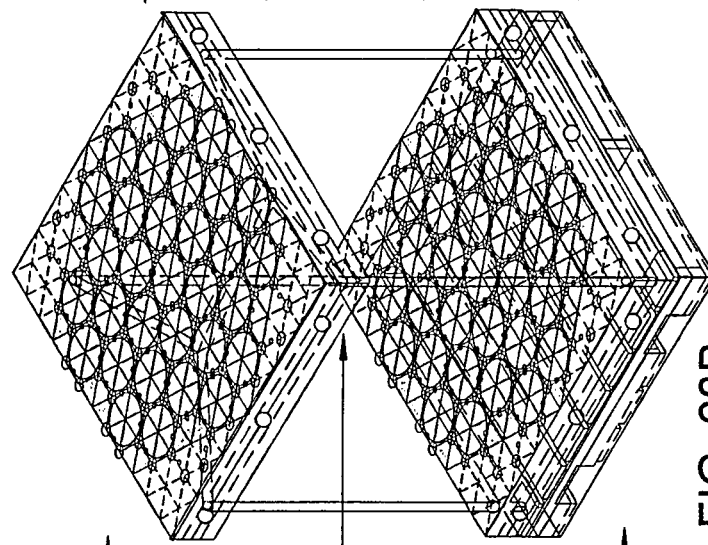
FIG. 63B
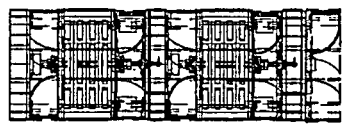
FIG 63A

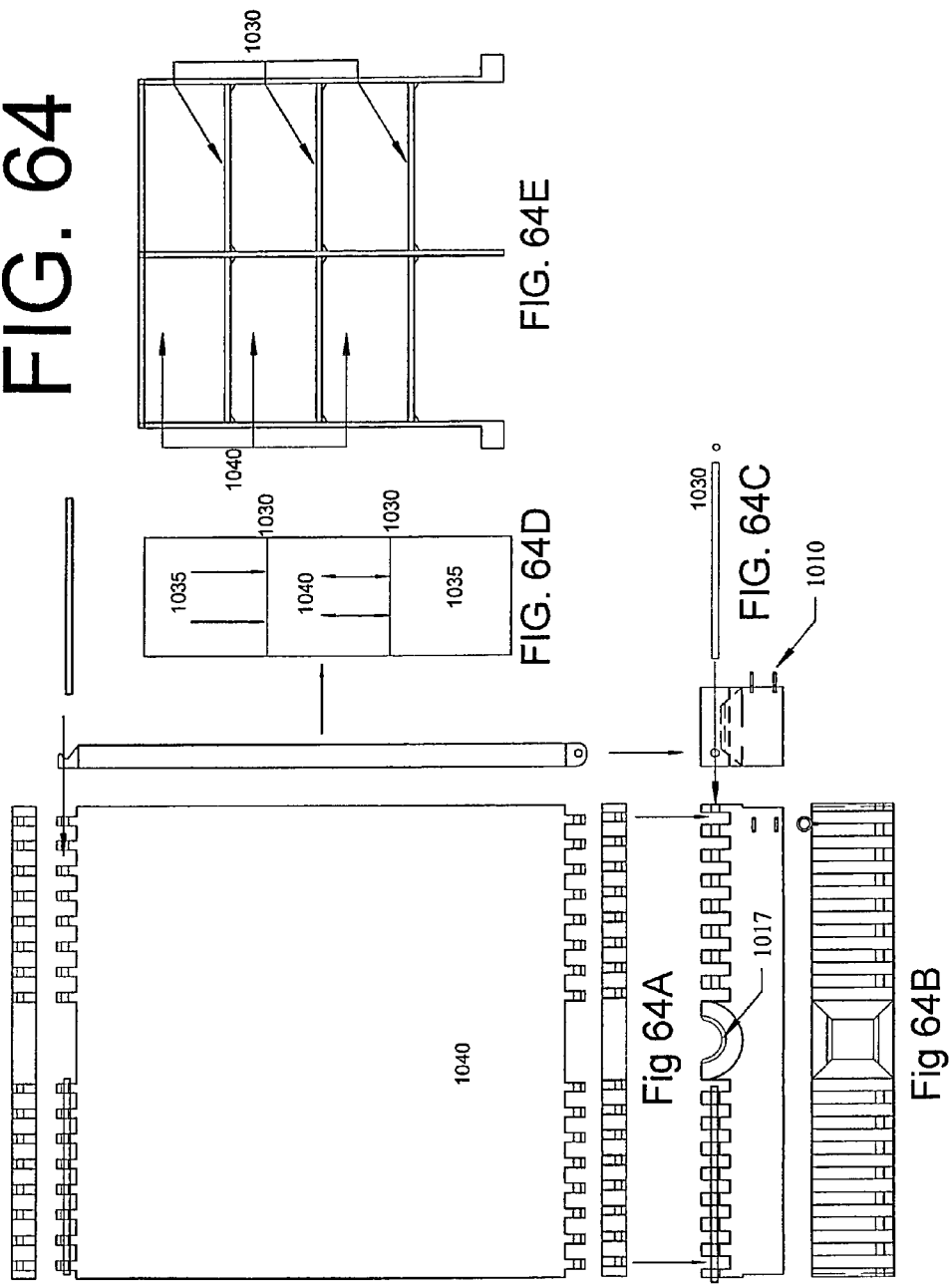

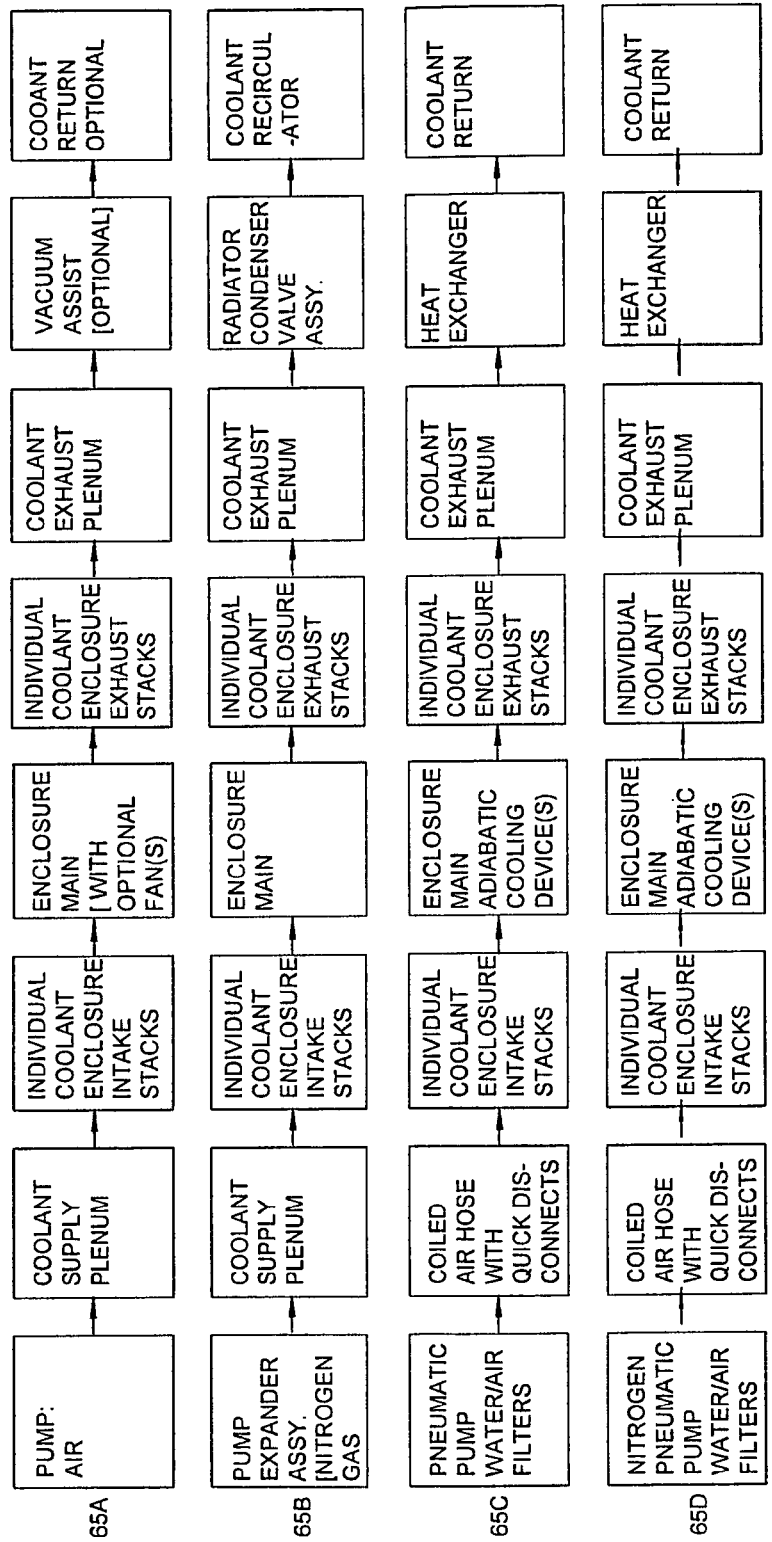

SYSTEM AND METHODS FOR SCALABLE PARALLEL DATA PROCESSING AND PROCESS CONTROL

CROSS-REFERENCE TO RELATED PATENT

U.S. Pat. No. 8,542,492 B2.

STATEMENT REGARDING FEDERALLY SPONSORED RESEARCH OR DEVELOPMENT

Not Applicable.

NAME OF THE PARTIES TO A JOINT RESEARCH AGREEMENT

Not Applicable

INCORPORATION BY REFERENCE OF MATERIAL SUBMITTED ON A COMPACT DISK

Not Applicable

BACKGROUND OF THE INVENTION

1. Field of Invention

700/1 Division A, ref. defs700.pdf, "This is the generic class for the combination of a data processing or calculating computer apparatus (or corresponding methods for performing data processing or calculating operations) and a device or apparatus controlled thereby, the entirety hereinafter referred to as a control system. Notes therein further corroborate said selection.

2. Background Art

Prior Art appears to be comprised of X-Y Cartesian coordinate or XYZ coordinate systems used to layout connection based systems in 2D as single plane devices using additive or subtractive processes and 3D as layered substrates utilizing additive and subtractive processes or enclosures respectively based on either cubic or rectangular prisms. Enclosure based systems often stack in columns and rows to make 2D arrays which give rise to what we refer to as aisles where sometimes two 2D arrays are placed so that their backs are to each other with the front faces accessible in parallel aisles similar to shelf layouts in a supermarket. On occasion such arrangements are laid out in a circle round a central space for access.

SUMMARY OF THE INVENTION

The following is incorporated by reference from Ser. No. 12/806,211:

The invention differs from already patented or made inventions as follows:

1. We use words to communicate and define that of which we speak for the purpose of mutual understanding. For this reason, it is necessary to define tessellation forth with. Tessellation is defined as a collection of planar figures that fill a plane with no overlaps and/or gaps. Generalizations to higher planes are also possible . . . (Reference: http://en.wikipedia.org/wiki/Tessellation). Tilings are defined in kind without gaps or overlaps with irregular shapes. This is a pretty standard stuff. Other patents have made claims based on tessellation, which without gaps, would indicate a solid surface without separation and therefore any extrusion from such a planar surface to the third dimension would have to be a singular solid. Therefore this invention is not a tessellation and is hence outside the scope of those patents claiming a tessellation as a basis. (Ref. U.S. Pat. No. 6,469,901B1, 09672681).

2. Separately, in kind again, the state of the art, as proposed in preceding patents does not meet or approximate the criterion of a tessellation or tiling with vast unclaimed gaps often exceeding the surface area of the modules, between not even remotely contiguous co- and multi-planar veritable islands connected by "rats-nests" of half-hazard wiring or RF omni-connectional bridges. More chaos than pattern. Thus although the patent proposed here may approximate a tessellation more closely than it's forebears, by definition it is not a tessellation, period, as it uses external planar and other gaps for interconnects, including wiring, cabling, tubing etc. as delineated in other areas of this document and the associated patents incorporated by reference. However, the invention is a vast improvement over prior technology as it takes control of the inter-module "rats nest" of wiring and other interconnection and brings the state of the art closer to the ideal of tessellation extruded from 2D to 3D with gaps. Further, patents using a triangular square, rectangular, hexagonal, or octagonal footprint or form factor without inter-module contact and integrated wiring are of limited utility and hence more a matter of incidental design unless specific utility and hence advantage is assigned to a shape by some feature, This is particularly true if the usage proceeds from these shapes to a circle with all geometric shapes inclusive. (Ref. U.S. Pat. No. 6,469,901B1). Inter-module interconnect wiring is incorporated herein by reference to the first patent application Ser. No. 12/806,206.

3. The invention when deployed maximizes surface coverage by approximating tessellation with gaps on the outside vertical walls. These gaps allow module separation while allowing inter-module axial sliding fit tolerances for external co- and multi-planar inter-module contact and axial inter-module, stack and array motion. Only one other patent has a possible sliding fit, which is not apparently called out in any applicable patent application, and as it appears to use a pipe, it may be assumed to be stationary, bolted in place, without a sliding fit. Other patents have no such sliding fit, either, module to module, stack to stack or in arrays. (Ref. U.S. Pat. No. 4,499,607).

4. The invention allows nesting with vertical axial individual sliding fit component removal without edge, or end mount connectors, but rather using retractors, flexible cable, wire, tubing, etc. Other patents do not nest and allow individual nested submodule replacement without total, extraction of abutting units first. (Ref. U.S. Pat. No. 6,469,901).

5. The invention utilizes external module side walls with recessed bezeled, unbezeled or combinational patch panels with built in or surface mounted retractors, backing plates, mounting panels and pc boards for wire, cable, etc. in conjunct with sufficient interconnect lengths. This allows abutting module axial motion while maintaining abutting inter-module co- and multi-planar interconnections for sidewall patch panel (re-) configuration, replacement and/or quick change for (re-) manufacture, field service and retrofit while accommodating all styles of interconnect, with a preferred embodiment including quick-disconnect capability. This can be done in single or multiple stacks and/or arrays with or without nesting. Modules in such an arrangement may also be taken out of a stack, an array or stack of arrays, with minimum impact on neighboring modules. No other known system has these conjoined capabilities. (Ref. U.S. Pat. No. 6,469,901)

6. The invention incorporates a top interconnect catch basket and an integral bottom self centering tapered slip fit cover, wherein all styles of interconnect may be mixed and matched, not just computer, or data-exchange. Interconnection capability is limited only by catalog, special hardware or the OEM, vendor or other users imagination. This diversity is based on placement of infinitely configurable mounting flats, replaceable and modifiable bezels, landings, knockouts, cutouts and plugs. This allows for individual stacked modules to be accessed for service including (re-) configuration of end cap wiring basket and cover interconnects. Other patents allow for only proprietary, including alignment based, top and bottom interconnects for communication to and from resource modules such as computers and drives a stand-alone stacks and not for inter-stack or array communication with no catch basket, tapered matching protective cover or cable and/or hanger based alignment systems. (Ref. U.S. Pat. Nos. 6,469,901, 4,501,460).

7. The invention utilizes hot swap. Modules enjoy power interconnects between modules, where a three wire, hot, neutral and ground bus bar system is used within each module with quick-disconnect power interconnects at the top and bottom of each unit, preferably hermaphroditic. The top and bottom units of a singular stack are wired back to the same electrical outland master breaker panel leg. This allows hot swap by disconnecting one side of an intermediate stacked module, connecting a replacement module on the powered disconnected adjacent side, moving the connections from the old to the new module, disconnecting the power plugs from the old module and attaching it to the new module to again complete the double ended bus bar circuit. When dealing with arrays the number of plug interconnects equals the rotational stacking positions possible, as shown in exemplary fashion with three possible plug alignments, matching top and bottom, in the six sided asteroidal enclosure drawings minimum of three such plugs are utilized. In standard configuration one plug set acts as the bus bar, the other two are pass throughs, rotation, by example 120° for a hexagon, which dictates which will be active for a particular stack. This is done so that adjacent modules in planar arrays may have hot swap and not be on the same leg, allowing system information and/or process rerouting, should power go down in a particular leg.

8. The preferred embodiment employs interconnects which enjoy some form of quick-disconnect at either end and are limited in travel to between one and two modules in length to help expedite re-configuration, service modification and replacement, pending component selection. Other systems are more hard-wired and are therefore harder to take apart, update, refurbish, replace or repair. (Ref. U.S. Pat. Nos. 4,501,460, 6,469,901).

9. The invention provides that modules are positioned and moved either manually and/or by automation. Manual motion utilizes Cable Grippers™ (or functional equivalent), actuator plate, actuator rod, optional actuator tube and connected actuating handle with optional locking release. This is used for individual modules, stacks and/or in nested co- and multi-planar arrays with integrated variants incorporating track and roller systems and/or (stepping) motor driven cog and track systems to constrain or otherwise control motion. Stack and arrays may be horizontal, vertical or any angle in between, held together by frames, hangers, hooks, etc. All combinations as stated are envisioned with or without nesting. No other patent appears to have this capability. (Ref. U.S. Pat. No. 4,501,460).

10. The invention allows single and multi-interconnection sidewall facet based interconnection in either co- or multi-planar geometries or through vertical end cap basket and cover sets or interface with or without utilizing intake and exhaust master plenums or any combination thereof as preferred methods of command and control. Command and control is wired internally from any point of the module wired to the sidewall of choice, and then externally with or without internally and/or externally mounted retractor(s) through the external patch panel on the chosen wall to the module of choice either above and below or adjacent to the co- or multi-planar module in question. The external wire guides above and below the patch panels are used to position and constrain wires to their proper motion. Other patents espouse vertical stack based command and control interconnection only based on individual vertical inter-module wiring with a singular modular interconnect.

11. The invention employs a three, four, six, eight sided astroidal and/or approximated tessellation and/or tiling enclosure with/or without truncated convex or concave apexes and scalloped transitions between individual horizontal curves connecting apices for wire guides, although straight lines may also be used or any combination thereof. Rounded surfaces are preferred to avoid snagging or other binding, although straight lines may also be embraced. However, external enclosure geometries of similar patents are apparently without exception, based on straight lines, some and/or convexly formed curves with no concavely formed features. (Ref. U.S. Pat. Nos. 3,495,134, 4,937,659, 6,469,901).

12. Although many patents refer to thermal management as part of their embodiment in many instances it is not addressed at all. The gold standard appears to be the placement of louvers in the walls of a shoebox or cubic cavity. The invention utilizes radially symmetrical outlying cooling tube housing assemblies tangentially asymptotic to their respective intersecting sidewalls of the individual apex centers which are truncated and rounded so as to be conformal to said housings, with associated extensible coolant duct hosing, quick disconnects, plenums and plugs for intake and exhaust as well as a central optional cooling duct (FIG. 22). Cooling tubes are optionally fitted with a non-rotating (FIG. 25C) or rotating sleeve (FIG. 25F), with a coolant input ports (FIG. 25G) and angled output slats (FIG. 25D), louvers (FIG. 25E), and/or mesh which allows volumetric and directional tuning of coolant output to common multi-module contiguous apex exhaust stacks. A centralized high velocity cooling stack may operate separately or in conjunction with the former (Dwg 39). Utilizing this arrangement provides rapid swap out or service of components while minimizing or eliminating the necessity of thermal management disruption in a potentially sealed and therefore explosion proof system with the possibility of above atmospheric operating pressures. Separately, by removing the top and bottom plenums, with their integrated interconnect feed throughs, this exposes end cap wiring basket fan mounts and fan shields for direct main cavity coolant intake and/or exhaust with or without optionally closing off the coolant tube housing assemblies for mechanical aspiration at flow rates comparable to some carburetors, while maintaining main cavity cage retention and peripheral ducting. Cases used or contemplated for use in arrays include a heat barrier on or in all walls so as to direct heat in the designed flow pattern. Flow patterns may be reversed or any other flow pattern combination may be utilized as required. No alternate patented and/or made competitive products appear to exhibit this features. (Ref. U.S. Pat. Nos. 4,501,460, 4,937,659, 4,499,607).

13. The invention utilizes standard industrial cartridges, including floppy disks, hard disks, CD/DVD/Blue Ray/tape drives and removable cartridges generally available through industry-standard catalogs and other sources. Cartridges may not extend beyond opposing bezel walls, with the exception of handle pulls, which must fold out of the way and must be flush and not external, so as to avoid interfering with the sliding fit of other modules. This embodiment shall be considered open source in regard to cartridges to include memory storage devices such as floppy drives, hard drives, CD-ROMs, DVD drives, tape drives, USB devices, fire wire, PCMCIA devices, and attendant previously patented standardized socketed enclosures utilized in industry. Alternate patented and/or made competitive products utilize non-standard cartridges on which they base much of their patents, in regard to industry standard components. Unlike other patents the module is in this regard open source. (Ref. U.S. Pat. Nos. 4,937, 659, 6,469,901).

14. Standard industry practice utilizes cutouts, flush bezels in case panels and rails for mounting devices in bays. The invention utilizes covered and protected and/or recessed bezels with or without mounting plates and PC boards attached to the chassis, to embrace custom and/or standard industry catalog or special order devices with available published or unpublished mounting patterns to maintain a sliding fit in relation to the form factors referenced herein. (Ref. U.S. Pat. No. 4,937,659).

15. The invention's chassis when unpopulated or provided mountings do not cross multiple cage side-walls, may be made to layout flat for work, when the top and bottom pins are disconnected in one corner. The chassis is a three, four, five, six, or eight sided wire form assembled from square or rectangular hinged wire frames with configurable break-off tangs limiting inward folding to 120°, 90°, 72°, 60° or 45°, respectively and may act as the system bus-bar ground. Configuration and adaptation of card cages and rails for mounting industry-standard, (including current or future industry requests for comment RFCs to final specifications) or proprietary motherboards and PC boards (including current or future industry requests for comment, "RFCs" to final specifications) shall be considered open source and obvious regarding the mechanical interfaces of same. In this regard, the type 1 enclosure was designed to handle ATX style PC boards, while the type 2 enclosure was designed to handle one or more smaller PC boards, either peripherally, that is radially disposed including by each wall, stacked, and/or any combination thereof. Nor other patent has this arrangement, allowing the potential for easy chassis extraction for work with or without an enclosure, pending final component selection. Other patents, which utilize connector/receptacles as the chassis, under this system, although a connector receptacle may be grounded to the chassis, it is not considered part of the chassis itself. (Ref. US patents 4937659).

The following is the original text of Ser. No. 12/806,206:

The simplest and most central concept of the invention is to provide a scalable modular interconnect system based on internal intra-module nesting and abutting inter-module connectivity utilizing redundant equal length propagation pathways for both data and separately shorter signal look-ahead path ways from 2D and 3D molecular level to the enclosure level based on the interconnection propagation path ways dictated by the vertex and face based symmetry of the approximated tilings/tessellations of hexagonal and 12 sided prisms with stacking in columns, rows and arrays which may be arranged as modules or nested modules with adjusted aggregated technology dependent signaling time delays to include equilateral triangles to bridge multiple modules as pipelines for binomial expansion processing and optionally as enclosures with sliding fit, thermal management, positioning, and other support systems, optionally seated on dollied pallets with ramped slide out industrial shelving.

DRAWINGS

The following is incorporated by reference from Ser. No. 12/806,211:

1. Bottom Release Enclosure: Full Assembly
   A. Top View, Six Sided Asteroid
   B. Symmetrical Handle: Top View
   C. Side View: Sight top to left of sheet.
   D. Optional Triangular Variant less handle with symbolic top view of planar mono- and multi-planar black/populated and white/non-populated (thermal chimney) symmetrical array.
   E. Symbolic Build-Out from Single Equilateral Triangle Structure to Hexagon, Square and Fractal Larger Equilateral Triangle with Implicit Nesting and Array.
   F. Example Triangle (and other shapes, including a set of hexagons) Used To Complete a Square (with black/populated and white/non-populated {thermal chimney} symmetrical array).
   G. Square Approximated Tesselation/Tiling Tile (with symbolic top view of planar mono- and multi-planar black/populated and white/non-populated {thermal chimney} symmetrical array).
   H. Symbolic Build-Out Using Square or Octagon Approximations as Representative Tile/Tesselations (with symbolic top view of planar mono- and multi-planar black/populated and white/non-populated {thermal chimney} symmetrical array).
   I. Octagonal Module: Top View 2. Bottom Release Enclosure: Connector Bay Top Cover End Cap
   A. Top View
      1. Stress relief feed through, grommet, hermetic seal, etc. for wire/cable/pipe;
      2. Cooling Tube Hose Assembly ¼ Turn Twist Lock or other standard or special order seal pending usage;
      3. Stanchion Guide Hole; and
      4. Stanchion Stress Relief
   B. Side View
   C. Standard Blank Bezel: Top View;
   D. Standard Blank Bezel: Front View;
   E. Standard Blank Bezel: Side View;
   F. Bezel with knockouts, cut outs and/or plugs; Top View;
   G. Bezel with knockouts, cut outs and/or plugs; Front View; and
   H. Bezel with knockouts, cut outs and/or plugs: Side View.

3. Bottom Release Enclosure: Cable Gripper™ (or functional equivalent) Assembly
   A. Assembly
      5. Clevis Pin Assembly or equivalent functioning hardware, example: strap eye end
      6. Cable
      7. Bottom End Cap Wall
      8. Vibration Absorbing Washer, Neoprene or equivalent
      17. Actuator Plate Cable Gripper™ (or functional equivalent) Guide
      9. Cable Gripper™ (or functional equivalent)
      10. Neoprene or equivalent vibration absorbing washer
      11. Bottom Plenum Wall
      12. Guide Tube
      13. Top Plenum Wall
      14. Eye 4. Bottom Release Enclosure: Bottom Cable Gripper Actuator Assembly Actuator Plate
   A. Actuator Plate
      16. Actuator Plate Cable Gripper™ (or functional equivalent) Landing 17. Actuator Plate Cable Gripper™ (or functional equivalent) Guide
B. Bottom Actuator Assembly
   18. Actuator Rod
   19. Cotter Pin
   20. Small Spring Collar
   21. Spring
   22. Large Spring Collar
   23. Actuator Plate
   24. Nut
   25. Lock Washer
   26. Washer
   7. Bottom Plenum Wall
   27. Actuator Tube
   11. Top Plenum—Bottom Wall Handle
5. Bottom Release Enclosure: Coolant Intake Plenum
A. Top View
   3. Stanchion Guide Hole;
   29. Fan Mount Screw Holes;
B. Plenum Cooling Tube Orifice Interface from Plenum Side
   30. Stanchion Tab;
   31. Stanchion Seat;
   32. Orifice
C. Side View
D. Fan Mount, Side View
E. Fan Mount Top View
F. Fan Mount, Alternate Side View
6. Bottom Release Enclosure: Coolant Intake Plenum with Actuator Plate Installed
A. Top View;
B. Orifice View;
C. Side View;
7. Bottom Release Enclosure: Bezel Stanchion Assembly
A. Stanchion/Tube Bezel Assembly: Top View;
   12. Guide Tube: Top View;
   33. Bezel;
B. Bezel: Top View;
   34. Bezel: Concave Seating Edge;
C. Bezel: Front View, Shown Blank with/with out mounting plate backing and with/without chassis ground pending material selection and purpose;
   35. Bezel: Convex Seating Edge;
D. Bezel: Side View;
E. Bezel: Bottom View;
F. Cooling Tube: Top View;
G. Cooling Tube Segment: Side View (less coolant ports)
   30. Stanchion Tab;
   31. Stanchion Seat;
8. Bottom Release Enclosure: Bezel Assembly With/Without Mounting Plate and Chassis Ground
A. Top View
   12. Cable Guide Tube, Top and Side Views
B. Side View
   36. Bezel Array
C. Bezel Backing Plate, Front View
   45. Standoff
D. Bezel Backing Plate, Side View
E. PC Board, Front View
F. PC Board, Side View
   44. Retaining Screw
9. Bottom Release Enclosure: Cage Assembly
A. Six Segment Chassis Assembly: Top View
B. Chassis Cage: Single Side: Top View
   37. Inward Travel Limiting Tang (60 degree shown)
C. Chassis Cage: Single Side: Front View
   38. Pivot Pin
   39. Pivot Pin Receiver and Washer
   40. Band Strap (tabbed/screwed/bolted)
D. Cross Brace: Side View
   41. Cross Brace: Side View: Installed
   42. Channel
   43. Bolt/screw hold-down holes
   44. Bolt
E. Cross Brace: Top View
F. PC Board Tray/Mounting or Backing Plate
   44. Bolt
   45. Standoff/Washer
G. Side View
H. Single Segment Cross Enclosure Chassis Cage
I. Three Segment Triangle Enclosure Chassis Cage
J. Four Segment Rectangle Enclosure Chassis Cage
K. Six Segment Rectangle Enclosure Chassis Cage
10. Bottom Release Enclosure: Exhaust Plenum
A. Top View
   3. Stanchion Guide Hole;
   29. Fan Mount Screw Holes;
B. Plenum Cooling Tube Orifice Interface from Plenum Side
   30. Stanchion Tab;
   31. Stanchion Seat;
   32. Orifice;
C. Side View: Intake/Exhaust Plenum less Stanchion/Tube
D. Fan Mount, Side View
E. Fan Mount Top View
F. Fan Mount, Alternate Side View
11. Bottom Release Enclosure: Connector Bay Cover End Cap
A. Top View:
   1. Stress relief feed through, grommet, hermetic seal, etc. for wire/cable/pipe;
   2. Cooling Tube Hose Assembly ¼ Turn Twist Lock or other standard or special order seal pending usage;
   46. Conformal Bolt-Head Seat;
   47. Recess
   3. Stanchion Guide Hole
B. Side View
C. Standard Blank Bezel: Top View;
D. Standard Blank Bezel: Front View
E. Standard Blank Bezel: Side View;
F. Connector Bay Bezels With/With Out Knock Outs/Plugs: Top View;
G. Connector Bay Bezels With/With Out Knock Outs/Plugs: Front View;
H. Connector Bay Bezels With/With Out Knock Outs/Plugs: Side View
12. Bottom Release Enclosure: Stanchion Assembly.
A. Assembly
   48. Crimped-On Rod End;
   49. "C" Washer Seat;
   50. Metal Rod;
   51. Crimped-On Threaded Rod End;
   52. Washer;
   53. Nut;
13. Double Ended Bus Bar Hot Swap Wiring
A. Single Unit, Single Power Source (PS), Single Path
B. Twin Unit, Single PS, Dual Path
C. Triple Unit, Single PS, Triple Path
D. Single Unit, Single PS, Dual Path
E. Twin Unit, Dual PS, Dual Path w/Alternating Bypass
F. Triple Unit, Triple PS, Triple Path with Three Way Bypass 14. Bottom Release Enclosure: Collapsible Cooling Tube Assembly Components
  A. Collapsible Cooling Tube
    54. Female ¼ Turn Twist Lock Tubular Collar Seal;
    55. Male ¼ Turn Twist Lock Tubular Collar Seal;
    56. Threaded Tubular Hose Collar Seal;
    57. Spring Loaded Collapsible Hose.
  B. Cooling Tube Petcock
  C. Cooling Tube Elbow
15. Top Release Enclosure: Full Assembly, Top View;
  A. Symmetrical Handle: Top View; Side View: (Sight top top left of sheet);
  B. Handle
  C. Full Assembly, Side View
16. Top Release Enclosure: Connector Bay Top Cover with Single Fan Center Knockouts and Three-Way Armature Central Actuator Support.
  A. Top View;
    1. Stress relief feed through, grommet, hermetic seal, etc. for wire/cable/pipe;
    2. Cooling Tube Hose Assembly ¼ Turn Twist Lock or other standard or special order seal pending usage.
  B. Side View;
  C. Standard Blank Bezel: Top View;
  D. Standard Blank Bezel: Front View;
  E. Standard Blank Bezel: Side View;
  F. Bezel with knockouts, cut outs and/or plugs; Top View;
  G. Bezel with knockouts, cut outs and/or plugs:
  H. Front View; Bezel with knockouts, cut outs and/or plugs: Side View;
  I. Corner Gusseted Screen Fan Guard With Center Grommet For Single Fan, Side View
  J. Top and Bottom View
  K. Screen Fan Guard—Fan—Screen Fan Guard Sandwich
17. Top Release Enclosure: Coolant Intake Plenum
  A. Top View;
    3. Stanchion Guide Hole;
    29. Fan Mount Screw Holes;
  B. Plenum Cooling Tube Orifice Interface from Plenum Side;
    31. Stanchion Landing;
    30. Stanchion Tab;
    32. Orifice
  C. Side View.
  D. Fan Mount, Side View
  E. Fan Mount Top View
  F. Fan Mount, Alternate Side View
18. Top Release Enclosure: Non-Bezeled, Molded Main Cavity
  A. Top View;
    12. Guide Tube: Top View and Side View;
  B. Side View
  C. Bezel Backing Plate, Front View
    45. Standoff
  D. Bezel Backing Plate, Side View
  E. PC Board, Front View
  F. PC Board, Side View
    44. Retaining Screw
19. Top Release Enclosure: Cage Assembly
  A. Six Segment Chassis Assembly: Top View
  B. Chassis Cage: Single Side: Top View.
    37. Inward Travel Limiting Tang (60 degree shown)
  C. Chassis Cage: Single Side: Front View
    38. Pivot Pin
    39. Pivot Pin Receiver and Washer
    40. Band Strap (tabbed/screwed/bolted)
  D. Cross Brace: Side View
    41. Cross Brace: Side View: Installed
    42. Channel
    43. Bolt/screw hold-down holes
    44. Bolt
  E. Cross Brace: Top View
  F. PC Board Tray/Mounting or Backing Plate
    44. Bolt
    45. Standoff/Washer
  G. Side View
  H. Single Segment Cross Enclosure Chassis Cage
  I. Three Segment Triangle Enclosure Chassis Cage
  J. Four Segment Rectangle Enclosure Chassis Cage
  K. Six Segment Rectangle Enclosure Chassis Cage
20. Top Release Enclosure: Exhaust Plenum
  A. Top View
    3. Stanchion Guide Hole;
    29. Fan Mount Screw Holes;
  B. Plenum Cooling Tube Orifice Interface from Plenum Side
    31. Stanchion Seat;
    32. Orifice;
    30. Stanchion Tab;
    9. Cable Gripper™ (or functional equivalent).
  C. Side View:
  D. Fan Mount, Side View
  E. Fan Mount Top View
  F. Fan Mount, Alternate Side View
21. Top Release Enclosure: Cable Assembly
  A. Assembly
    5. Clevis Pin Assembly or equivalent functioning hardware, example: strap eye end;
    6. Cable;
    11. Bottom Plenum Wall
    12. Guide Tube
    13. Top Plenum Wall
    8. Neoprene or equivalent vibration absorbing washer
    17. Actuator Plate Cable Gripper™ (or functional equivalent) Guide
    9. Cable Gripper™ (or functional equivalent)
    10. Neoprene or equivalent vibration absorbing washer
    61. Top End Cap Wall
    14. Eye
22. Top Release Enclosure: Connector Bay End Cap Single Fan Center Knockouts and Three-Way Armature Central Actuator Support.
  A. Top View:
    1. Stress relief feed through, grommet, hermetic seal, etc. for wire/cable/pipe;
    2. Cooling Tube Hose Assembly ¼ Turn Twist Lock or other standard or special order seal pending usage;
  B. Side View
  C. Standard Blank Bezel: Top View;
  D. Standard Blank Bezel: Front View
  E. Standard Blank Bezel: Side View;
  F. Connector Bay Bezels With/With Out Knock Outs/Plugs: Top View;
  G. Connector Bay Bezels With/With Out Knock Outs/Plugs: Front View;
  H. Connector Bay Bezels With/With Out Knock Outs/Plugs: Side View
  I. Corner Gusseted Screen Fan Guard With Center Grommet For Single Fan, Side View
  J. Top and Bottom View
  K. Screen Fan Guard—Fan—Screen Fan Guard Sandwich Top Release Enclosure:

23. Actuator Assembly
   A. Actuator Plate: Top View
   B. Actuator Plate: Side View
   C. Actuator Assembly: Side View
      56. Short Actuator Rod
      19. Cotter Pin
      23. Actuator Plate
      24. Nut
      57. Short Actuator Tube
      24. Nut
      61. Top End Cap Wall
      24. Nut
      27. Handle
24. Bottom Release Enclosure: Stanchion Assembly.
   A. Assembly
      48. Crimped-On Rod End;
      49. "C" Washer Seat;
      50. Metal Rod;
      51. Crimped-On Threaded Rod End;
      52. Washer;
      53. Nut;
25. Top And Bottom Release Enclosure: Cooling Tube Sleeves;
   A. Module Top View with Cooling Tube Assembly;
   B. Cooling Tube Orifice; Side View;
   C. Slit Solid Cooling Tube Sleeve Outlet/Inlet;
   D. Optional Cooling Tube Downward Facing Intake Louver Grid;
   E. Optional Cooling Tube Upward Facing Exhaust Louver Grid;
   F. Louvered Cooling Tube Sleeve Outlet/Inlet;
   G. Cooling Tube Sleeve Orifice Interface
26. Top Release Enclosure: Collapsible Cooling Tube and Standoff.
   A. Collapsible Cooling Tube
      54. Female ¼ Turn Twist Lock Tubular Collar Seal;
      55. Male ¼ Turn Twist Lock Tubular Collar Seal;
      56. Threaded Tubular Hose Collar Seal;
      57. Spring Loaded Collapsible Hose.
   B. Cooling Tube Petcock
   C. Cooling Tube Elbow
27. Top or Bottom End Cap Cable Hanger Assembly: For Top or Bottom Release Enclosures;
   A. Hanger Assembly: Perspective View
      58. Outer Collar
      59. Pin
      60. Clevis
      61. Tubular Bearing Surface
      62. Cotter Pin
      63. Optional Load Bearing Gusset
      64. Plenum Intake/Exhaust Hull
      65. Inner Collar
      66. Hexagon Socket Set Screw With Flat Point
      67. Cable
      68. Cable Termination Hook
28. Scalable Single Base: For Top or Bottom Release Enclosure
   A. Base: Connector Bay and Wiring/Coolant Master Plenum Sub-Assembly: Top View
      69. End Cap Cable Hanger Assembly
   B. Base: Connector Bay: Side View: Internal Perspective View
   C. Base: Connector Bay: Internal Perspective View
   D. Base: Wiring/Coolant Master Plenum Feed Through,
      29. Tabs Up
      31. Orifice
      30. Seats Down
   E. Base: Wiring/Coolant Master Plenum Feed Through,
      30. Tabs Down,
      31. Orifice
      29. Seats Up
   F. Base: Connector Bay and Wiring/Coolant Master Plenum Sub-Assembly: Side View
   G. Base: Connector Bay and Wiring/Coolant Master Plenum Sleeve: Side View
   H. Base: Connector Bay and Wiring/Coolant Master Plenum Twist-Lock Assembly and Landings: Side View
   I. Base: Connector Bay and Wiring/Coolant Master Plenum Bulk Head With Feed Thrus: Side View
   J. Base: Connector Bay and Wiring/Coolant Master Plenum Sub-Assembly: Side View
   K. Full Assembly: Side View
   29. Exhaust Plenum Canisters for Cable Gripper™ (or functional equivalent)
      A. Threaded Petcock Design.
         70. Wrench Sealing Purchase
         71. Cable Feed Through;
         72. Twist Lock Collar;
      B. Internally Threaded Cap Design
         70. Wrench Sealing Purchase
         71. Cable Feed Through;
         72. Twist Lock Collar;
30. Exhaust Plenum Actuator Assembly.
   A. Actuator Plate and Handle: Top View
      73. Exhaust Plenum Actuator Plate;
      74. Cable Gripper™ (or functional equivalent) Canister Twist Lock Receiver;
   B. Actuator Plate: Side View.
      73. Exhaust Plenum Actuator Plate;
   C. Exhaust Plenum Cable Gripper™ (or functional equivalent) Canister with Petcock;
      9. Cable Gripper™ (or functional equivalent).
      72. Twist Lock Collar
   D. Exhaust Plenum Cable Gripper™ (or functional equivalent)™ Canister with Cap;
      9. Cable Gripper™ (or functional equivalent)
      72. Twist Lock Collar
   E. Assembly
      75. Actuator Rod.
      19. Cotter Pin.
      22. Large Spring Collar.
      21. Spring.
      20. Small Spring Collar.
      76. End Cap Wall Handle Lock Seating Divot.
      77. Handle Lock Male Divot.
      28. Handle.
31. Scalable Single Exhaust Plenum Cap, Wiring/Cable/Plumbing (Coolant, Gravity Feed, pumped, etc.) Connector Bay and Cable Hanger Assembly: For Top or Bottom Release Enclosure
   A. Cap: Wiring/Coolant Master Plenum Sub-Assembly: Top View
   B. Cap: Wiring/Coolant Master Plenum Bulk Head With Feed Throughs Installed: Internal Perspective Side View
   C. Cap: Connector Bay with Cable Gripper™ (or functional equivalent) and Actuator Installed: Side View
   D. Cap: Wiring/Coolant Master Plenum Feed Through, Tabs Up, Seats Down
   E. Cap: Wiring/Coolant Master Plenum Feed Through,
      29. Tabs Down,
      31. Orifice
      30. Seats Up F. Cap: Connector Bay: Top View
G. Cap: Connector Bay Floor Wall With Wiring/Cooling Feed Throughs, Internal Perspective Side View;
H. Cap: Connector Bay and Wiring/Coolant Master Plenum Twist-Lock Assembly and Landings: Internal Perspective Side View
I. Cap: Connector Bay and Wiring/Coolant Master Plenum Twist-Lock Assembly and Landings: Side View
J. Cap: Full Connector Bay and Wiring/Coolant Master Plenum Assembly: Side View
32. Module Hanger.
A. Front View.
  78. Tab Break Points.
B. Side View.
C. Front View with All Tabs Broken.
33. Double Ended Hook
A. Single Side Protrusions, Front View.
  79. Protrusion.
B. Single Side Protrusions, Side View.
C. Alternating Side Protrusions, Front View.
D. Alternating Side Protrusions, Side View.
E. 90 Degree Twist, Front View.
F. 90 Degree Twist, Side View.
G. Double Hook with Swivel, Front View
H. Double Hook with Swivel, Side View
34. Track Systems
A. Track and Roller
B. Rack and Internally Wound Cog Motor
35. Module with Installed Module Hanger Hanging from Roller On Sliding Track.
A. Sliding Track and Roller
B. Module Hanger
C. Module
D. Assembly
36. Single Module Framed Track Suspension System
A. Track and Roller
  80. Fastener Hole(s)
B. Module Suspended in Frame by Hanger and Track and Roller System
  81. Single Module Frame
  82. Fastener, blind (rivet/bolt etc.)
37. Six (6). Modules Symmetrically Interconnected by Module Hangers Suspended In A Frame By Individual Module Hangers with a Central Module Insert.
A. Assembly
38. Nesting Modules
A. Module with Module Hanger
B. Six Modules Interconnected by Module Hangers
C. Module without Module Hanger
D. Six Modules in A Symmetrical Array Without Hangers
E. 12 Modules in A Symmetrical Array With Hangers
F. 18 Modules in A Symmetrical Array With Hangers
39. Interlocking Sextet Module Arrays
A. Module Hanger with Track and Roller
B. Module
C. Six Modules in A Symmetrical Array With Hangers
D. "Snow Flake" Array with Hangers
40. Single/Multi-Module Horizontal or Vertical Hydraulic Lift System
A. Hydraulic Lift System
  83. Guide Rails
  84. Floor Mount and Support Collar
  85. Hydraulic Lift Cylinder
  86. Master Plenum(s) Support Pedestal
  87. Plunger
  88. Controller
  89. Hydraulic Fluid Tank, Pump and Valves
  90. Multi-Module Frame
  91. Rack with Gear Driven Stepping Motor
  92. Fastener
B. Single Module Cog Rail System
C. Multiple Module Cog Rail System
41. Top End Cap Cover
A. Top End Cap Cover, Top View
B. Top End Cap Cover, Side View
C. Top End Cap Cover Sleeve, Bottom View
D. Top End Cap Cover Sleeve, Side View
E. Top End Cap Cover Assembly
F. Top End Cap Which Sleeve Slips Inside
42. Top End Cap Cover Upholstery
A. Top End Cap Cover, Top View
B. Top End Cap Cover, Side View
C. Top End Cap Cover Sleeve, Top View
  93. Recessed Upholstery Retaining Screw Hole
  94. Screw
D. Top End Cap Cover Sleeve, Side View
E. Top End Cap Cover, Side View
F. Upholstery
  95. Elasticized Material
  96. Grommet
  97. Material Mounting Tab
  98. Padding
43. Module Protective Side Cover with Integral Clip
A. Top View
B. End View
C. Side View
44. Module Protective Side Cover with Integral Clip Install Positioning
A. End View
B. Top View
C. Side View
D. Module End View
E. Module Side View
45. Three Module Cat Walk Bridge/Wall
A. End-View
B. Side View
C. Front View
D. Unit Installed in a 12 Module Chamber/Corridor.
46. Five Module Cat Walk Bridge/Wall
A. Top View
B. End View
C. Side View
D. Unit Installed in an 18 Module Chamber/Corridor.
47. General Inter-module Array Geometries Symbolically Represented
A. General Hexagonal Array
B. Vertical Array With/Without Hollow Inner Channel.
C. Horizontal Array With/Without Hollow Inner Channel.
D. Ferris Wheel Carousel Whereby Modules Lie Horizontally.
E. Hanging Vertical Carousel whereby Modules Are Suspended Vertically From Central Support, Top View
  99. Central Support
F. Torus Array As May Be Used In Space Craft Or Other Facilities.
G. Top View: Vertical Work Area Enclosure
  100. Floor
  101. Vertical Access Hatch
H. Side View: Vertical Work Area Enclosure
I. Single Module Population Option for F/G and J/K J. Multi-Module Population Option for F/G and J/K
K. Top View: Horizontal Work Area Enclosure
  102. Floor
  103. Vertical Access Hatch
L. Side View: Vertical Work Area Enclosure
48. Table of Cooling Options.
A. Air
B. Gas
C. Fluid/Air Heat Xchg.
D. Fluid/Gas heat Xchg.

The following is the original text of Ser. No. 12/806,206:

FIG. 49 illustrates the bottom release enclosure full assembly, optional support structure geometries and plan layouts.

FIG. 49A is an illustration of the top view of the six sided hexagonal/asteroid enclosure.

FIG. 49B is an illustration of the symmetric handle, top view.

FIG. 49C is an illustration of the enclosure side view, sight top to left of sheet.

FIG. 49D is an illustration of the optional triangle variant less handle, top view.

FIG. 49E is an illustration of the symbolic build-out from a single equilateral triangle structure to hexagon, square and fractal larger equilateral triangle with implicit nesting and array, top view.

FIG. 49F is an illustration of the example triangle used to complete a square peripherally or otherwise, top view.

FIG. 49G is an illustration of the square approximating tesselation/tiling tile, top view.

FIG. 49H is an illustration of the symbolic build out using square or orthogonal approximations as representative tiling/tesselations approximated with a symbolic array representation, top view.

FIG. 49I is an illustration of the octagonal variation of FIG. 49H, top view.

FIG. 50 illustrates the palletization top release enclosure.

FIG. 50A is an illustration of the full assembly, top view.

FIG. 50B is an illustration of the symmetrical handle, top view.

FIG. 50C is an illustration of the front view, sight top is left of sheet.

FIG. 51 illustrates the palletization enclosure base and exhaust plenum matrix array subset layout pattern.

FIG. 51A is an illustration of the top view of palletization enclosure base and exhaust plenum matrix array subset layout pattern.

FIG. 51B is an illustration of the top view of inter-modular surface finish and sculpting.

FIG. 52 illustrates the palletization scalable single male base/intake plenum for all top or bottom release enclosures.

FIG. 52A is an illustration of the base connector bay, top view.

FIG. 52B is an illustration of the base connector bay, internal perspective view.

FIG. 52C is an illustration of the base connector bay, side view.

FIG. 52D is an illustration of the base wiring/coolant master plenum sub-assembly:—top view.

FIG. 52E is an illustration of the base: wiring/coolant connector bay master assembly wiring basket, side view.

FIG. 52F is an illustration of the base: wiring/coolant master plenum hose assembly quarter turn locking mechanism and seats panel sub-assembly internal perspective.

FIG. 52G is an illustration of the base: wiring/coolant master plenum feed through sub-assembly internal perspective view.

FIG. 52H is an illustration of the base: connector bay and wiring/coolant master plenum sub-assembly, side view.

FIG. 52I is an illustration of the base: full assembly, side view.

FIG. 53 illustrates the palletization scalable single exhaust plenum cap, wiring/cable/plumbing (coolant, gravity Feed, pumped, etc.) connector bay and cable hanger assembly; for top or bottom release enclosure (symmetrical @ 120 degrees).

FIG. 53A is an illustration of the cap: wiring/coolant master plenum sub-assembly top view.

FIG. 53B is an illustration of the cap: wiring/coolant master plenum sub-assembly internal perspective side view.

FIG. 53C is an illustration of the cap: wiring/coolant master plenum sub-assembly side view.

FIG. 53D is an illustration of the cap: connector bay cover bottom view.

FIG. 53E is an illustration of the cap: connector bay cover wiring basket feed through panel, internal perspective view.

FIG. 53F is an illustration of the Cap: cap: connector bay cover hose assembly quarter turn locks and seat, side view.

FIG. 53G is an illustration of the cap: connector bay cover sub-assembly, side view.

FIG. 53H is an illustration of the cap: connector bay cover and wiring/coolant master plenum full assembly, side view.

FIG. 54 illustrates the palletization base and cap cable hanger assembly scalable single base for top or bottom release enclosure, connector bay.

FIG. 54A is an illustration of the hanger assembly.

FIG. 55 illustrates the palletization enclosure base unit 2D matrix array stacking.

FIG. 55A is an illustration of the stacking sequence, base plus modules.

FIG. 55B is an illustration of the single stack.

FIG. 55C is an illustration of the stack array.

FIG. 56 illustrates the palletized single plane radial and symmetrical inter-modular matrices, symbolic representation.

FIG. 56A is an illustration of the module centric single plane inter-module array, symbolic representation.

FIG. 56B is an illustration of the single plane symmetrical inter-module matrix, symbolic representation.

FIG. 56C is an illustration of the asterisk shape (O)overlaid on a 3×3 module array, symbolic representation.

FIG. 56D is an illustration of the single leg variable length spark resistant ball and slotted socket electrical connector.

FIG. 57 illustrates the palletization master air intake plenum.

FIG. 57A is an illustration of the block diagram top view.

FIG. 57B is an illustration of the block diagram bottom view

FIG. 57C is an illustration of the side view.

FIG. 57D is an illustration of the top view.

FIG. 57E is an illustration of the master air intake plenum with parting lines, side view.

FIG. 58A is an illustration of the top view.

FIG. 58B is an illustration of the bottom view.

FIG. 58C is an illustration of the side view.

FIG. 58D is an illustration of the front view.

FIG. 58E is an illustration of the master air intake plenum with parting lines.

FIG. 59 illustrates the palletized stackable warehouse pallet with master intake and exhaust plenums installed FIG. 59A is an illustration of the blank pallet with pallet rack corner mount shown, side mount obvious, perspective view.

FIG. 59B is an illustration of (bottom) master intake and (top) master exhaust plenums, perspective view.

FIG. 59C is an illustration of the palletized master plenums installed, perspective view.

FIG. 60 illustrates the palletized and dollied "sliding drawer" master cooling array assembly.

FIG. 61 illustrates the palletization master cooling assembly population.

FIG. 61A is an illustration of the module base stacked order, front view.

FIG. 61B is an illustration of the single stack assembly, front view.

FIG. 61C is an illustration of the stack array, front view.

FIG. 61D is an illustration of the palletized and dollied master cooling assembly being populated with module, perspective view.

FIG. 62 illustrates the palletized dolly shelf bed and supports, slotted cable guide and conduit whip.

FIG. 62A is an illustration of the shelf bed.

FIG. 62B is an illustration of the castellated cross brace with cable guide, top view.

FIG. 62C is an illustration of the slotted support beams.

FIG. 62D is an illustration of the central longitudinally slotted cable guide, shelf base assembly, top view.

FIG. 62E is an illustration of the block diagram of the 180 degree arc cable conduit whip.

FIG. 62F is an illustration of the block diagram of the industrial warehouse mezzanine shelving, block diagram, front view.

FIG. 63 illustrates the Palletized scalable computer/router farm utilizing standard-industrial warehouse shelving with mezzanine option above single floor installations for pre-existent warehouse space build out and new construction steel building with integrated industrial walls and roofing.

FIG. 63A is an illustration of the modular stack (top and bottom arrows represent data connections, (cables/wires/ethernet/fiber optic/etc.), front view.

FIG. 63B is an illustration of the dollied stack racked pallet(s) with installed intake (bottom)/exhaust (top) coolant/wiring/stack suspension master plenums, perspective view.

FIG. 63C is an illustration of the symbolic standard industrial warehouse shelving for population by dollied and palletized modules, block diagram, front view.

FIG. 64 illustrates the palletized shelf level drawbridge assembly.

FIG. 64A is an illustration of the drawbridge.

FIG. 64B is an illustration of the drawbridge hinge.

FIG. 64C is an illustration of the drawbridge symmetrical pivot rod (side and end views).

FIG. 64D is an illustration of the shelving top view (symbolic)

FIG. 64E is an illustration of the shelving front view (symbolic).

FIG. 65 is Table 1: Symbolic Block Diagram Cooling Systems (Air/Gas/Fluid).

DETAILED DESCRIPTION OF THE INVENTION

Figure 13:
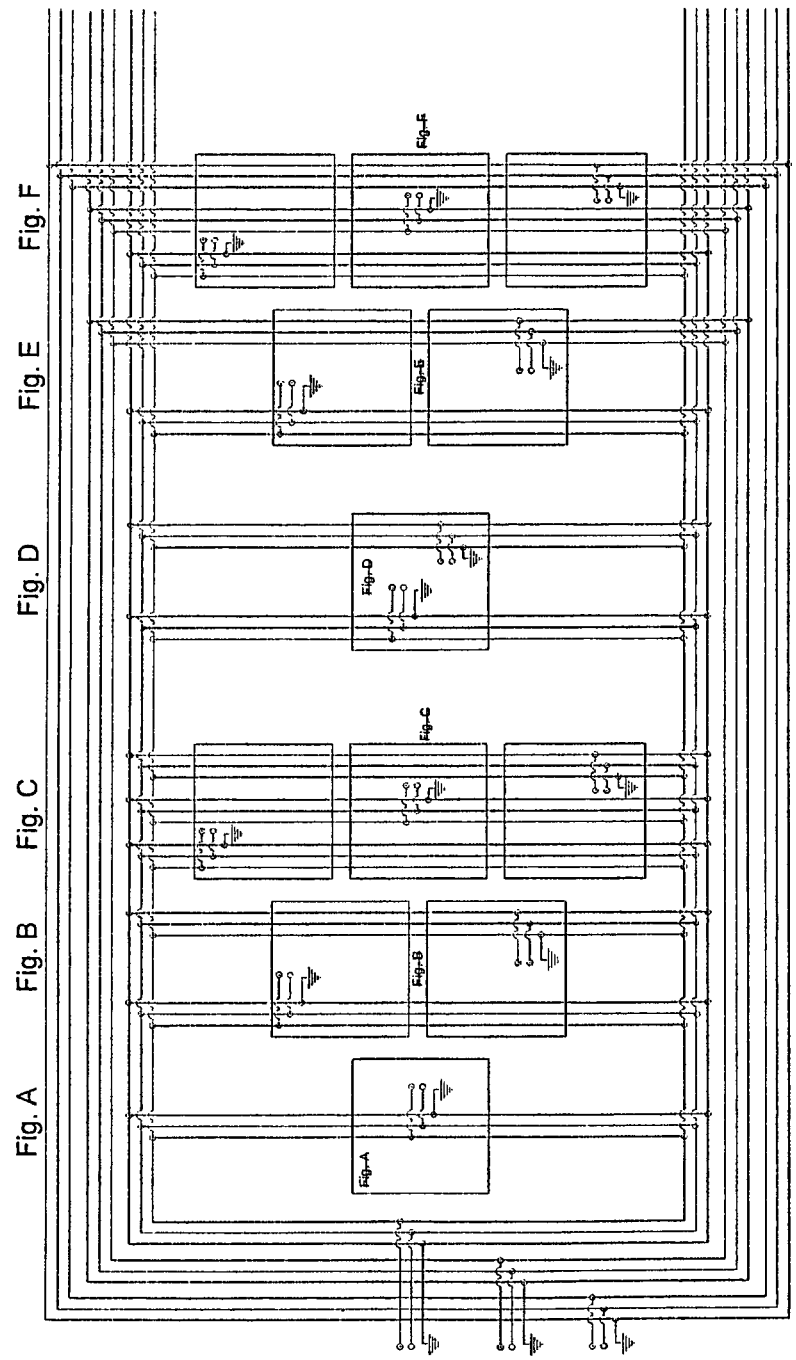
Figure 18:
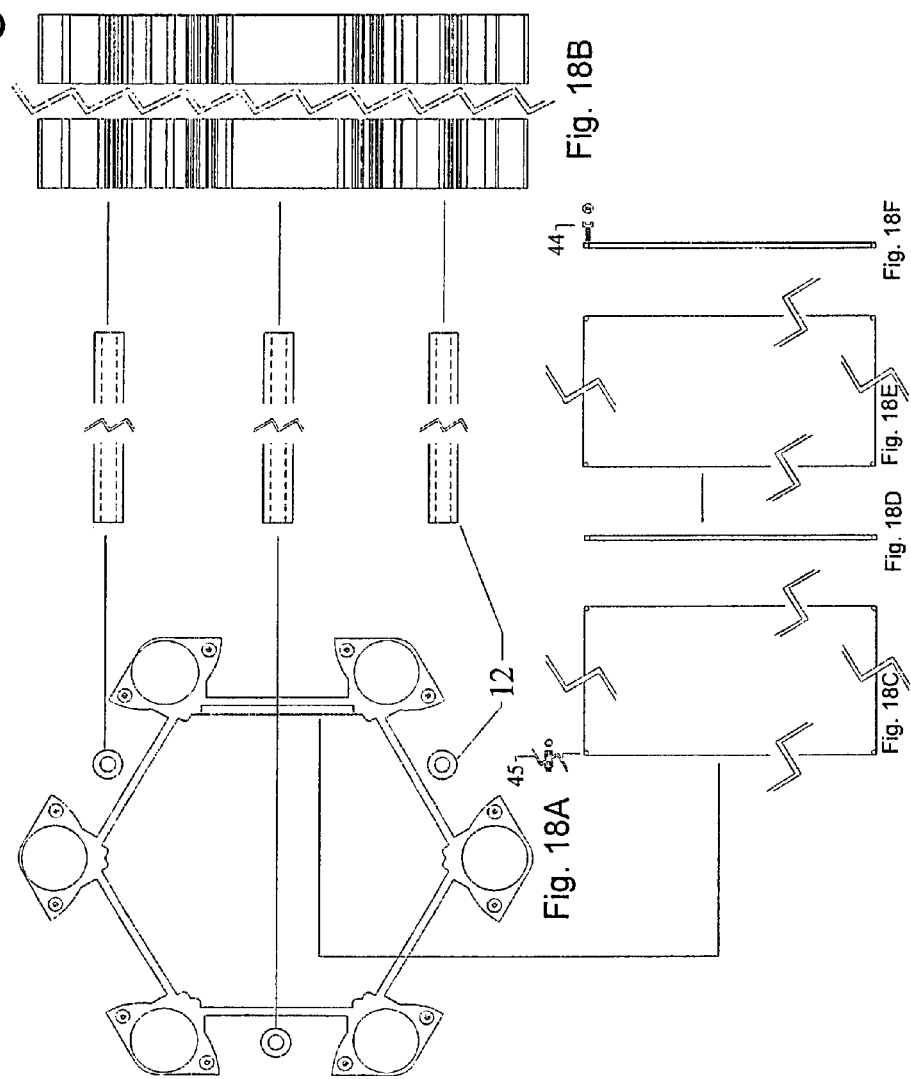
Figure 19:
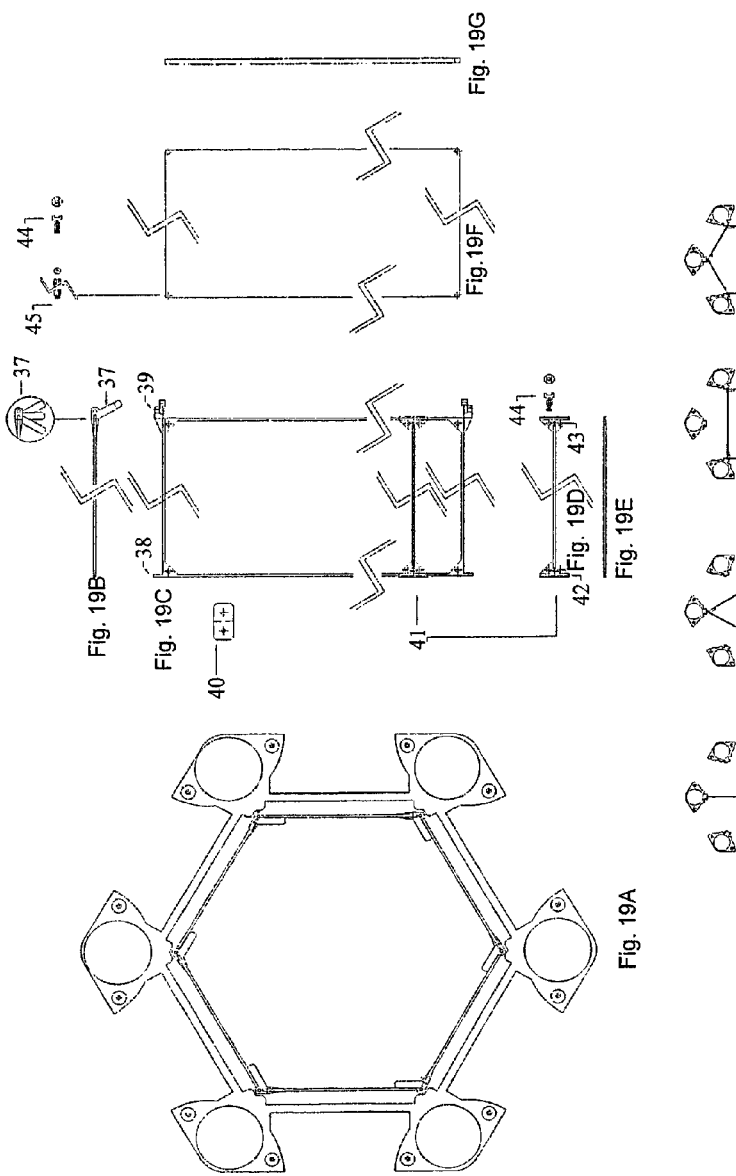
Figures 21, 21A:
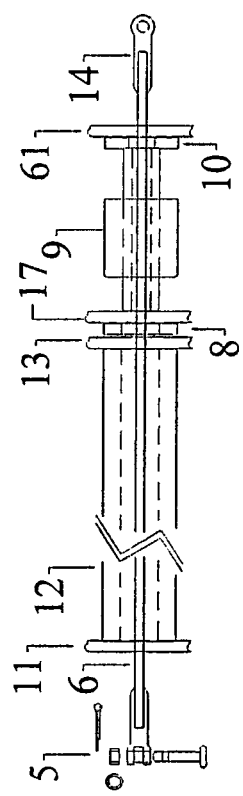
Figure 30:
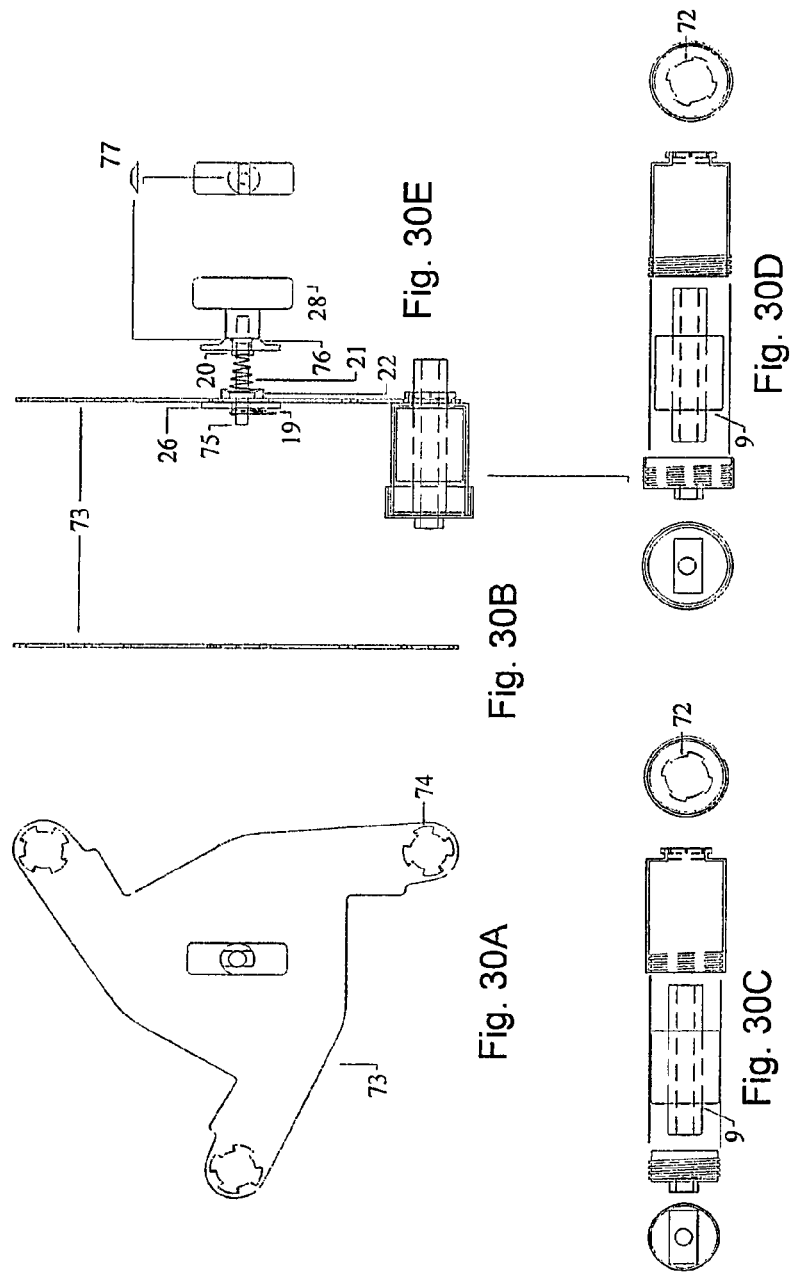
Figure 31:
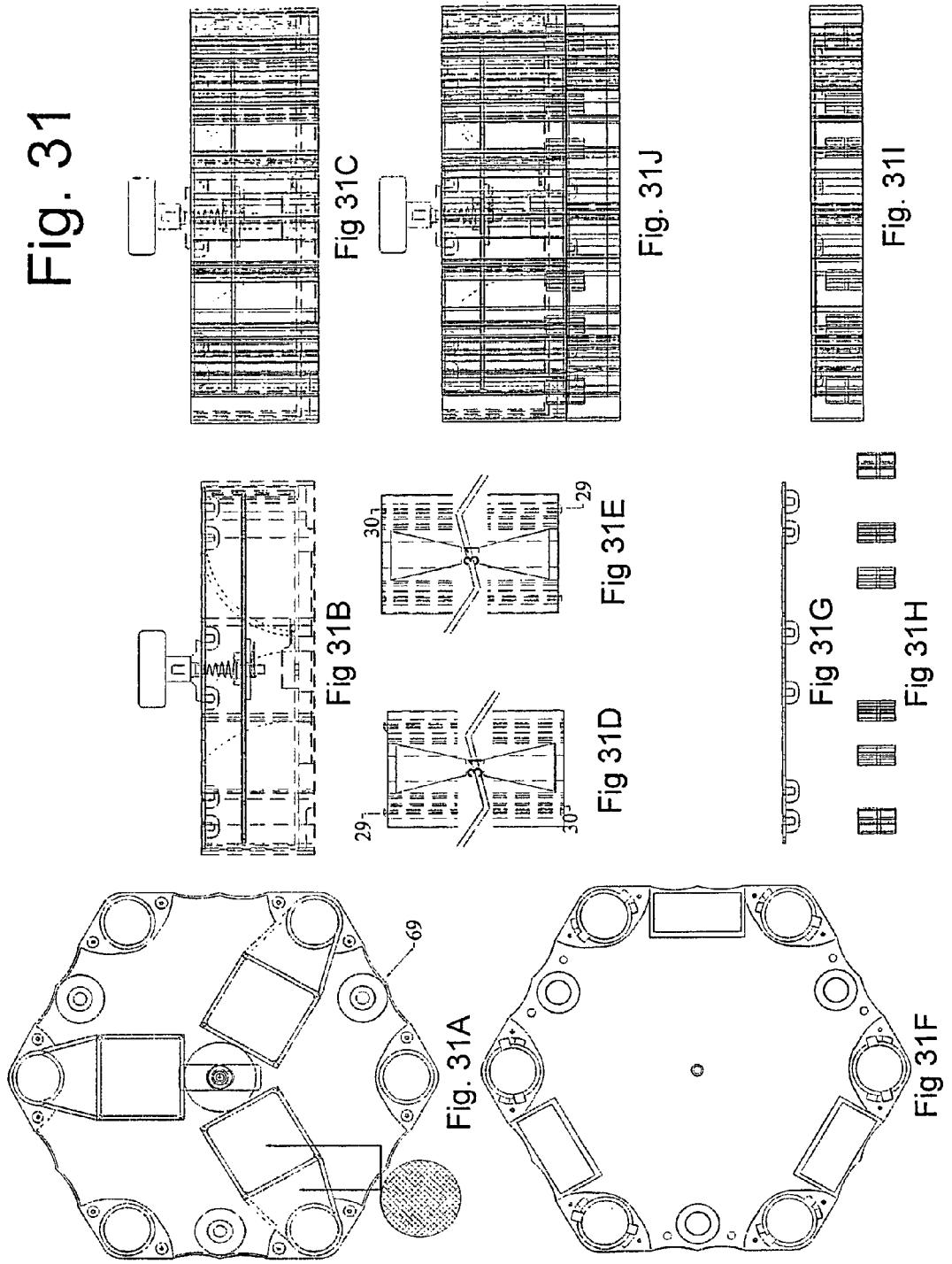
Figures 37, 37A:
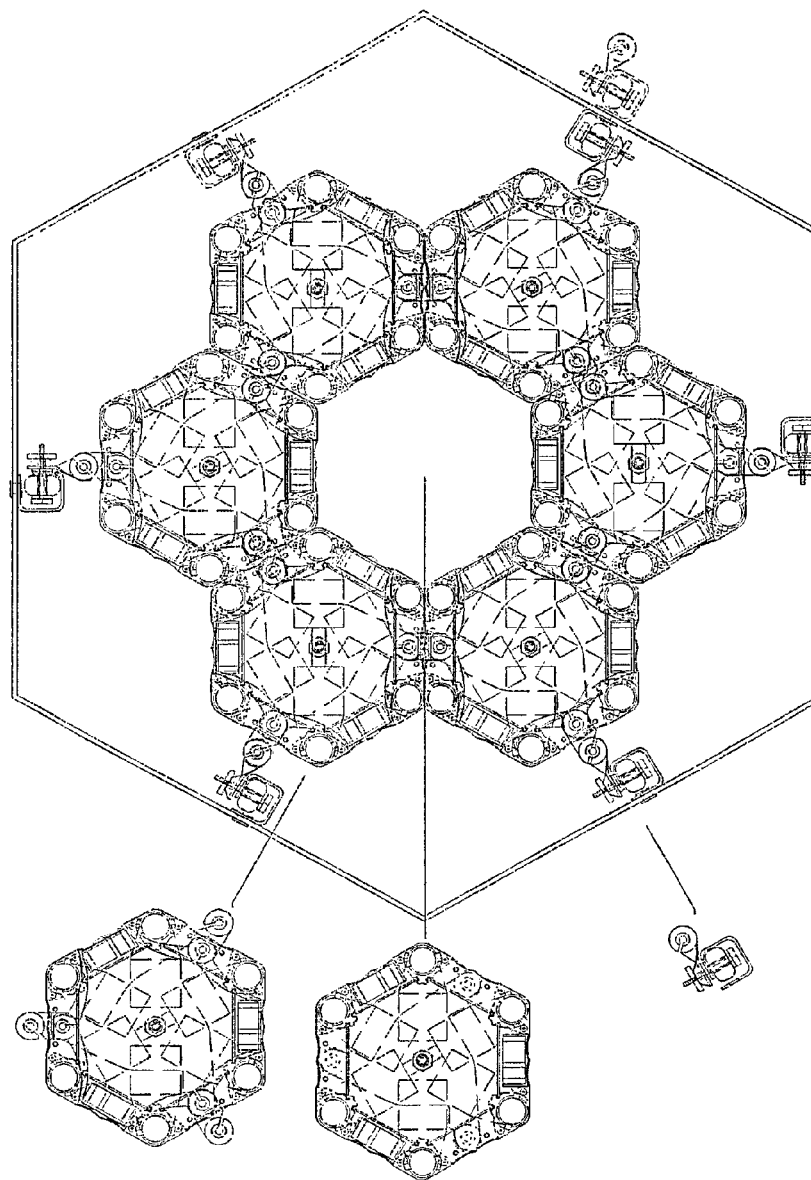

The following is incorporated by reference from Ser. No. 12/806,211:

The patent employs a unique geometry, utilizing four standard configurations (Type 1: FIG. 1, Type 2: FIG. 15 Type 3: Same as Type 2 with actuator from FIG. 30 as installed in FIG. 31B and will otherwise be considered as minor variant of Type 2 hereinafter) with attendant support accessories. A nominal fourth type supplies variants for each of types 1 through 3 by utilizing a large central orifice, as shown in FIG. 16, in the top and bottom end caps with appropriately sized fan mountings and optional fans for axial cooling, thus obviating the conventional plenums used in the standard type 1 through 3 modules, All enclosure types include provisions for optional cable assemblies and Cable Gripper™ (or functional equivalent(s)) (Type 1: FIG. 3, Type 2: FIG. 21) for vertical/horizontal positioning in their respective multi-module stacks. All types employ a handle connected to a plunger mounted in a plunger guide tube with associated bulkhead mounting hardware (Type 1: FIG. 4, Type 2: FIG. 23). On the business end of the plunger is a Cable Gripper™ (or functional equivalent) actuator plate with sloped self-centering seats for the Cable Gripper™ (or functional equivalent) (Type 1: FIG. 4 FIG. A, Type 2: FIG. 23 FIG. A). Return/centering springs for the plunger as necessary and plate retension nuts and/or a cotter pin keep the plate on the plunger. The two configurations are referred to hereinafter as types as follows:

Type 1 (FIG. 1), Top handle, bottom of enclosure actuated Cable Gripper™ (or functional equivalent) assembly, with a central actuator rod through the main enclosure assembly and Cable Gripper™ or functional equivalent seated peripherally, centered tangentially between every other astroidal curve in the lower plenum, and threaded with cables terminated at either end with clevises and matching clevis pins or other equivalent catalog quick disconnect hardware (FIG. 4). Cable guide tubes (FIG. 8 part 12) run the length FIG. 8B width of part 36. of the bezeled (Type 1: FIG. 8A part 12) and/or non-bezeled enclosure, FIG. 18B width of part 36, main cavity outer hull (FIG. 18A part 12) nesting between the normally bottom intake plenum (FIG. 5) and normally top exhaust plenum (Type 1: FIG. 10). The guide tubes accommodate the width of this quick disconnect hardware their full length, without snagging. Cable Gripper™ (or functional equivalent) in this type are placed in the bottom plenum. The Type 1 design is for PC boards and other assemblies smaller than the ATX form factor, although scaling is possible.

Figure 20:
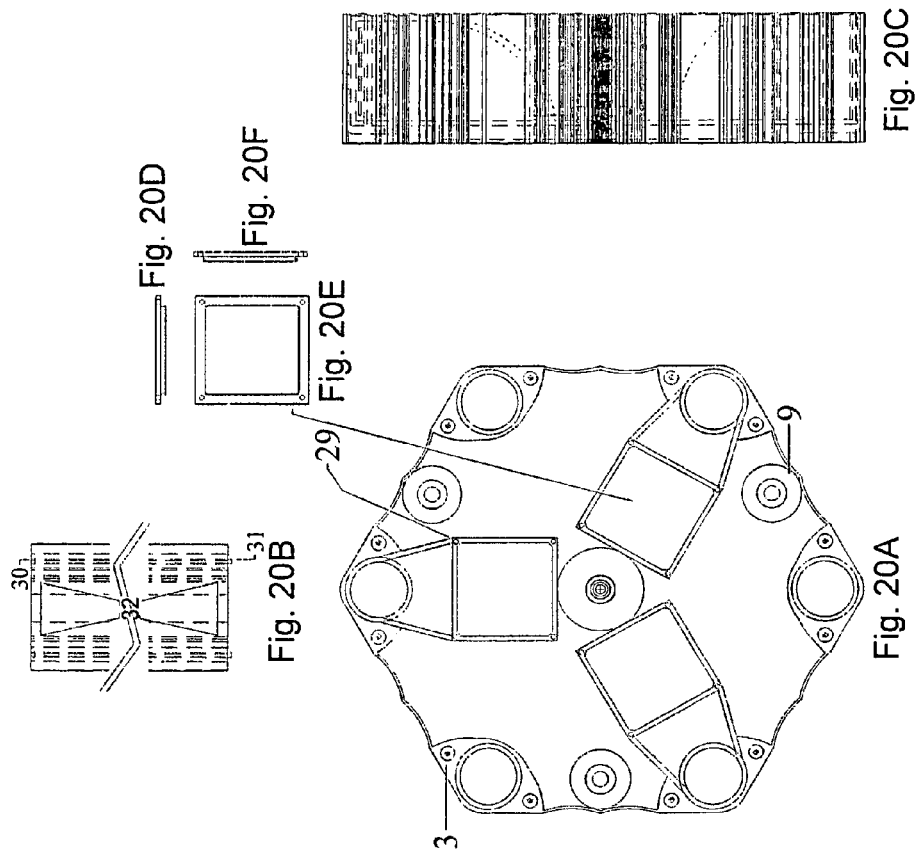
Figure 25:
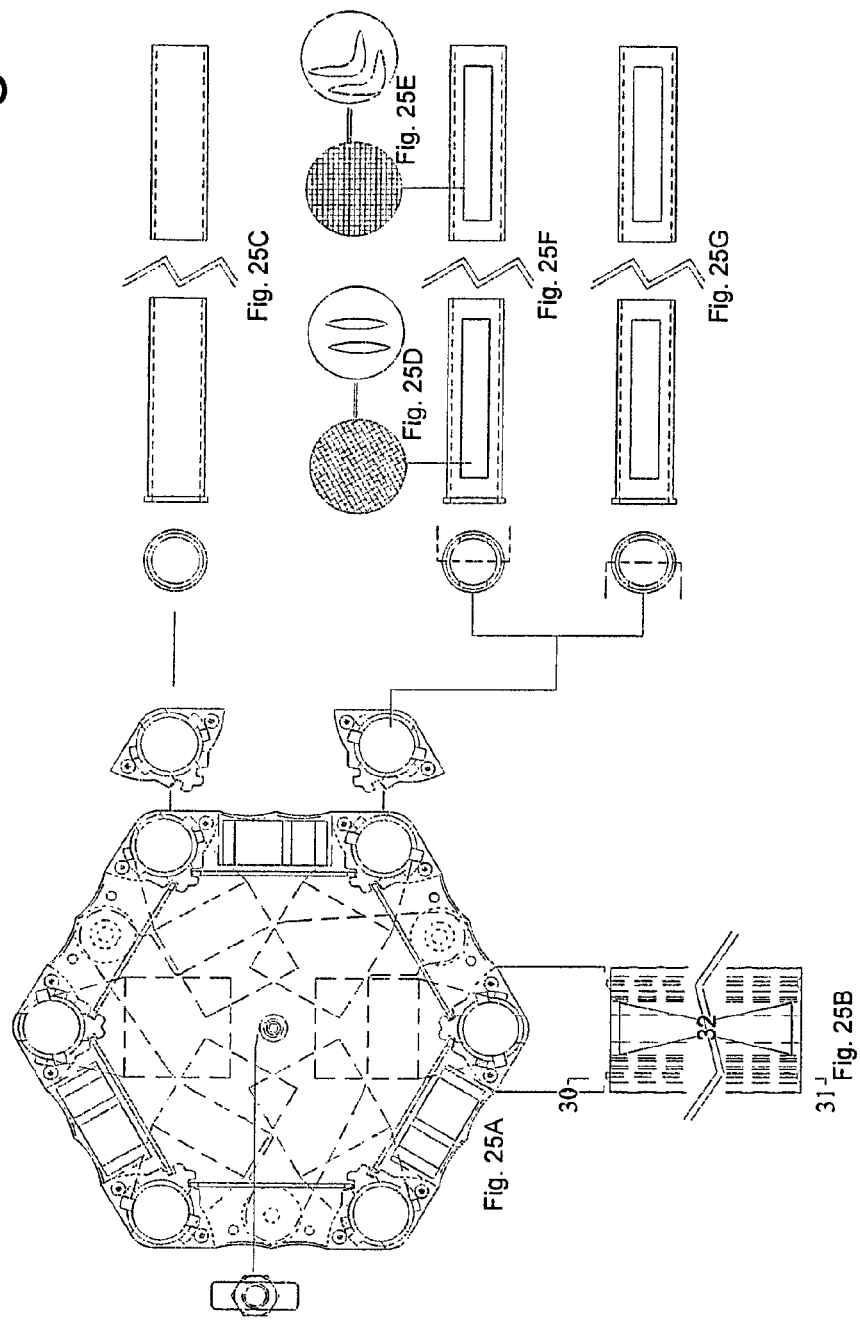
Figure 26:
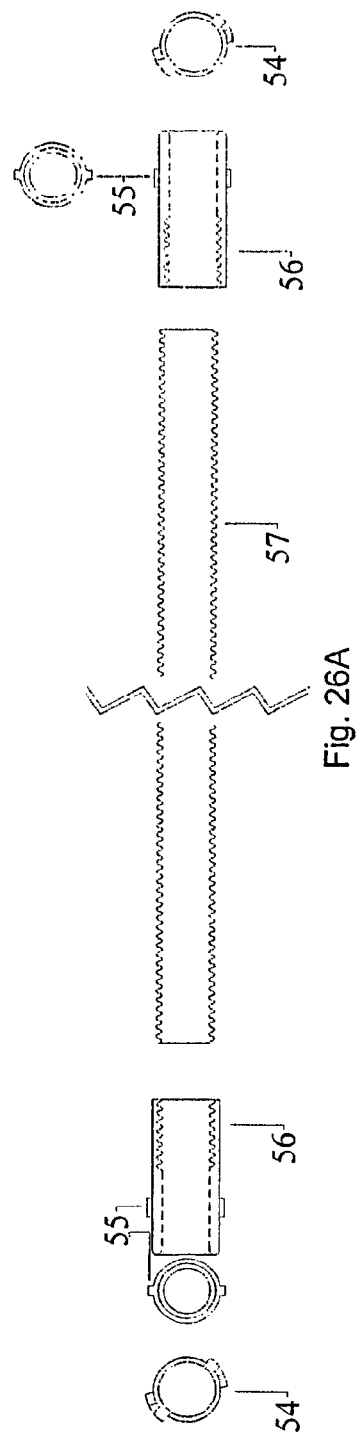
Figure 27:
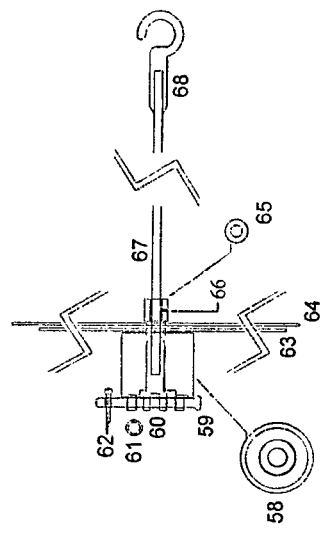

Type 2 (FIG. 15), Top handle, top of enclosure actuated (FIG. 15C) Cable Gripper™ (or functional equivalent) assembly (FIG. 21) with central actuator assembly (FIG. 23 FIG. C) seated in the top end cap, extending into the main chamber where the plunger actuator plate resides. Material choices include reinforced wire, fiberglass, carbon composite, etc. for strength and wide screen mesh as necessary for airflow. The Cable Gripper™ (or functional equivalent) are seated peripherally, in the exhaust plenum to the right of each duct at 120 degrees (example of hexagonal, one configuration) one to the other, centered almost tangentially to the nearest outer wall between the cooling tube housings seated behind each chamfered astroidal apex of the outer hull in the upper plenum (FIG. 20) and threaded with cables terminated at either end with clevises and matching clevis pins or equivalent quick disconnect hardware (FIG. 21). Three cable guide tubes (FIG. 25) (hexagonal example) run the length of the non-bezeled enclosure central cavity (FIG. 18A part 12 for the width of FIG. 18B) between the bottom intake plenum (FIG. 17) and top exhaust plenum (FIG. 20) up to the actuator plate on the bottom side and down to the top Cable Gripper™ (or functional equivalent) seats. These tubes accommodate the width of this quick disconnect hardware for their full length without snagging. This design is for ATX PC boards or larger assemblies, requiring a larger open cavity, however, again the design is scalable. All types, top, bottom and main cavity cable gripper assemblies include an actuator plate, plunger, and handle assembly with optional twist handle lock and release, tensioning springs, cable guide tubes.

The invention is an apparatus and method designed non-exclusively for usage from single enclosure/module to molecular scale and scalable to massively parallel router, server, super computer/server/router/process control and/or machine farms for optimizing: efficient positioning, connection, repair, replacement, space utilization, thermal management, propagation path length and timing for signaling and data transfer. In the following description numerous details are put forth to more thoroughly describe the invention. It is apparent, however to one skilled in the art, that the invention may be practiced without these specific details. In other instances, well known features have not been described in detail so as to not obscure the invention.

FIG. 49 Illustrates the bottom release enclosure full assembly, optional support structure geometries and plan layouts incorporated by reference through the section entitled CROSS-REFERENCE TO RELATED APPLICATION.

The invention provides near universal standardized form factors for macroscopic packaging by employing approximated tessellations/tilings.

Module scale, layout and nesting are dictated by components including optional retractable interconnects with or without quick disconnects, bezels, patch panels, backing and mounting plates and pc boards with external side wall wire and cable guides and end cap interconnection baskets and covers. These features, conjunct (sub-) module hull to (sub-) module hull sliding fit and combined with suspension cabling, cable grippers and support hardware and guides make the system.

The invention provides integration/migration from a single module to massively parallel router, server, supercomputer or other technology based machine/process and super-computing/server/router farms. This is accomplished by enhancing command, data, and/or process and/or sensor communication by minimizing and standardizing path lengths for these functions within and without (sub-) module to (sub-) module vertice to vertice, flat to flat and end cap to end cap overall lengths and inter-module sliding-fit interconnect lengths. Examples in this environment include module and nested module active and passive hydraulic, fluidic, electrical, optical, nanotech and quantum components and their associated mechanical, electrical, optical, wave or particle propagation lengths, impedances and capacitances with associated circuitry, which dictate absolute circuit speeds. Fiber optics has similar limits, which may be boiled down to media propagation speed.

Separately, hoses and other materials process-supply mechanisms will be similarly limited by speeds, feed rates and flow rates. The same is true for all analog or digital data transfer, and their DAC, ADC, transducers and their support circuitry.

For human touch and FCC compliance, the module hull, end basket cover, and handle are internally and/or externally coated or infused with EM and/or RF conductive and/or insulative material or shielding, with or without reinforcing frequency dependent mesh(-es) as necessary or for Tempest and anti-EMP applications. This is also done where wave-guides are formed by sliding-fit inter-module hull interfaces. Frequency appropriate absorptive and/or anti-reflective coatings are used beyond the delineated edges of open wave-guide and/or optical light guides with coatings for the operative radiation being used as part of the external hull.

The following is the original text of Ser. No. 12/806,206:
FIG. 49A is an illustration of the top view of the six sided hexagonal/asteroid enclosure.

FIG. 49B is an illustration of the symmetric handle, top view.

FIG. 49C is an illustration of the type 2 enclosure/module side view, sight top to left of sheet, incorporated by reference through section "CROSS-REFERENCE TO RELATED APPLICATION".

FIG. 49D is an illustration of the optional triangle variant less handle, top view.

FIG. 49E is an illustration of the symbolic build-out from a single equilateral triangle structure to hexagon, square and fractal larger equilateral triangle with implicit nesting and array, top view.

FIG. 49F is an illustration of the example triangle used to complete a square peripherally or otherwise, top view.

FIG. 49G is an illustration of the square approximating tesselation/tiling tile, top view.

FIG. 49H is an illustration of the symbolic build out using square or orthogonal approximations as representative tiling/tesselations approximated with a symbolic array representation, top view.

FIG. 49I is an illustration of the octagonal variation of FIG. 49H, top view.

FIG. 50 illustrates the palletization top release enclosure incorporated by reference through section CROSS-REFERENCE TO RELATED APPLICATION FIG. 51 illustrates the palletization enclosure base and exhaust plenum matrix array subset layout pattern.

FIG. 51A is an illustration of the top view of palletization enclosure base and exhaust plenum matrix array subset layout pattern where two conjoining multiple modules (part 610), with an unpopulated intake plenum (part 620) and un-populated exhaust plenum (part 630).

FIG. 51B part 660 shows inter-modular interface surface finish and sculpting. Two such surfaces in inter-modular contact as shown, make wire guides as listed in the drawings' figure descriptions.

FIG. 51B parts 640 and 650 show single/multi-cavity inter-modular surfaces making up a guide, with a central cavity, when matched to an abutting module with landings and sliding EMI/RFI 0-gasketry while end caps complete such cavities with appropriate access mounts and gasketry, pending technology employed, as shown symbolically in parts 680, 690 and 700 on each horizontal face or mix and match is possible.

Inter-module interface sides must be recessed the width of the full cavity enclosures plus the tolerance for a sliding fit. This recess with or without keys and keyways must have landings and stops for guide 21 retention. Bottom stops must have matching top/stops on abutting modules.

Combo Units are allowed and are shown symbolically as parts 710, 720 and 730 with outward faces 640, 650, 660 and 670.

Parts 640, 650, 660, 670, 680, 690, 700, 710, 720 and 730 are made out of solid metal and/or plastics and/or composites or combinations thereof with/without absorptive/coating, reflective coating overlay and/or gasketry. Gasketry includes Mu-metal, EMI field conductive material (copper, iron, carbon, silver, gold, nickel, beryllium copper, impregnated gel/silicone, o-rings, mesh, or other materials, etc. Outlying or abutting areas and/or the remainder of adjoining internal or external areas are coated with applicable radiation/energy absorbing materials as necessary, obviating the necessity of a full seal in some instances, while allowing looser tolerances in a sliding fit without cross-talk or other interference from nearby or neighboring guides. Actual geometry may vary pending frequency, energy, collimation, polarization and/or propagation mode(s) and includes standard and/or special-order catalog and/or by design items. Cables used in such embodiments must not be conductive or have unacceptable parasitic resonance characteristics for the energy spectrum and/or radiation characteristics to be used.

FIG. 52 illustrates the palletization scalable single male base/intake plenum for all top or bottom release enclosures upon which a module/enclosure may be seated. The area between the outside of the three (3) individual intake ducts, where the ducts' curve as they slope down toward the fan intakes is the area for pass through wiring, cabling, plumbing, and other standard and common non-thermal management connections, etc. Seals may be upgraded to be hermetic, explosion-proof and/or degassed pending usage.

FIG. 52A is an illustration of the base connector bay, top view.

FIG. 52B is an illustration of the base connector bay, internal perspective view.

FIG. 52C is an illustration of the base connector bay, side view.

FIG. 52D is an illustration of the base wiring/coolant master plenum subassembly, top view.

FIG. 52E is an illustration of the base: wiring/coolant connector bay master assembly wiring basket, side view.

FIG. 52F is an illustration of the base wiring/coolant master plenum hose assembly quarter turn locking mechanism and seats panel sub-assembly internal perspective.

FIG. 52G is an illustration of the base: wiring/coolant master plenum feed through sub-assembly internal perspective view.

FIG. 52H is an illustration of the base: connector bay and wiring/coolant master plenum sub-assembly, side view.

FIG. 52I is an illustration of the base: full assembly, side view.

FIG. 53 illustrates the palletization scalable single exhaust plenum cap/wiring basket cover for wiring/cable/plumbing (coolant, gravity Feed, pumped, etc.) connector bay and cable hanger assembly; for top or bottom release enclosure (symmetrical @ 120 degrees).

The area abutting the outside of the plenum's three (3) individual intake ducts, where the ducts' curve as they slope down toward the fan intakes is the area for pass-through wiring, cabling, plumbing, and other non-thermal management connections, etc.

Seals may be upgraded to be hermetic, explosion-proof and/or degassed pending usage.

Dwg 54 is an illustration of the module hanger assembly, incorporated by reference through section "CROSS-REFERENCE TO RELATED APPLICATION" as used in top and bottom master exhaust and intake plenums with cable assemblies for stack alignment in palletized module arrays.

The assembly parts in order are:
758. Outer collar;
759. Pin;
761. Clevis;
760. Tubular bearing surface;
762 Cotter Pin;
763. Optional heavy load gusset;
764. Plenum intake/exhaust hull;
765. Inner collar;
766. Hexagon socket set screw with flat point;
767. Cable; and
768. Cable termination hook.

FIG. 55 illustrates the palletization enclosure base unit 2D matrix array stacking.

FIG. 55A shows the alignment of a base unit, and two modules.

FIG. 55B shows two modules stacked on a base.

FIG. 55C shows single stack assemblies further aggregated into a row array.

FIG. 56 illustrates the palletized single plane radial and symmetrical inter-modular matrices, symbolic representation.

The approximated hexagon shape is assumed herein as follows by way of example. Processors may pipeline, stream and/or be cluster-centric or combinations thereof regarding communication channels as represented at the pallet level and/or any other multi-module "center of mass".

Accordingly, single modules (for non-polling systems) and three module sets (for polling systems) on center lines corresponding to the six (6) directions of the x-y-z planes and their corresponding diagonals and/or the hexagonal functional equivalent, six (6) directions per horizontal plane (truncated) apex (6) and/or side centered diagonals (6) derive said "center of mass" for a possible total of 12. Separately each vertical cross-section, again by apex (6) or flat side wall (6) allows for eight (8) directions and the associated wiring, cabling, etc. interconnects, axially (top-bottom), side to side (left right), diagonally (top left, bottom right) and last diagonally (bottom left, top right). The concept is also incorporated by reference to the other submitted patent for those shapes delineated elsewhere which include the standard regular or irregular tessellation/tilings as approximated with or without the dumbbell modifications. An irregular tessellation/tiling is defined herein as an assymetrical tessellation/tiling as when the wiring at the edges of a column, row or array or attendant patch panels or other external or internal intra-module level interstitial support structure is not symmetrical by connection or by geometry.

Both FIGS. 56A and 56B utilize the following legend:
Heavy line: Used for router/computer or other connection.
Light line: Used for router/computer or other connection.
Dashed line: Used for router/computer or other connection.
Fill: Not used or used for cooling machinery or other support equipment.

Lines exist to show inter- and intra-module directions of unilateral and bidirectional signal flow(s) in general terms.

FIG. 56A shows the symbolic visual interrelations of a single module-centric view in a single plane to other modules in an inter-module array with possible triangular slip-fit internal module nesting. This may be utilized for centralized array master-slave command and control.

FIG. 56B shows the symbolic visual inter-module relations without the central module command and control view, however with possible nesting. However, the interconnectivity embodied herein, incorporated by reference in the section CROSS REFERENCE TO RELATED APPLICATION and incorporated in that patent, as the concept is extended to multiple planes.

FIG. 56C is an illustration of the asterisk shape overlaid on a 3×3 module array, symbolic representation.

FIG. 56C Six pointed Star Overlaid on a 3×3 Array. Symbolically demonstrates module vertical cut cross-section data, process, control and/or other information transport or combination thereof either vertically, horizontally or diagonally across each symmetrical module, set of modules or other geometric shape or shapes with or without single or multiple central unit bypass for rerouting, multi- or parallel processing or failover. This symbolic side view when read in relation to a top center view as shown in FIG. 56A shows symbolically, without recounting sides allows six sides each for horizontal and vertical planes, not including the central unit Symbolically these views also represent cross-sections of multi-layer substrates when so extended as symbolic representations of duplex, multi-duplex parallel (bypass) and single directional busses, regular and irregular triangular, square, hexagonal, octagonal shapes with or without the dumbbell variant as claimed. This is further extended to the atomic basis as put forth here by using lead wire or other conductive material three or more atoms thick with amperage rating to 10 amps. Wiring as put forth herein extends to the interconnection of conductive paths between layers of substrate and attendant masked material deposits or subtractions in chips and/or boards envisioning the fundamental wiring layout of the modules as put forth in drawings 56A-C for layout between layers of said constructs. This includes Futjitsu's use of composite carbon nanotube-graphene conductive molecularly bonded arrays. All wiring as put forth herein and in patents incorporated by reference shall be inclusive and include chip socketing as a symbolically represented in all drawings on a molecular and nanoscale and chip level.

Further, wiring as put forth in FIG. 56 is extended to the atomic level by utilizing drawings 56A-C symbolically in conjunct with constructs of wires utilizing lead or other high conductivity atoms three or more or more atoms thick.

In all cases, the bypass feature, as posited in drawings 56A-C allows for mono-planar and multi-planar re-configurable variable length push pull bus shortest path with optical and other direct memory link processing between the processors in single and multi-planar arrays. The key is moving between the linearly displaced first and third modules, chips or atomic circuits as delineated above.

FIG. 56D is an illustration of the single leg variable length spark resistant ball and slotted socket electrical connector.

The parts of this assembly are:
800 Slotted ball socket cover,
803 Self tapping screw seat
805 Ball socket cover;
810 Ball socket seat;
813 Self tapping screw seat;
815 Ball socket seat;
817 Self tapping screw;
822 Allen head socket;
824 Ball neck;
826 Threaded cap (spark resistant bronze, etc.);
830 Cartridge (spark resistant: bronze, etc.);
832 Cotter pin;
834 Shoulder washer (spark resistant: bronze, etc.);
836 Open end cartridge thread;
840 Plunger (spark resistant: bronze, etc.);
842 Spring retention hole;
844 Carbon impregnated material or coating;
846 Cable receiver;
850 Cable optional: spark resistant;
impregnated carbon or other similar material;
860 Contracting spring.

FIG. 56D is a single cable self adjusting variable length connector with anti-spark explosion proof option. These units are mounted on the external side wall recesses between vertically abutting (intra-planar) and diagonally adjacent inter-planar adjacent modules to allow motion and communication. Multiple units are required to complete circuit, +, − and ground. All other forms of interconnect are allowed as illustrated elsewhere in this document. The author holds that parts 800-846 as listed above are self-explanatory in function, however for simplicity, parts 800-826 describe a ball and socket mechanism. Part 830 acts as a cartridge based retention system for the contracting spring part 860 and plunger parts 840-846. Two such units are connected by a cable part 850. The total assembly creates a variable length conductive path. The path is made spark resistant by the strategic use of bronze and carbon impregnated components or equivalent for spark resistance.

FIG. 57 illustrates the palletization master air intake plenum.

FIG. 57 shows a Master Intake Palletized Plenum Array designed to work with various heat transfer mechanisms as indicated and as referenced in the section CROSS-REFERENCE TO RELATED PATENT and utilized with but not limited to, FIG. 65A-D: Table 1, to feed coolant through such bases, which comprise its assembly, or through direct connection to module central cavities as required. Seals are provided for said plenums and vertical suspension alignment hooks, three per module, are utilized for alignment tethers for inter-module cable assemblies. This allows for module, replacement with possible hot-swap pending internal and external component selection and external rewiring, FIG. 57A is an illustration of the, block diagram top view.

FIG. 57B is an illustration of the, block diagram bottom view

The part shown is a
910 Suspension alignment hook.

FIG. 57C is an illustration of the side view.

Parts shown include:
900 Air intake hole knock outs and
910 Suspension alignment hook.

FIG. 57D is an illustration of the top

Part shown is a 900. Air Intake Hole Knock Outs.

FIG. 57E is an illustration of the master air intake plenum with parting lines, side view.

Part shown is a 920. O-ring material seal.

Figure 58:
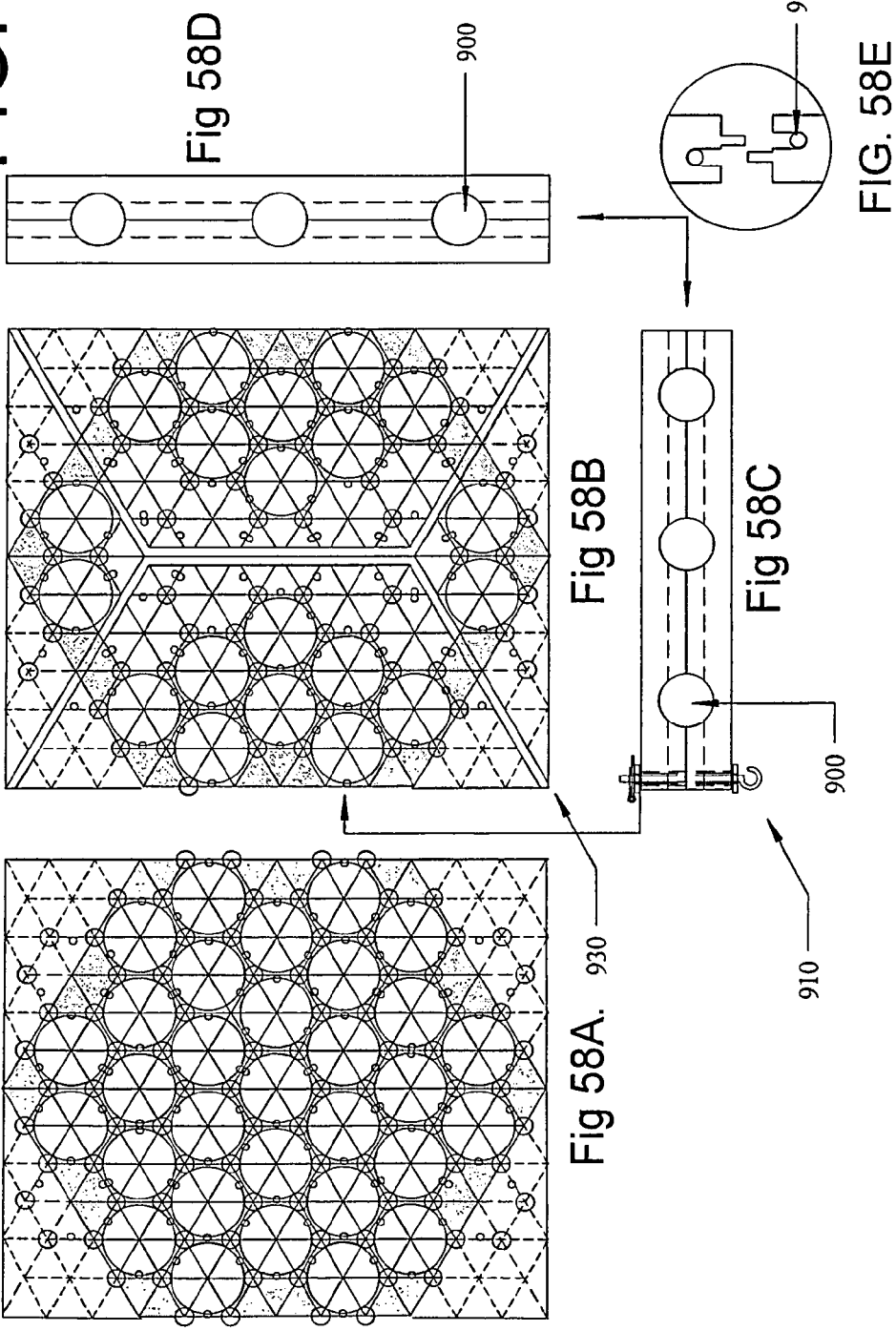
FIG. 58 illustrates the palletization master pallet air exhaust plenum.

FIG. 58 shows the master air exhaust plenum, upper termination hooks, three per module, in alignment with one-to-one correspondence with the suspension alignment hooks of the master air intake plenum with the same sealing system of FIG. 57.

FIG. 58A is an illustration of the top view.

FIG. 58B is an illustration of the bottom view.

The parts shown is a
910 Suspension alignment hook, and
930 Corner mount pallet rack.

FIG. 58C is an illustration of the side view.

Parts shown include:
900 Air intake hole knock outs and
910 Suspension alignment hook.

FIG. 58D is an illustration of the front view.

Part shown is a 900 Air intake hole knock outs.

FIG. 58E is an illustration of the master air intake plenum with parting lines.

Part shown is a 920 0-ring material seal.

FIG. 59 illustrates the palletized stackable warehouse pallet with master intake and exhaust plenums installed.

FIG. 59 shows a blank pallet with corner-mount pallet rack installed, side mount, although not shown, should be blatantly obvious to those versed in the art. (Bottom) master intake, and (top) master exhaust plenums are next shown installed.

FIG. 59A is an illustration of the blank pallet with pallet rack corner mount shown, side mount obvious, perspective view.

FIG. 59B is an illustration of (bottom) master intake and (top) master exhaust plenums, perspective view.

FIG. 59C is an illustration of the palletized master plenums installed, perspective view.

FIG. 60 illustrates the palletized and dollied "sliding drawer" master cooling array assembly.

FIG. 60 shows a palletized "sliding drawer" assembly constituted by addition of a pallet dolly with wheels or rollers set offside of the center cable gutter pending size, weight load and economic requirements.

Part 950 Pallet dolly is shown.

FIG. 61 illustrates the palletization master cooling/wiring assembly population.

FIG. 61 shows the palletization master intake/wiring basket and exhaust plenum/wiring covers between which seat the module/enclosure cooling wiring assembly population with top and bottom either in stacks or on palleted arrays.

Service access to individual modules in stacks and arrays are aided by groupings based on pallets equipped with pallet dollies to give access (for repair, replacement and connection maintenance) to and from warehouse and mezzanine style industrial shelving or equivalent with flooring inserts inside said shelving, level with mezzanine and separately, by level, ground level flooring, thereby creating functional, "drawer" assemblies for said pallet-racked and dollied palletized module arrays, with drawbridge access by tier and cat walks, stairwells, elevators, etc. as necessary, incorporated by reference from the section CROSS REFERENCE TO RELATED APPLICATION. External peripheral nonstandard palletized or otherwise arrayed shapes are used for support machinery such as cooling, etc. or as otherwise required for any miscellaneous purpose. Further, the approximated tessellation/tilings conjunct individual palletized arrays and stacks conjunct industrial shelving, give an industrial standard readily recognizable and easily duplicated and understood as a spatial commodity and form factor in industry, replete with pre-existing off the shelf robotic automation ready to be tasked to this new purpose. Of course standard modules may be pressed into any such service at required.

Service access for rewiring of inter-module communications is accomplished by:
1. Arranging modules in vertical linear stacks.
2. Utilizing cable grippers, embedded in modules, threaded on cables, and terminated with clevis pins and clevises or equivalently functioning hardware. Each module has three or four such cable assemblies as exemplified in the patent two-referenced in the section CROSS REFERENCE TO RELATED APPLICATION, FIG. 49 FIGS. D-I as submitted and hereby incorporated by reference. Said cable assemblies interconnect to those modules above and below, finally terminating in the master air intake and exhaust plenums for each pallet, below and above respectively. The cable grippers, actuated by a handle actuator assembly on top, allow movement up and down the accumulated cable assemblies between terminations, by which access is gained to the sides of the modules for external inter-module rewiring.
3. Individual modules have a sliding fit with adjacent modules, and feature either a horizontal scalloped edge between keyed or un-keyed "flats" framing apex centered cooling tube assemblies for cables and wires, fiber optics, coaxial cable, and/or a wave guide cavity for RF and/or light guides for "open" optics and optical data transmission.

Service access for module removal as referenced in the section CROSS REFERENCE TO RELATED APPLICATION is accomplished by:
1. Slide units above and to the sides of the offending defective unit, up their cable guides.
2. Seat units below on their respective stack bases, master plenum bases or modules stacked thereon.
3. Disconnect clevis pins and clevises or functionally equivalent hardware.
4. Connect power to new module, utilizing retraction power chords on top of new module to power source above.
5. Mirror wiring or other connectivity placement on old module to new replacement module as necessary, pending pre-existent means of connectivity.
6. Disconnect power from lower module, base or master plenum base.
7. Slide out bad unit.
8. Reconnect clevis pins and devises or equivalent hardware to new module.

FIG. 61A is an illustration of the module base stacked order, front view and shows the stacking alignment of modules on a base.

FIG. 61B is an illustration of the single stack assembly, front view and shows the assembly of said modules into a single stack.

FIG. 61C is an illustration of the stack array, front view and shows the assembly of single stacks and stacks arrays.

FIG. 61D is an illustration of the palletized and dollied master cooling assembly being populated with module, perspective view and shows the stack arrays being populated into the palletized and dollied master cooling/wiring/stack suspension assemblies.

FIG. 62 illustrates the palletized dolly shelf bed and supports, slotted cable guide and conduit whip.

FIG. 62 shows the shelf support structure for stored, dollied and palletized module arrays with an external wire guide armature to prevent entanglement of pallet wiring connections when rolling out the palletized dolly from its shelf bay for work.

FIG. 62A is an illustration of the shelf bed.

Part 1000. Pallet Dolly Load Bearing Surface is shown.

FIG. 62B is an illustration of the castellated cross brace with cable guide, top view.

This assembly with part 1017 prevents jamming of cables, when dollied palette is in motion.

Parts shown are
1000. Stud Eye Mounts
1015. Castellated Cross Brace
1017. Top Center Cable Guide.

FIG. 62C is an illustration of the slotted support beams.
1000. Pallet Dolly Load Bearing Surface is shown.

FIG. 62D is an illustration of the central longitudinally slotted cable guide, shelf base assembly, top view.

FIG. 62E is an illustration of the block diagram of the 180 degree arc cable conduit whip.

The FIG. 62E Assembly may be left or right mounted on part 1015 of FIG. 62B. This assembly with part 1017 prevents jamming of cables, when a dollied palette is in motion.

Shown parts are:
1008. Internally Threaded Flange,
1010. Stud Eye Mounts,
1020. 90 Degree Bend Electrical Conduit.

FIG. 62F is an illustration of the block diagram of the industrial warehouse mezzanine shelving, block diagram, front view.

FIG. 63 illustrates the Palletized scalable computer/router farm utilizing standard-industrial warehouse shelving with mezzanine option above single floor installations for pre-existent warehouse space build out and new construction steel building with integrated industrial walls and roofing.

FIG. 63A is an illustration of the modular stack (top and bottom arrows represent data connections, (cables/wires/ethernet/fiber optic/etc.), front view.

FIG. 63B is an illustration of the dollied stack racked pallet(s) with installed intake (bottom)/exhaust (top) coolant/wiring/stack suspension master plenums, perspective view.

FIG. 63C is an illustration of the symbolic standard industrial warehouse shelving for population by dollied and palletized modules, block diagram, front view.

FIG. 64 illustrates the palletized shelf level drawbridge assembly.

FIG. 64 shows a drawbridge arrangement for bin height dollied and palletized module array extraction from second-tier and above multi-tier industrial shelving bins onto the fold-down flat work area provided for by said "draw bridge" for service, replacement, etc. The minimalist embodiment comprises two base shelving units with appropriate sized dollied, palletized and pallet-racked modules with master plenums separated by an appropriate number of drawbridges sized for the selected pallet shelf combination shared by the pallets of each base shelf, allowing full-motion and access to all dollied pallets and modules.

FIG. 64A is an illustration of the drawbridge.

Part 1040. Drawbridge deck" is shown.

FIG. 64B is an illustration of the drawbridge hinge.

"Shown parts are:
1017. Wire Guide and
1030. Pivot Rod.

FIG. 64C is an illustration of the drawbridge symmetrical pivot rod (side and end views).

Shown parts are:
1010. Stud Eye Mount and
1030. Pivot Rod.

FIG. 64D is an illustration of the shelving top view (symbolic) Shown parts are:
1030. Hinge with pivot rod only
1035. Industrial shelving: two second tier single bays facing each other separated by a walk way.
1040. Full drawbridge assembly installed FIG. 64E is an illustration of the shelving front view (symbolic).

Shown parts are:
1030. Hinge with pivot rod only and
1035. Full drawbridge assembly installed.

For optional conventional construction at the enclosure level the invention optionally uses standard heavy duty industrial warehouse style shelving with a multilevel mezzanine option above the first floor. This allows for the build out of pre-existing industrial warehouse and other space to realize scalable integration/migration from a single unit to a router, server and supercomputer machine farms incorporating high-density multilevel facilities interconnected as required by catwalks and corridors. This utilizes cheaper industrial warehouse space for machine farms. In this embodiment, due to the portable nature of the shelving with or without multilevel mezzanine enhancements, pending implementation details, the build out itself may be portable, and therefore allows the possibility of site movement, pending more favorable lease, rent or other financial opportunities, including lower tax rates, as given under various governmental programs and negotiations, including between states.

The invention expands this technique to include standard building practices by adding standard external wall and roofing systems available for said mezzanine style shelving systems for new construction of buildings to purpose, utilizing palletization techniques and approximated tessellation/tiled enclosures described and incorporated by reference by the other provisional patent most closely submitted in time. In this way, new building construction is optimized as the shelving supports do double duty as ceiling and wall supports.

FIG. 65 is Table 1: Symbolic Block Diagram Cooling Systems (Air/Gas/Fluid).

Thermal management includes options for internal and external cooling/refrigeration including liquid, air/gas and other solutions for installations from single units to palletized modular arrays utilizing individual coolant intake and exhaust plenums incorporated in the modules. This is incorporated by reference from the CROSS-REFERENCE TO RELATED PATENT section. The invention employs standard industry stack-rack or pallet-rack caging of either corner or side fastening design, for palletization with pallet bolt on plywood or other pallet floor/bed for fastening master cooling plenum overlay with embedded matching terminations for module suspension cables, creating a bolt-on support bed for individual arrays. Modules are fitted together in three-dimensional arrays over this master coolant intake plenum on the pallets face. A master exhaust plenum is suspended from a pallet rack above, with an attendant end cap wiring basket cover for the top of each individual stack and provides exhaust handling for same. This includes utilization of standard large scale HVAC, air supply and shop vacuum systems on machine farms through master plenums, on both top and bottom of rollout pallet dollied and racked palletized modules, stacks and arrays in single and multi-tier industrial shelf based storage at drawers. (Reference FIG. 65A-D: Table 1 for further thermal management options.

The module hull includes a thermally insulative impregnation or a layer internally and/or externally, hereinafter "thermal layer" for simplicity. The module hull thermal layer directs heat from the central cavity to be carried off by internal plenums, fans, cooling tubes and associated ductwork, end cap fans, master intake and exhaust plenums and arrays of the same, and/or other thermal management.

The hull is also thermally insulated with a view to human touch. To this end, the end cap wiring basket, cover and handle are also thermally insulated.

The invention claimed is:

1. A data parallel processing system comprising a plurality of interconnected data processing modules; each module having a triangular, squares, hexagonal, or octagonal module shape; the modules arranged into an approximately tessellated two- or three-dimensional array; wherein one or more of said modules comprises a plurality of interconnected processor chips, the chips arranged into a plurality of triangular, hexagonal, or octagonal units, the units arranged into an approximately tessellated two- or three-dimensional array.

2. The system of claim 1, wherein the modules are connected through constant path length connections.

3. The system of claim 2, wherein said connections comprise optical or wireless electromagnetic transmission.

4. The system of claim 1, wherein said connections comprise connections between modules disposed diagonally with respect to each other.

5. The system of claim 1, wherein one or more modules comprise a card cage.

6. The system of claim 1, wherein substantially the entire module interior serves as a plenum for the flow of cooling air, gas, or fluid.

7. The system of claim 1, wherein one or more modules each comprise one or more apex centered cooling tube assemblies.

8. The system of claim 1, wherein all modules have a universal form factor.

9. The system of claim 1, wherein said modules are arranged into one or more two-dimensional approximately tessellated arrays (pallets).

10. The system of claim 9, wherein said modules are arranged into two or more two-dimensional approximately tessellated arrays (pallets), and said pallets are stacked to form a stack of pallets.

11. The system of claim 10, wherein said stack of pallets comprises a master intake plenum and/or a master air exhaust plenum.

12. The system of claim 10, further comprising a frame for mounting said pallets and/or said modules.

13. The system of claim 1, wherein said modules comprise an intermodule connection mechanism selected from the group consisting of retractable interconnects, quick disconnects, and embedded cable grippers.

14. The system of claim 1, wherein said modules are slidably fit to adjacent modules.

15. The system of claim 1, wherein removal and/or insertion of modules into said two- or three-dimensional array is mediated by a retractable handle.

16. The system of claim 1, wherein one or more modules comprise external side wall wire or cable guides.

17. The system of claim 1, wherein said modules are interconnected by point-to-point propagation paths comprising a cable and/or communication circuitry comprising said cable.

\* \* \* \* \*